(12) United States Patent
Yamamoto et al.

(10) Patent No.: US 8,248,329 B2
(45) Date of Patent: Aug. 21, 2012

(54) DISPLAY APPARATUS

(75) Inventors: Tetsuro Yamamoto, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 793 days.

(21) Appl. No.: 12/289,639

(22) Filed: Oct. 31, 2008

(65) Prior Publication Data

US 2009/0135111 A1 May 28, 2009

(30) Foreign Application Priority Data

Nov. 28, 2007 (JP) ................................. 2007-307862

(51) Int. Cl.
*G09G 3/30* (2006.01)

(52) U.S. Cl. .................................. 345/76; 345/82; 349/2

(58) Field of Classification Search ..................... 349/44; 345/76

See application file for complete search history.

(56) References Cited

U.S. PATENT DOCUMENTS

| 7,282,855 B2 * | 10/2007 | Park et al. ...................... 313/506 |
| 7,948,456 B2 * | 5/2011 | Yamashita et al. .............. 345/82 |
| 2004/0206960 A1 * | 10/2004 | Nishikawa ...................... 257/72 |
| 2007/0046587 A1 * | 3/2007 | Takahara ......................... 345/76 |

FOREIGN PATENT DOCUMENTS

JP 2006-215213 8/2006

* cited by examiner

*Primary Examiner* — William Boddie
*Assistant Examiner* — Towfiq Elahi
(74) *Attorney, Agent, or Firm* — Rader Fishman & Grauer, PLLC

(57) ABSTRACT

Disclosed herein is a display apparatus, including: a pixel array section including a plurality of pixel circuits disposed in a matrix and each including a driving transistor for producing driving current, a storage capacitor for storing information of a image signal amplitude, an electro-optical element connected to an output terminal side of the driving transistor, and a sampling transistor for writing information of the signal amplitude into the storage capacitor, the driving transistor being operable to produce driving current based on the information stored in the storage capacitor and supply the driving current to the electro-optical element to cause the electro-optical element to emit light; a driving signal fixing circuit for keeping the driving current fixed; and a light blocking layer provided on the light input side of a transistor which participates in the driving signal fixing function and for preventing appearance of leak current of the transistors arising from light irradiation.

6 Claims, 24 Drawing Sheets

<AGED VARIATION OF V-I CHARACTERISTIC OF ORGANIC EL ELEMENT>

F I G . 5
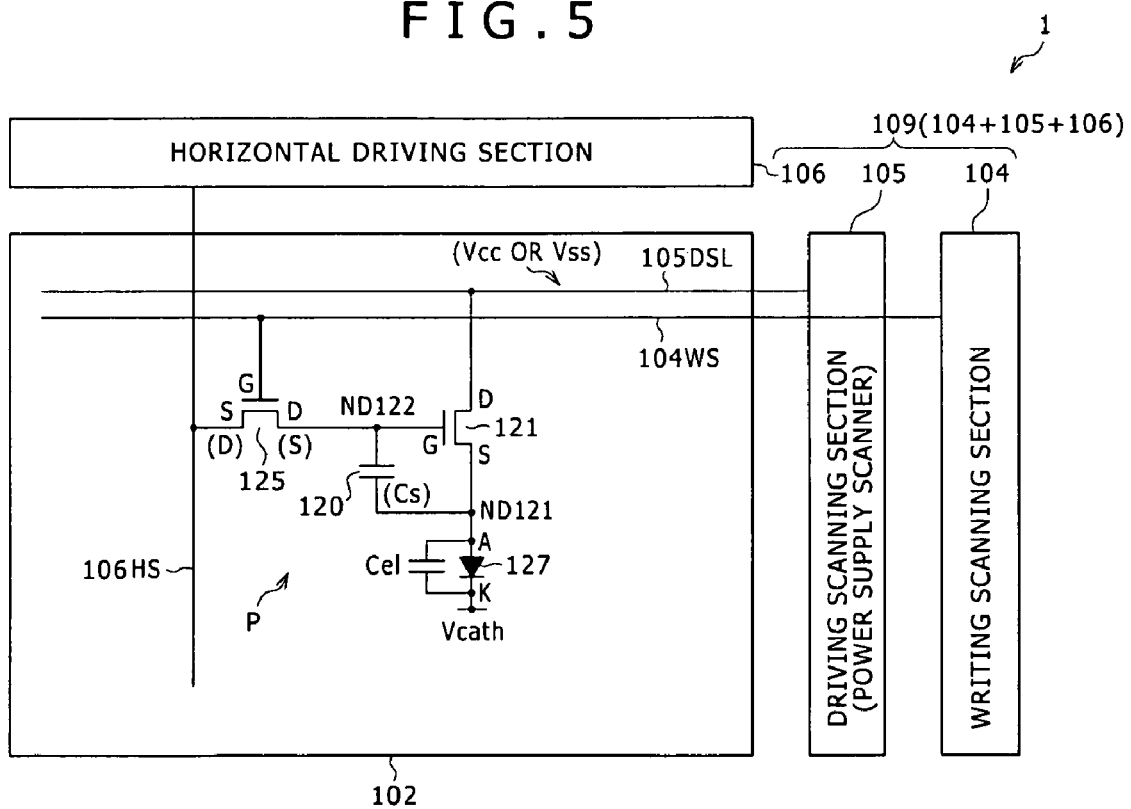

<LIGHT EMITTING PERIOD B>

<DISCHARGE PERIOD C>

<INITIALIZATON PERIOD D>

<FIRST THRESHOLD VALUE CORRECTION PERIOD E>

<DIFFERENT ROW WRITING PERIOD F>

<SECOND THRESHOLD VALUE CORRECTION PERIOD G>

<DIFFERENT ROW WRITING PERIOD H>

<THIRD THRESHOLD VALUE CORRECTION PERIOD I>

<WRITING & MOBILITY CORRECTION PREPARATION PERIOD J>

<SAMPLING PERIOD & MOBILITY CORRECTION PERIOD K>

<LIGHT EMITTING PERIOD L>

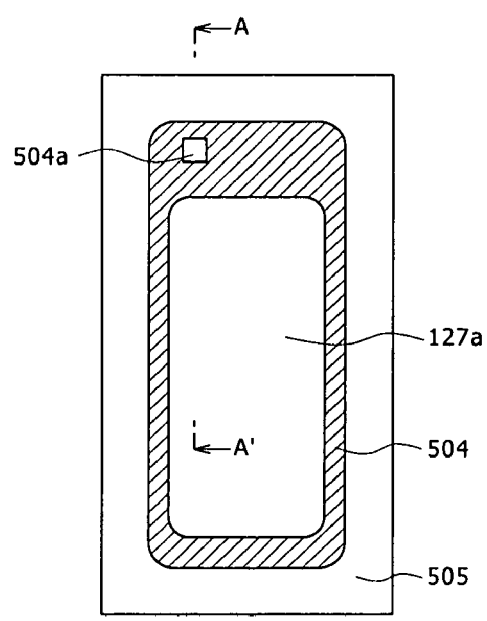
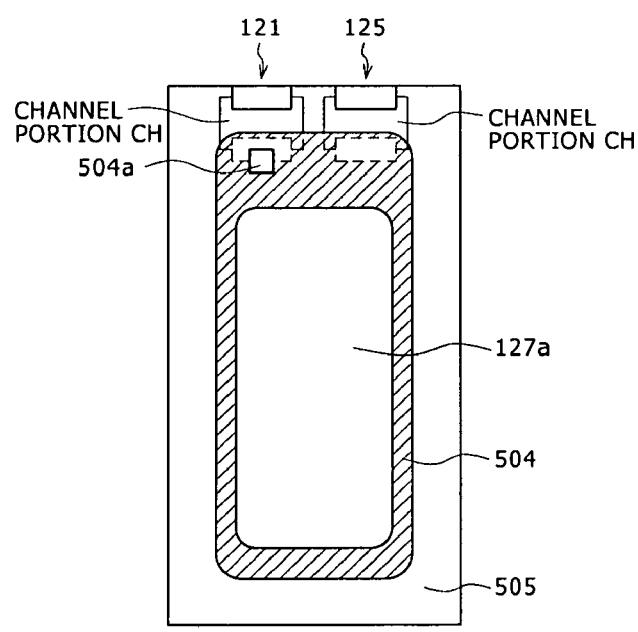
FIG. 8A
FIG. 8B

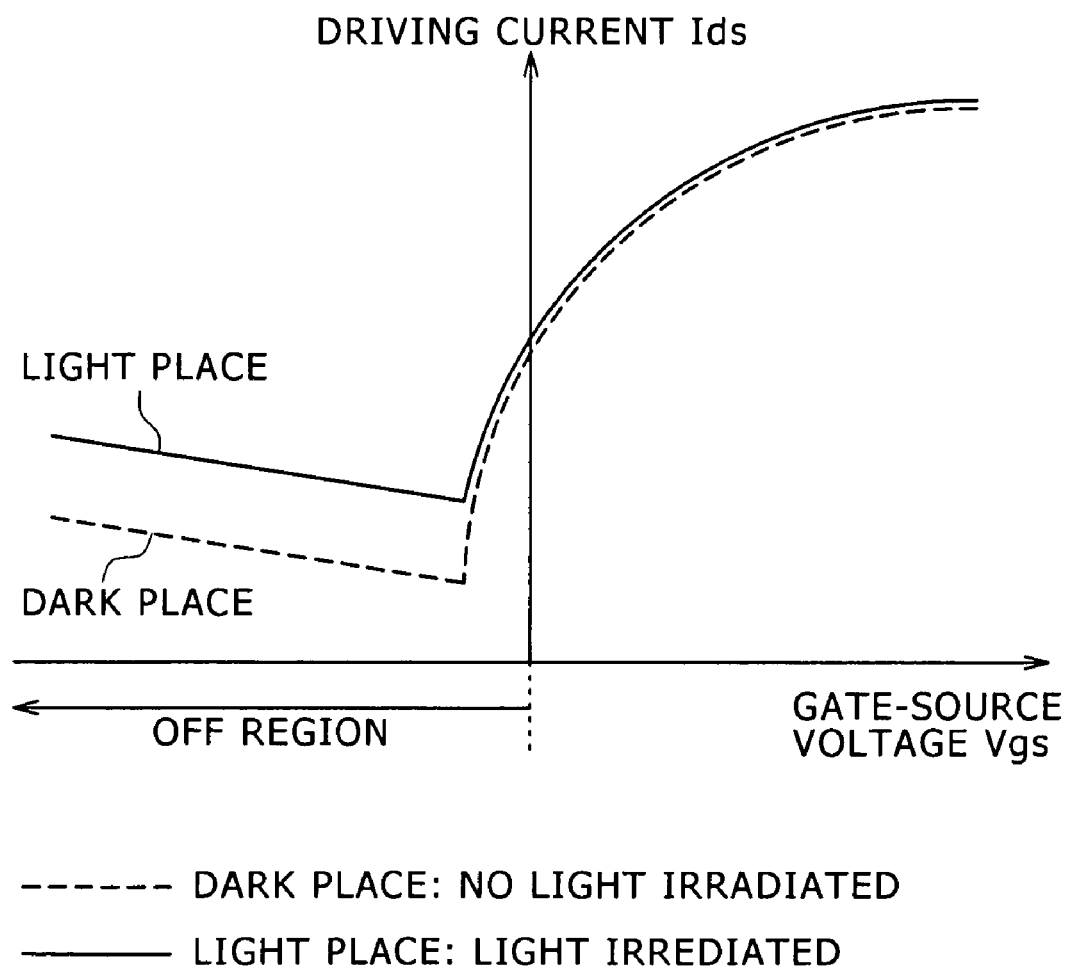

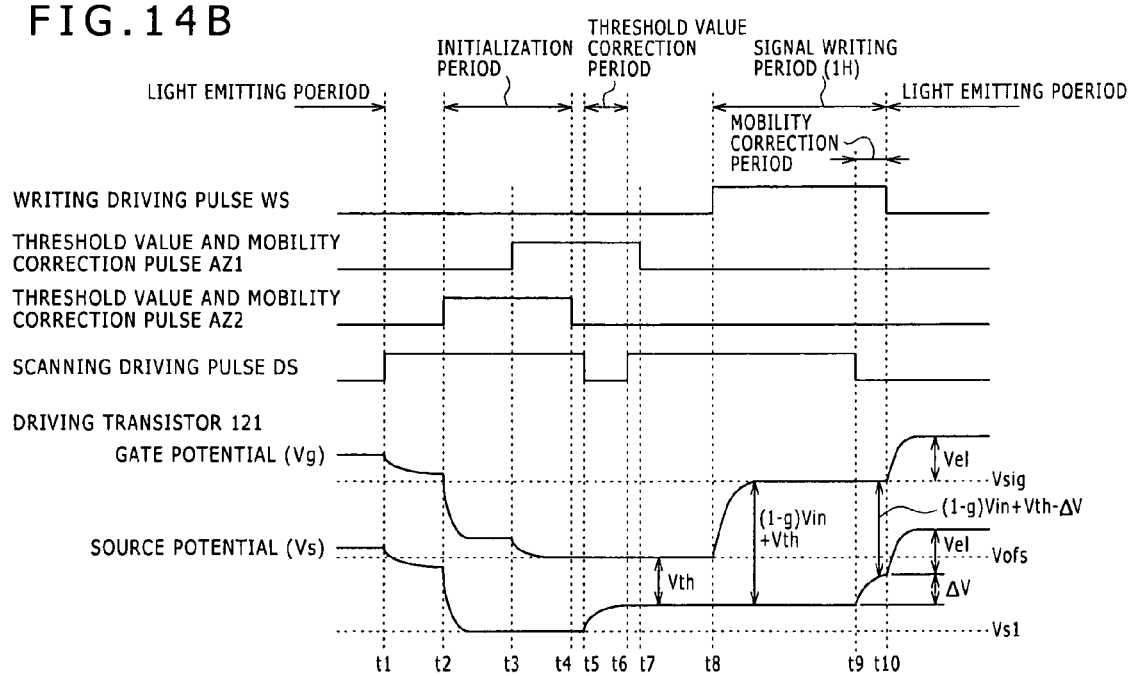

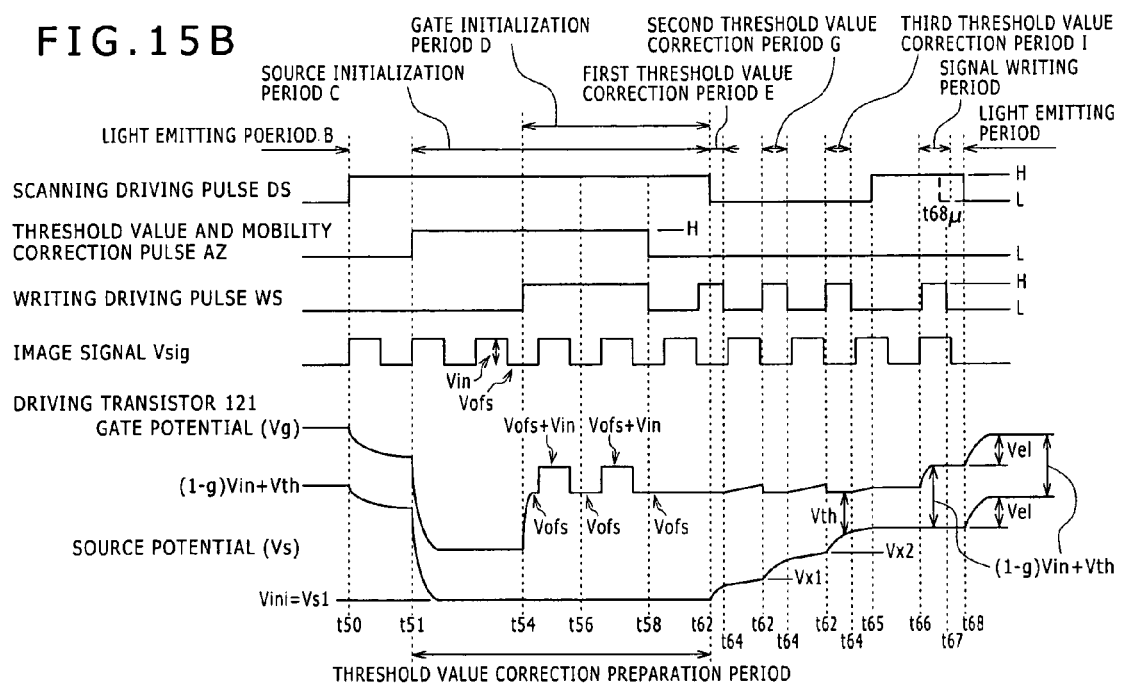

DISPLAY APPARATUS

CROSS REFERENCES TO RELATED APPLICATIONS

The present invention contains subject matter related to Japanese Patent Application JP 2007-307862, filed in the Japan Patent Office on Nov. 28, 2007, the entire contents of which being incorporated herein by reference.

BACKGROUND OF THE INVENTION

1. Field of the Invention

This invention relates to a display apparatus which includes a pixel array section including a plurality of pixel circuits (hereinafter referred to also as pixels) disposed in rows and columns and each including an electro-optical element (hereinafter referred to as display element or light emitting element). More particularly, the present invention relates to a display apparatus of the active matrix type wherein a plurality of pixel circuits each including an electro-optical element whose emission light luminance varies depending upon current flowing therethrough are disposed in rows and columns and display driving in a unit of a pixel is carried out by an active element included in each of the pixel circuits.

2. Description of the Related Art

A display apparatus is available which uses, as a display element of a pixel, an electro-optical element whose emission light luminance varies depending upon a voltage applied thereto or depending upon current flowing therethrough. For example, a liquid crystal display element is a representative one of electro-optical elements whose emission light varies depending upon a voltage applied thereto. Meanwhile, an organic electroluminescence (hereinafter referred to as organic EL) element such as an organic light emitting diode (OLED) is a representative one of electro-optical elements whose emission light luminance varies depending upon current flowing therethrough. An organic EL display apparatus which uses the latter organic EL element is a selfluminous display apparatus which uses an electro-optical element, which is a selfluminous element, as a display element of a pixel.

An organic EL element includes a lower electrode, an upper electrode, and an organic thin film or organic layer disposed between the upper and lower electrodes and formed by laminating an organic hole transport layer, an organic light emitting layer and so forth. With the organic EL element, a gradation of color development is obtained by controlling the value of current flowing through the organic EL element.

Since the organic EL element can be driven with a comparatively low application voltage such as, for example, 10 V or less, it exhibits low power consumption. Further, since the organic EL element is a selfluminous element which itself emits light, the organic EL display apparatus does not require an auxiliary illuminating member such as a backlight which is required by a liquid crystal display apparatus, and therefore, reduction in weight and thickness can be achieved readily with the organic EL display apparatus. Furthermore, since the response speed of the organic EL element is very high such as, for example, approximately several μs, an afterimage does not appear upon dynamic image display. Since the organic EL element has such advantages as described above, a display apparatus of a plane selfluminous type which uses an organic EL element as an electro-optical element has been and is being developed energetically in recent years.

Incidentally, a display apparatus which uses an electro-optical element including a liquid crystal display apparatus which uses a liquid crystal display element and an organic EL display apparatus which uses an organic EL element can adopt, as a driving method, a simple or passive matrix system and an active matrix system. However, although the display apparatus of the simple matrix system is simple in structure, it has a problem that it is difficult to implement a display apparatus of a large size and a high definition.

Therefore, in recent years, a display apparatus of the active matrix system is developed energetically wherein a pixel signal to be supplied to a light emitting element in a pixel is controlled using an active element formed within a pixel, for example, an insulated gate field effect transistor, usually, a thin film transistor (TFT), as a switching transistor.

In order to cause the electro-optical element in the pixel circuit to emit light, an input image signal supplied through an image signal line is fetched into a storage capacitor or pixel capacitor provided at the gate terminal, which is a control input terminal, of a driving transistor through a switching transistor (hereinafter referred to as sampling transistor). Then, a driving signal in accordance with the fetched input image signal is supplied to the electro-optical element.

In a liquid crystal display apparatus which uses a liquid crystal display element as an electro-optical element, since the liquid crystal display element is an element of the voltage driven type, the liquid crystal display element is driven by a voltage signal itself corresponding to the input image signal fetched in the storage capacitor. In contrast, in an organic EL display apparatus which uses an element of the current driven type such as an organic EL element as an electro-optical element, a driving signal in the form of a voltage signal corresponding to the input image signal fetched in the storage capacitor is converted into a current signal by a driving transistor. Then, the driving current is supplied to the organic EL element and so forth.

In an electro-optical element of the current driven type represented by an organic EL element, where the value of driving current differs, also the emission light luminance differs. Therefore, in order to cause the electro-optical element to emit light with stable luminance, it is important to supply stable driving current to the electro-optical element. For example, driving methods for supplying driving current to the organic EL element can be roughly divided into a constant current driving method and a constant voltage driving method. Such driving methods are known and are not described specifically herein.

Since the voltage-current characteristic of the organic EL element has a steep slope, if constant voltage driving is applied, then a small dispersion of a voltage or a small dispersion of an element characteristic gives rise to a great dispersion of current and gives rise to a great luminance dispersion. Therefore, constant current driving wherein a driving transistor is used in a saturation region is used popularly. Naturally, even with constant current driving, if some current fluctuation exists, then this gives rise to a dispersion in luminance. However, if the current dispersion is small, then only small luminance dispersion occurs.

Conversely speaking, even where the constant current driving method is used, in order to make the emission light luminance of the electro-optical element invariable, it is significant for the driving signal, which is written into and stored in the storage capacitor in response to an input image signal, to be fixed. For example, in order for the emission light luminance of the organic EL element to be invariable, it is important for the driving current corresponding to the input image signal to be fixed.

However, the threshold voltage or the mobility of the active element, that is, a driving transistor, for driving the electro-optical element is dispersed by a process fluctuation. Further, a characteristic of the electro-optical element such as an organic EL element is fluctuated as time passes. If such a characteristic dispersion of a driving active element or a characteristic fluctuation of an electro-optical element exists, then this has an influence on the emission light luminance even where the constant current driving method is applied.

Therefore, in order to control the emission light luminance so as to be uniform over an entire screen of a display apparatus, various mechanisms for compensating for a luminance fluctuation arising from a characteristic fluctuation of a driving active element or an electro-optical element in each pixel circuit are investigated.

One of such mechanisms as just described is disclosed, for example, in Japanese Patent Laid-Open No. 2006-215213 (hereinafter referred to as Patent Document 1).

For example, according to the mechanism disclosed in Patent Document 1, a pixel circuit for an organic EL element is disclosed which has a threshold value correction function for making the driving current fixed even where the threshold voltage of a driving transistor suffers from a dispersion or aged deterioration, a mobility correction function for making the driving current fixed even where the mobility of the driving transistor suffers from a dispersion or aged deterioration and a bootstrap function for making the driving current fixed even where the current-voltage characteristic of an organic EL element suffers from aged deterioration.

SUMMARY OF THE INVENTION

However, if the driving transistor for supplying driving current to the organic EL element and various switching transistors for allowing a threshold value correction function, a mobility correction function or a bootstrap function to operate exhibit high leak current, then the voltage stored in the pixel capacitor fluctuates depending upon the magnitude of the leak current.

As a result, even if a function for keeping the driving signal fixed is applied by threshold value correction, mobility correction or bootstrap operation, the driving signal such as driving current is fluctuated by potential fluctuation by the leak current, resulting in failure to keep the emission light luminance fixed. If the level of this phenomenon differs among different pixels, then the display image becomes rough or uneven, and where the leak current amount is influenced by the image pattern, display unevenness appears in response to the image pattern.

Further, the mechanism disclosed in Patent Document 1 adopts a 5 TR driving configuration and is complicated in configuration of the pixel circuit. Since the pixel circuit includes a comparatively great number of components, improvement of the definition of the display apparatus is obstructed thereby. As a result, it is difficult to apply the 5 TR driving configuration to a display apparatus which is used with an electronic apparatus of the small size such as a portable apparatus or mobile apparatus.

Consequently, it is demanded to develop a system which suppresses a luminance variation by a characteristic dispersion of an element while achieving simplification of a pixel circuit. Upon such development, also it should be taken into consideration that the phenomenon of display unevenness arising from leak current should be eliminated or moderated and the simplification should not give rise to a new problem which does not occur with the 5 TR configuration.

Therefore, it is desirable to provide a display apparatus which can be improved in definition through simplification of a pixel circuit and a fabrication method and a fabrication apparatus by which the display apparatus can be fabricated efficiently.

Also it desirable to provide a display apparatus which can achieve a high definition by simplification of a pixel circuit and a fabrication method and a fabrication apparatus by which the display apparatus can be fabricated efficiently.

Further, it is desirable to provide a display apparatus which can suppress a luminance variation by a characteristic dispersion of a driving transistor or an electro-optical element while simplification of a pixel circuit is achieved and a fabrication method and a fabrication apparatus by which the display apparatus can be fabricated efficiently.

According to an embodiment of the present invention, there is provided a display apparatus including a pixel array section including a plurality of pixel circuits disposed in rows and columns and each including a driving transistor configured to produce driving current, a storage capacitor configured to store information in accordance with a signal potential of an image signal, an electro-optical element connected to an output terminal of the driving transistor, and a sampling transistor configured to write information in accordance with the signal potential into the storage capacitor, the driving transistor being operable to produce driving current based on the information stored in the storage capacitor and supply the driving current to the electro-optical element to cause the electro-optical element to emit light, the pixel circuit including a pixel divided into a plurality of divisional pixels for each of which the electro-optical element is provided, and a test transistor or transistors provided between the driving transistor and each of the electro-optical elements and capable of carrying out on/off operations for specifying whether or not the electro-optical element connected thereto is a dark spot element which does not emit light so that the electro-optical element of the dark spot can be specified, the number of the test transistors being smaller than the number of the divisional elements of the original one pixel.

In order for the sampling transistor to write information in accordance with a signal amplitude of an image signal into the storage capacitor, the sampling transistor fetches the signal potential to an input terminal thereof, that is, to one of the source terminal and the drain terminal thereof, and writes the information in accordance with the signal amplitude into the storage element connected to an output terminal thereof, that is, to the other of the source terminal and the drain terminal thereof. Naturally, the output terminal of the sampling transistor is connected also to a control input terminal of the driving transistor.

It is to be noted that the connection scheme of the pixel circuit described above exhibits the most basic 2 TR configuration including the driving transistor and the sampling transistor. It suffices for the pixel circuit to include at least only the components mentioned but may additionally include some other component. Further, the term "connection" includes not only direct connection but also indirect connection with some component interposed therein.

For example, any connection may be modified such that a transistor for switching, a functioning element having some function or a like element is interposed as occasion demands. Typically, a switching transistor for dynamically controlling a display period, or in other words, a no-light emitting time period, may be interposed between the output terminal of the driving transistor and the electro-optical element. Or, a switching transistor may be interposed between the power supply terminal, typically, the drain terminal, of the driving transistor and a power supply line which is a wiring line for supplying power or between the output terminal of the driving transistor and a reference voltage line.

Even with such modified pixel circuits as described above, if they can implement the configuration and operation described above, also they are considered as pixel circuits which implement the embodiment of the display apparatus.

Further, a control unit for driving the pixel circuits may be provided at a peripheral portion of the pixel array section. The control unit includes, for example, a writing scanning section for successively controlling the sampling transistors within a horizontal period to line-sequentially scan the pixel circuits to write information in accordance with the signal amplitude of the image signal into the storage capacitors for one row, and a horizontal driving section for controlling so that the image signal is supplied to the sampling transistors in synchronism with the line-sequential scanning by the writing scanning section.

The display apparatus may further include a driving signal fixing circuit configured to keep the driving current fixed. The driving signal fixing circuit is formed from a combination of a connection scheme of the components of the pixel circuit and a scanning section for scanning and driving the pixel circuits. Corresponding to this, the control unit includes a scanning section for controlling the driving signal fixing circuit.

The driving signal fixing circuit signifies a circuit which tries to keep the driving current of the driving transistor fixed even when aged deterioration of the current-voltage characteristic of the electro-optical element or a characteristic variation of the driving transistor occurs. The driving signal fixing circuit may have any particular circuit configuration. In addition to the sampling transistor which is an example of a switching transistor and the driving transistor, some other switching transistor for carrying out control of keeping the driving current fixed may be provided.

For example, the control unit controls so as to carry out a threshold value correction operation for storing a voltage corresponding to a threshold voltage of the driving transistor into the storage capacitor. Where the pixel circuit has the 2 TR configuration, the sampling transistor is rendered conducting within a time zone, within which a voltage corresponding to a first potential to be used to supply the driving current to the electro-optical element is supplied to a power supply terminal of the driving transistor and the reference potential of the image signal is supplied to the sampling transistor, to store a voltage corresponding to a threshold voltage of the driving transistor into the storage capacitor.

To this end, where the pixel circuit has the 2 TR configuration, the control unit includes a driving scanning section for outputting a scanning driving pulse for controlling power supply to be applied to the power supply terminal of the driving transistors for one row in synchronism with the line-sequential scanning by the writing scanning section, and the horizontal driving section supplies an image signal, which changes over between the reference potential and the signal potential within each one horizontal period, to the sampling transistor. The sampling transistor functions as a switching transistor relating to the driving signal fixing function, and in order to implement the function, on/off operations of the sampling transistor are controlled.

The threshold value correction operation may be executed repetitively in a plurality of horizontal periods preceding to writing of the signal amplitude into the storage capacitor as occasion demands. Here, "as occasion demands" signifies a case wherein the voltage corresponding to the threshold voltage of the driving transistor cannot be stored fully into the storage capacitor within the threshold value correction period within one horizontal period. By execution of the threshold value correction operation by a plural number of times, the voltage corresponding to the threshold voltage of the driving transistor can be stored with certainty into the storage capacitor.

Further, the control unit controls so that initialization of the potential of the control input terminal and the output terminal of the driving transistor and the storage capacitor is carried out prior to the threshold value correction operation so that the potential difference between the terminals of the driving transistor may become higher than the threshold voltage. Where the pixel circuit has the 2 TR configuration, the control unit renders the sampling transistor conducting within a time zone, within which a voltage corresponding to the second potential is supplied to the power supply terminal of the driving transistor and the reference potential is supplied to the input terminal which is one of the source terminal and the drain terminal of the sampling transistor, to set the control input terminal of the driving transistor to the reference potential and set the output terminal of the driving transistor to the second potential.

Further, after the threshold value correction operation, the control unit may implement a mobility correction function of adding, when the sampling transistor is rendered conducting to write information in accordance with the signal amplitude into the storage capacitor, a correction amount for a mobility of the driving transistor to the signal written in the storage capacitor. In this instance, where the pixel circuit has the 2 TR configuration, the sampling transistor may be kept conducting only within a period shorter than the time zone within which the signal potential is supplied to the sampling transistor at a predetermined position within the time zone.

Further, the storage capacitor is connected between the control input terminal and the output terminal, which in fact is one of the terminals of the electro-optical element, of the driving transistor in order to implement the bootstrap function. The control unit controls such that the sampling transistor is rendered non-conducting at a point of time at which the information corresponding to the signal amplitude is written into the storage capacitor to stop the supply of the image signal to the control input terminal of the driving transistor thereby to carry out a bootstrap operation of causing the potential of the control input terminal of the driving transistor to interlock with the potential fluctuation of the output terminal of the driving transistor.

Here, in the display apparatus according to an embodiment of the present invention, paying attention to leak current arising from light irradiation, the light incoming side face of the transistors which form the pixel circuit of the configuration described above is covered with a light blocking layer. In the display apparatus of such a configuration as just described, incoming of light to the transistors is prevented by the light blocking layer, and a characteristic fluctuation of the transistors by light irradiation is prevented.

Where a switching transistor which participates in the driving signal fixing function and a driving transistor for driving the electro-optical element are compared with each other, it may be considered that the switching transistor which participates in the driving signal fixing function has a narrower margin to leak current arising from light irradiation. Therefore, the light blocking performance by the light blocking layer should be set higher with the switching transistor than with the driving transistor.

Here, the switching transistor first corresponds to the sampling transistor for selectively fetching a signal corresponding to luminance information into the control input terminal of the driving transistor. Further, where the pixel circuit includes a circuit for canceling the dispersion of the threshold voltage of the driving transistor, the switching transistor corresponds also to a detection transistor for selectively detecting the threshold voltage of the driving transistor on the control input terminal side of the driving transistor. Naturally, the switching transistor may be any switching transistor used for control of threshold value correction or mobility correction.

Where the material or the film thickness of the light blocking layer for each transistor, particularly for the channel portion, is same, the light blocking performance enhances as the overlapping degree between the transistor, particularly the channel portion, and the light blocking layer increases. Therefore, preferably the overlapping amount between the switching transistor and the light blocking layer is set greater than the overlapping amount between the driving transistor and the light blocking layer.

For example, where the display apparatus is formed as an apparatus of the top emission type wherein emission light is extracted from the opposite side to a substrate on which the electro-optical elements of the current driven type are formed in an array, the transistors are disposed on the substrate and an interlayer insulating layer is disposed on the transistors, and the electro-optical elements of the current driven type are disposed on the interlayer insulating film. The electro-optical element of the current driven type is structured such that a light emitting layer is disposed between the lower electrode on the transistors (substrate) side and the upper electrode on the display face, that is, on the face remote from the substrate.

In the display apparatus of the top emission type described, while it is necessary for the upper electrode to pass the emission light therethrough, the lower electrode need not pass light therethrough. Therefore, it is supposed that the lower electrode may be made of a light blocking material such that it is utilized as the light blocking layer and the transistors are disposed below the lower electrode. In this instance, in order that the light blocking performance by the light blocking layer may be higher for the switching transistor than for the driving transistor, preferably the overlapping amount between the lower electrode which should function as the light blocking layer and the switching transistor is set greater than the overlapping amount between the lower electrode which should function as the light blocking layer and the driving transistor.

Since the display apparatus wherein the pixel circuits are disposed in a matrix includes the driving signal fixing circuit for keeping the driving current fixed, even if, for example, the current-voltage characteristic of the electro-optical element suffers from aged deterioration and the source potential of the driving transistor varies as a result of such aged deterioration, the current flowing through the electro-optical element does not vary. Accordingly, also the emission light luminance of the electro-optical element is kept fixed.

In addition, where the transistors in the pixel circuit, particularly the switching transistors which participate in the driving signal fixing function, are shielded against light, the leak current of the transistors arising from light irradiation can be relatively suppressed low.

In summary, with the display apparatus, since the transistors in the pixel circuit, particularly the switching transistors which participate in the driving signal fixing function, are shielded against light, the leak current from the transistors can be suppressed relatively low, and consequently, the fluctuation which may be applied to the voltage stored in the storage capacitor can be reduced.

As a result, the driving current to be supplied to the electro-optical element can be kept fixed without being influenced by emission light or external light, and consequently, the emission light luminance of the electro-optical element can be kept fixed. Thus, picture quality deterioration by leak current arising from light irradiation such as image roughness can be eliminated, and uniform picture quality can be obtained. Further, the function for keeping the driving signal fixed by threshold value correction, mobility correction or bootstrap operation without being influenced by light irradiation can be operated with certainty.

If a display apparatus of the active matrix type wherein an electro-optical element of the current driven type such as an organic EL element is used in pixel circuits is configured such that each of the pixel circuits includes, as a driving signal fixing circuit, at least a threshold value correction function of a driving transistor, then the display apparatus can display an image of good picture quality without being influenced by the dispersion of the threshold voltage of the driving transistor. Where each pixel circuit further includes a mobility correction function of the driving transistor or an aged deterioration compensation function or bootstrap function of the electro-optical element, then higher picture quality can be achieved.

This is because the emission light luminance can be kept fixed without being influenced by such variations or dispersions as mentioned above by compensating for the threshold value fluctuation of the driving transistor by means of the threshold value correction function or by compensating for the mobility fluctuation of the driving transistor by means of the mobility correction function. Also it is a reason that the emission light luminance can always be kept fixed since, even if the current-voltage characteristic of the electro-optical element suffers from aged deterioration, through the bootstrap operation of the storage capacitor upon light emission, the potential difference between the control input terminal and the output terminal of the driving transistor is kept fixed by the bootstrapped storage capacitor.

Here, in order to implement the threshold value correction function and the threshold value correction preparation function or initialization function or the mobility correction function which is carried out prior to the threshold value correction function, the power supply terminal of the driving transistor is changed over between the first potential and the second potential, and use of the power supply voltage as a switching pulse functions effectively. In particular, if the power supply voltage to be supplied to the driving transistors of the pixel circuits is used as a switching pulse in order to incorporate the threshold value correction function or the mobility correction function, then a switching transistor for correction and a scanning line for controlling the control input terminal of the switching transistor become unnecessary.

As a result, only it is necessary to apply some modification to the driving timings and so forth of the transistors on the basis of the 2 TR driving configuration, and the number of components of the pixel circuit and the number of wiring lines can be reduced significantly and the pixel array section can be reduced in size. Consequently, a higher definition of the display apparatus can be achieved readily. Further, while simplification of the pixel circuit is achieved, a correction function against a luminance variation caused by a characteristic fluctuation of the elements by leak current arising from light irradiation can be implemented. Since the number of elements and the number of wiring lines are reduced, the display apparatus is suitable to achieve a higher definition, and a display apparatus of a small size for which high definition display is demanded can be implemented readily.

BRIEF DESCRIPTION OF THE DRAWINGS

FIG. 5 is a circuit diagram showing an example of a configuration of a pixel circuit of the active matrix display apparatus of FIG. 1;

FIGS. 8A to 8C are views showing an outline of a layer structure for one pixel of a general organic EL display apparatus;

FIG. 9 is a graph illustrating a current-voltage characteristic of a driving transistor and a sampling transistor;

FIG. 14B is a timing chart illustrating general operation of the modified pixel circuit shown in FIG. 14A;

FIG. 15B is a timing chart illustrating general operation of the modified pixel circuit shown in FIG. 15A.

DETAILED DESCRIPTION OF THE PREFERRED EMBODIMENT

Hereinafter, an embodiment of the present invention will be described with reference to the accompanying drawings.

<General Outline of the Display Apparatus>

Figure 1:
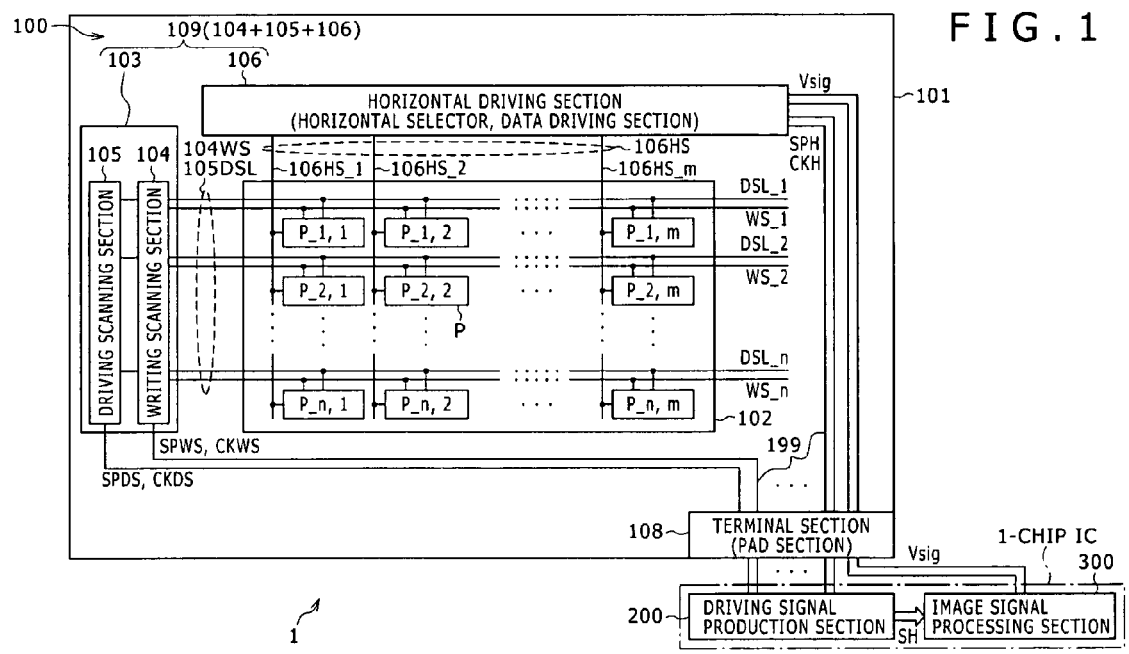
FIG. 1 is a block diagram showing a general configuration of an active matrix display apparatus as a display apparatus according to an embodiment of the present invention.

Referring first to FIG. 1, there are shown different examples of a configuration of an active matrix type display apparatus as a display apparatus according to a preferred embodiment of the present invention. In the present embodiment, the present invention is applied to an active matrix type organic EL display apparatus (hereinafter referred to simply as "organic EL display apparatus") wherein, for example, an organic EL element and a polysilicon thin film transistor (TFT) are used as a display element (electro-optical element or light emitting element) and an active element of each pixel, respectively. Further, in the organic EL display apparatus, such organic EL elements are formed on a semiconductor substrate on which such thin film transistors are formed.

It is to be noted that, while an organic EL element is described below particularly as an example of a display element of a pixel, this is a mere example, but the display element to be used is not limited to an organic EL element. Generally, all forms of the embodiment of the invention described below can be applied similarly to all display elements which are driven by current to emit light.

As seen in FIG. 1, the organic EL display apparatus 1 includes a display panel section 100 wherein a plurality of pixel circuits (also referred to as pixels) P each having an organic EL element not shown as a display element are disposed in such a manner as to form an effective image region of a display aspect ratio of X:Y which may be, for example, 9:16. The organic EL display apparatus 1 further includes a driving signal production section 200 serving as a panel control unit for generating various pulse signals for controlling and driving the display panel section 100, and an image signal processing section 300. The driving signal production section 200 and the image signal processing section 300 are built in a one-chip IC (Integrated Circuit; semiconductor integrated circuit).

The organic EL display apparatus 1 may have a form of a module which includes all of the display panel section 100, driving signal production section 200 and image signal processing section 300 or may have another form which includes, for example, only the display panel section 100. The organic EL display apparatus 1 having the form just described is utilized as a display section of a portable music player or some other electronic apparatus which utilizes a recording medium such as a semiconductor memory, a mini disk (MD) or a cassette tape.

The display panel section 100 includes a pixel array section 102 wherein the pixel circuits P are arrayed in a matrix of n rows×m columns, a vertical driving section 103 for scanning the pixel circuits P in a vertical direction, a horizontal driving section 106 for scanning the pixel circuits P in a horizontal direction, a terminal section or pad section 108 for external connection and so forth formed in an integrated manner on a substrate 101. The horizontal driving section 106 is called also horizontal selector or data line driving section. Thus, such peripheral driving circuits as the vertical driving section 103 and the horizontal driving section 106 are formed on the same substrate 101 on which the pixel array section 102 is formed.

The vertical driving section 103 includes, for example, a writing scanning section 104 and a driving scanning section 105 which functions as a power supply scanner having a power supplying capacity.

The vertical driving section 103 and the horizontal driving section 106 cooperatively form a control unit 109 which controls writing of a signal potential into a storage capacitor, a threshold value correction operation, a mobility correction operation and a bootstrap operation.

The configuration of the vertical driving section 103 shown and corresponding scanning lines is shown in conformity with that where the pixel circuits P have a 2 TR configuration of the present embodiment hereinafter described. However, depending upon the configuration of the pixel circuits P, some other scanning section may be provided.

The pixel array section 102 is driven, as an example, from one side or the opposite sides thereof in the leftward and rightward direction in FIG. 1 by the writing scanning section 104 and the driving scanning section 105 and is driven from one side or the opposite sides thereof in the upward and downward direction by the horizontal driving section 106.

To the terminal section 108, various pulse signals are supplied from the driving signal production section 200 disposed externally of the organic EL display apparatus 1. Similarly, an image signal Vsig is supplied from the image signal processing section 300 to the terminal section 108.

As an example, necessary pulse signals which include a shift start pulse SPDS or SPWS which is an example of a writing starting pulse in the vertical direction and a vertical scanning clock CKDS or CKWS are supplied as pulse signals for vertical driving. Further, as pulse signals for horizontal driving, necessary pulse signals such as a horizontal start pulse SPH which is an example of a writing starting pulse in the horizontal direction and a horizontal scanning clock CKH are supplied.

Terminals of the terminal section 108 are connected to the vertical driving section 103 and the horizontal driving section 106 through wiring lines 199. For example, pulses supplied to the terminal section 108 are supplied to components of the vertical driving section 103 or the horizontal driving section 106 through buffers after the voltage level thereof is internally adjusted by a level shifter section not shown as occasion demands.

Though not shown, the pixel array section 102 is configured such that the pixel circuits P wherein a pixel transistor is provided for an organic EL element as a display element are disposed two-dimensionally in rows and columns and the scanning lines are wired for individual rows and the signal lines are wired for individual columns for the pixel array.

For example, scanning lines or gate lines 104WS, power supply lines 150DSL and image signal lines or data lines 106HS are formed in the pixel array section 102. At each of intersecting places of the gate lines 104WS and power supply lines 150DSL and the data lines 106HS, an organic EL element not shown and a thin film transistor (TFT) for driving the organic EL element are formed. A pixel circuit P is formed from a combination of the organic EL element and the thin film transistor.

In particular, for the pixel circuits P arrayed in a matrix, writing scanning lines 104WS_1 to 104WS_N for n rows which are driven with a writing driving pulse WS by the writing scanning section 104 and power supply lines 105DS_1 to 105DSL_n for n rows which are driven with a power supply driving pulse DSL by the driving scanning section 105 are wired for the individual pixel rows.

The writing scanning section 104 and the driving scanning section 105 successively select the pixel circuits P through the scanning lines 104WS and the power supply lines 105DSL based on a pulse signal of the vertical driving system supplied from the driving signal production section 200. The horizontal driving section 106 samples a predetermined potential from within the image signal Vsig through an image signal line 106HS and writes the sampled predetermined potential into the storage capacitor of the selected pixel circuit P based on a pulse signal of the horizontal driving system supplied from the driving signal production section 200.

In the organic EL display apparatus 1 of the present embodiment, line-sequential driving is used as an example. In particular, the writing scanning section 104 and the driving scanning section 105 of the vertical driving section 103 scan the pixel array section 102 line-sequentially, that is, in a unit of a row, and the horizontal driving section 106 writes an image signal into the pixel array section 102 simultaneously for one horizontally line in synchronism with the line-sequential scanning.

In order to be ready for line-sequential driving, for example, the horizontal driving section 106 is configured including a driver circuit for placing switches not shown provided on the image signal lines 106HS of all columns into an on state at a time. Further, the horizontal driving section 106 places switches not shown provided on the image signal lines 106HS of all columns into an on state at a time in order to write an image signal inputted from the image signal processing section 300 at a time into all pixel circuits P for one line of a row selected by the vertical driving section 103.

In order to be ready for line-sequential driving, components of the vertical driving section 103 are formed from combinations of logic gates including latches and select the pixel circuits P of the pixel array section 102 in a unit of a row. It is to be noted that, while the configuration wherein the vertical driving section 103 is disposed on only one side of the pixel array section 102 is shown in FIG. 1, it is possible to otherwise dispose the vertical driving section 103 on the opposite left and right sides of the pixel array section 102.

Similarly, while the configuration wherein the horizontal driving section 106 is disposed on only one side of the pixel array section 102 is shown in FIG. 1, it is possible to adopt another configuration wherein the horizontal driving section 106 is disposed on the opposite upper and lower sides of the pixel array section 102.

<Pixel Circuit>

Figure 2:
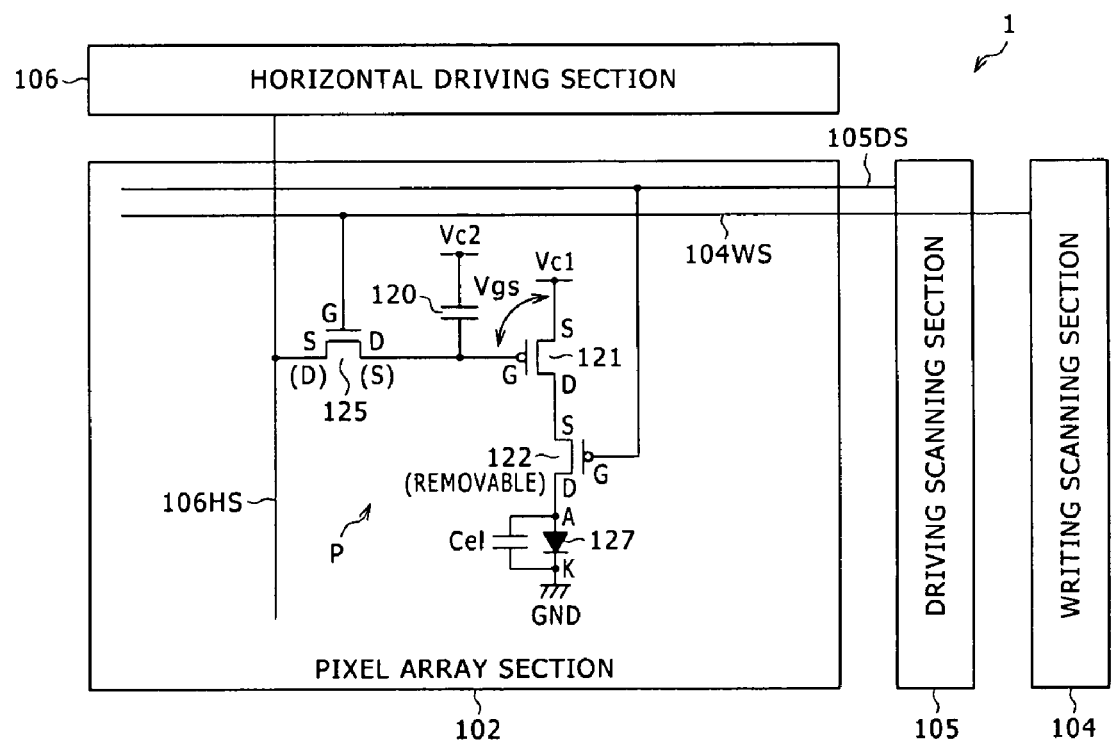
FIGS. 2 and 3 are circuit diagrams showing first and second comparative examples with a pixel circuit used in the active matrix display apparatus of FIG. 1.

FIG. 2 shows a first comparative example with the pixel circuit P of the embodiment used in the organic EL display apparatus 1 described hereinabove with reference to FIG. 1. FIG. 2 also shows the vertical driving section 103 and the horizontal driving section 106 provided at peripheral portions of the pixel circuit P on the substrate 101 of the display panel section 100.

Figure 3:
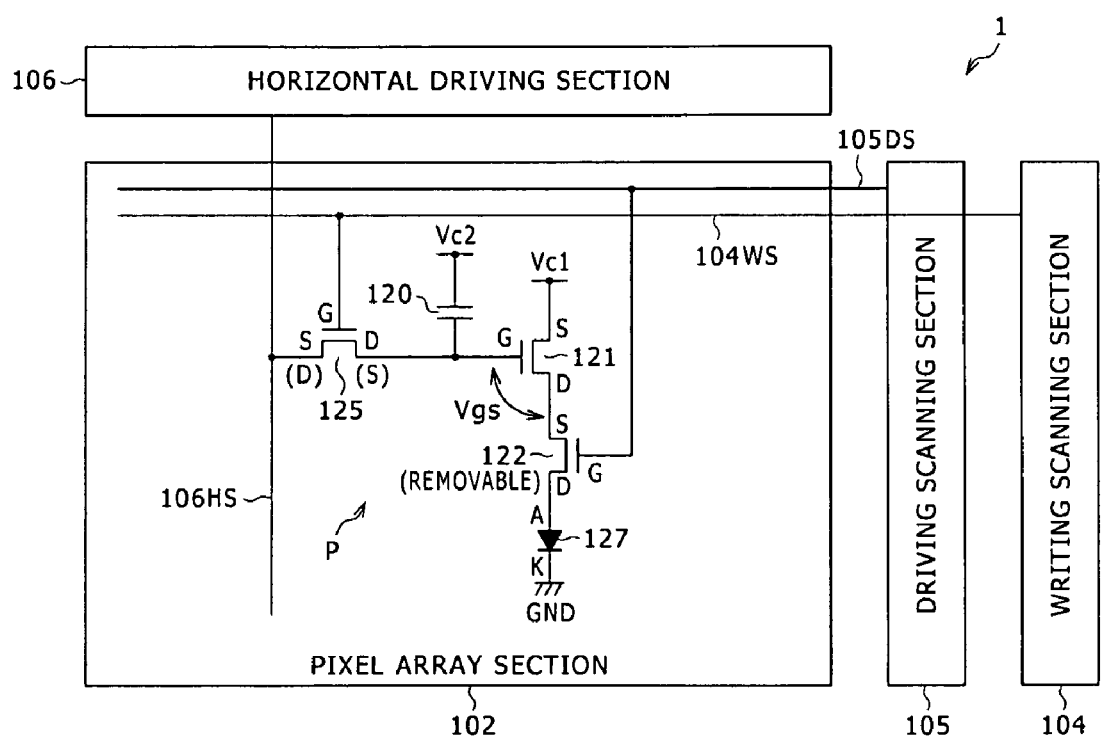

FIG. 3 shows a second comparative example with the pixel circuit P of the embodiment. FIG. 3 also shows the vertical driving section 103 and the horizontal driving section 106 provided at peripheral portions of the pixel circuit P on the substrate 101 of the display panel section 100.

Figure 4A:
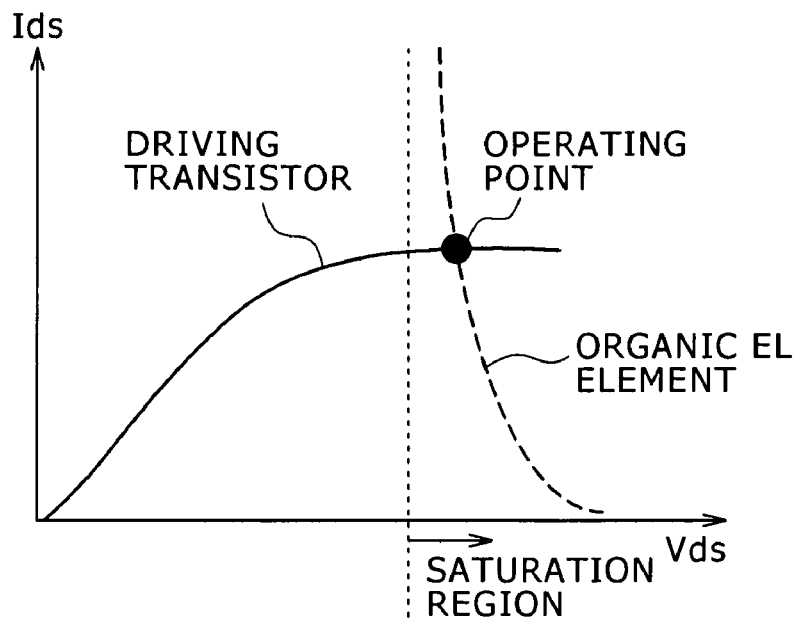
FIG. 4A is a graph illustrating an operating point of an organic EL element and a driving transistor.
Figure 4B:
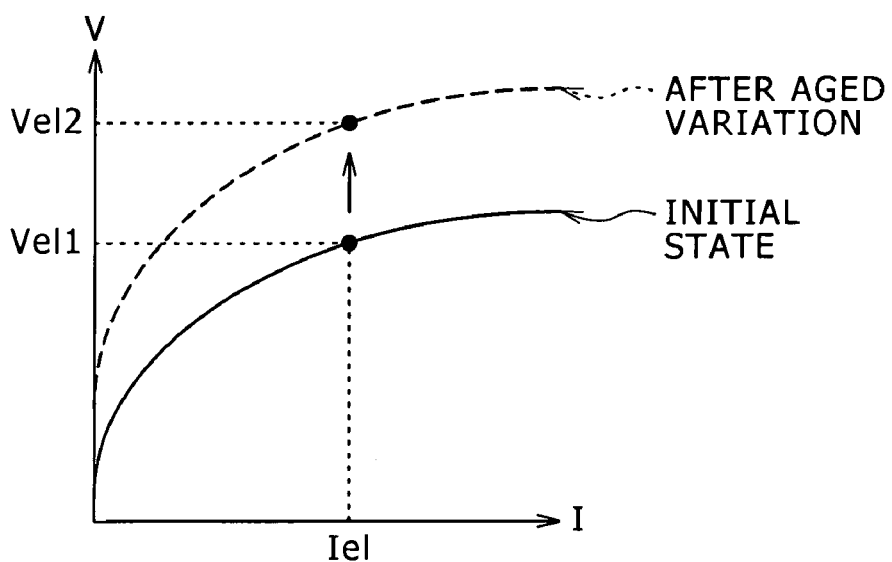
FIGS. 4B to 4D are graphs illustrating an influence of a characteristic dispersion of an organic EL element or a driving transistor on driving current.
Figure 4C:
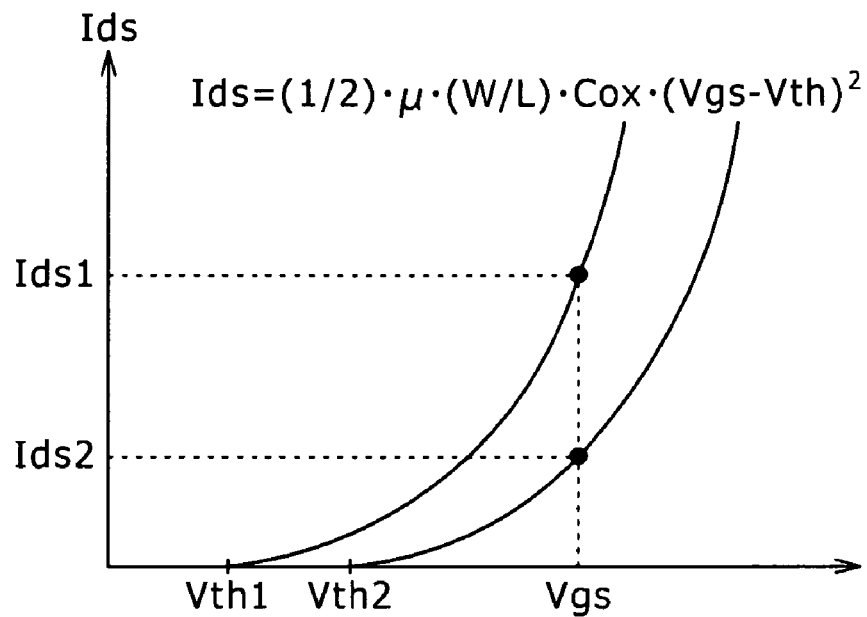
Figure 4D:
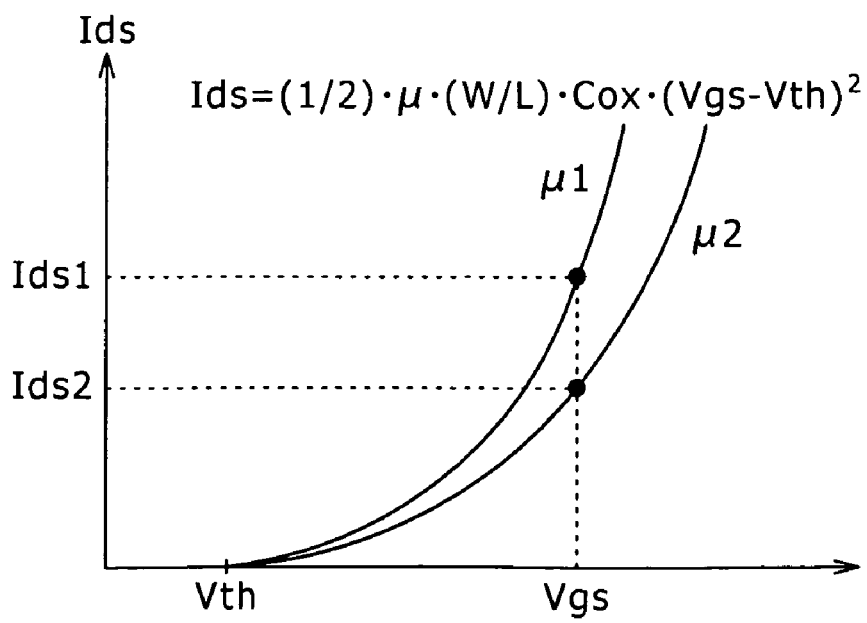

FIG. 4A illustrates an operating point of an organic EL element and a driving transistor. FIGS. 4B to 4D illustrate an influence of a characteristic dispersion of an organic EL element and a driving transistor gave on the driving current Ids.

FIG. 5 shows a circuit configuration example with the pixel circuit P of the embodiment. Also FIG. 5 shows the vertical driving section 103 and the horizontal driving section 106 provided at peripheral portions of the pixel circuit P on the substrate 101 of the display panel section 100.

<Pixel Circuit of a Comparative Example: First Example>

Referring to FIG. 2, in the pixel circuit P of the first comparative example, a drive transistor is basically formed from a p-channel thin film field effect transistor (TFT). The pixel circuit P further adopts a 3 TR driving configuration which uses two transistors for scanning in addition to the drive transistor.

In particular, the pixel circuit P of the first comparative example includes a p-channel drive transistor 121, a p-channel light emission controlling transistor 122 to which an active-L driving pulse is supplied, and an n-channel sampling transistor 125 to which an active-H driving pulse is supplied. The pixel circuit P further includes an organic EL element 127 which is an example of an electro-optical element or light emitting element which emits light when current flows therethrough, and a storage capacitor 120 which may be referred to also as pixel capacitor. The drive transistor 121 supplies driving current to the organic EL element 127 in accordance with a potential supplied to the gate terminal G which is a control input terminal thereof.

It is to be noted that generally the sampling transistor 125 can be replaced by a p-channel transistor to which an active-L driving pulse is supplied. The light emission controlling transistor 122 can be replaced by an n-channel transistor to which an active-H driving pulse is supplied.

The sampling transistor 125 is a switching transistor provided on the gate terminal G or control input terminal of the drive transistor 121, and also the light emission controlling transistor 122 is a switching transistor.

Since generally the organic EL element 127 has a rectification property, it is represented by a symbol of a diode. It is to be noted that the organic EL element 127 includes parasitic capacitance Cel. In FIG. 2, the parasitic capacitance Cel is shown connected in parallel to the organic EL element 127.

The pixel circuit P is disposed at an intersecting point of scanning lines 104WS and 105DS on the vertical scanning side and an image signal line 106HS which is a scanning line on the horizontal scanning side. The writing scanning line 104WS from the writing scanning section 104 is connected to the gate terminal G of the sampling transistor 125, and the driving scanning line 105DS from the driving scanning section 105 is connected to the gate terminal G of the light emission controlling transistor 122.

The sampling transistor 125 is connected at the source terminal S as a signal input terminal thereof to the image signal line 106HS and at the drain terminal D as a signal output terminal thereof to the gate terminal G of the drive transistor 121. The storage capacitor 120 is interposed between the junction between the drain terminal D of the sampling transistor 125 and the gate terminal G of the drive transistor 121 and a second power supply voltage Vc2 which may a positive power supply voltage or may be equal to a first power supply voltage Vc1. As indicated in parentheses, the sampling transistor 125 may be connected reversely in the connection relationship of the source terminal S and the drain terminal D such that it is connected at the drain terminal D as a signal input terminal thereof to the image signal line 106HS and at the source terminal S as a signal output terminal thereof to the gate terminal G of the drive transistor 121.

The drive transistor 121, light emission controlling transistor 122 and organic EL element 127 are connected in order in series between the first power supply voltage Vc1 which may be, for example, a positive power supply voltage and a ground potential GND which is an example of a reference potential. In particular, the drive transistor 121 is connected at the source terminal S thereof to the first power supply voltage Vc1 and at the drain terminal D thereof to the source terminal S of the light emission controlling transistor 122. The light emission controlling transistor 122 is connected at the drain terminal D thereof to the anode terminal A of the organic EL element 127, and the organic EL element 127 is connected at the cathode terminal K thereof to the ground potential GND.

It is to be noted that, as a simpler configuration, the pixel circuit P shown in FIG. 2 may have a 2 TR driving configuration which does not include the light emission controlling transistor 122. In this instance, the organic EL display apparatus 1 may have a configuration which does not include the driving scanning section 105.

In any of the 3 TR driving configuration shown in FIG. 2 and the simplified 2 TR driving configuration not shown, since the organic EL element 127 is a current light emitting element, a gradation of emitted light is obtained by controlling the amount of current flowing through the organic EL element 127. To this end, the value of current to flow through the organic EL element 127 is controlled by varying the application voltage to the gate terminal G of the drive transistor 121.

In particular, an active-H writing driving pulse WS is first supplied from the writing scanning section 104 to place the writing scanning line 104WS into a selected state, and an image signal Vsig is applied from the horizontal driving section 106 to the image signal line 106HS. Consequently, the n-channel sampling transistor 125 is rendered conducting so that the image signal Vsig is written into the storage capacitor 120.

The signal potential stored in the storage capacitor 120 becomes the potential of the gate terminal G of the drive transistor 121. Then, the writing driving pulse WS is rendered inactive, that is, in the present example, is set to the L level, to place the writing scanning line 104WS into a non-selected state. Although the image signal line 106HS and the drive transistor 121 are electrically isolated from each other, the gate-source voltage Vgs of the drive transistor 121 is held stably in principle by the storage capacitor 120.

Then, an active-L scanning driving pulse DS is supplied from the driving scanning section 105 to place the driving scanning line 105DS into a selected state. Consequently, the p-channel light emission controlling transistor 122 is rendered conducting, and driving current flows from the first power supply potential Vc1 toward the ground potential GND through the drive transistor 121, light emission controlling transistor 122 and organic EL element 127.

Then, the scanning driving pulse DS is rendered inactive, in the present example, set to the H level, to place the driving scanning line 105DS into a non-selected state. Consequently, the light emission controlling transistor 122 is placed into an off state, and driving current does not flow any more.

The light emission controlling transistor 122 is inserted in order to control the light emission time, that is, the duty, of the organic EL element 127 within a one-field period. As can be presumed from the description given hereinabove, the pixel circuit P need not essentially include the light emission controlling transistor 122.

The current flowing through the drive transistor 121 and the organic EL element 127 has a value corresponding to the gate-source voltage Vgs of the drive transistor 121, and the organic EL element 127 continues to emit light with luminance corresponding to the value of the current.

The operation of conveying the image signal Vsig applied to the image signal line 106HS through selection of the writing scanning line 104WS to the inside of the pixel circuit P in this manner is hereinafter referred to as "writing." In this manner, if writing of a signal is carried out once, then the organic EL element 127 continues to emit light with fixed luminance for a period of time until the signal is rewritten subsequently.

In this manner, in the pixel circuit P of the first comparative example, the application voltage to be supplied to the gate terminal G of the drive transistor 121 is varied in response to the input signal, that is, the pixel signal Vsig, to control the value of current to flow through the organic EL element 127. At this time, the source terminal S of the p-channel drive transistor 121 is connected to the first power supply potential Vc1, and the drive transistor 121 normally operates in its saturation region.

<Pixel Circuit of a Comparative Example: Second Example>

Now, the pixel circuit P of the second comparative example shown in FIG. 3 as a comparative example with the pixel circuit P of the present embodiment in regard to a characteristic is described. The organic EL display apparatus 1 wherein the pixel circuits P of the second comparative example are provided in the pixel array section 102 is hereinafter referred to as organic EL display apparatus 1 of the second comparative example.

In the pixel circuits P of the second comparative example and the present embodiment, a drive transistor is formed from an n-channel thin film field effect transistor.

If not a p-channel transistor but an n-channel transistor can be used as a drive transistor, then it is possible to use an existing amorphous silicon (a-Si) process for transistor fabrication. This makes it possible to reduce the cost for a transistor substrate, and development of the pixel circuit P having such a configuration described above is expected.

The pixel circuit P of the second comparative example is basically same as the pixel circuit P of the organic EL display apparatus 1 of the present embodiment in that a drive transistor is formed from an n-channel thin film field effect transistor. However, the pixel circuit P of the second comparative example does not include a driving signal fixing circuit for preventing an influence of aged deterioration of the organic EL element 127 on driving current Ids.

In particular, the pixel circuit P of the second comparative example includes a drive transistor 121, a light emission controlling transistor 122 and a sampling transistor 125 all of the n-channel type, and an organic EL element 127 which is an example of an electro-optical element which emits light when current flows therethrough.

The drive transistor 121 is connected at the drain terminal D thereof to the first power supply potential Vc1 and at the source terminal S thereof to the drain terminal D of the light emission controlling transistor 122. The light emission controlling transistor 122 is connected at the source terminal S thereof to the anode terminal A of the organic EL element 127, and the organic EL element 127 is connected at the cathode terminal K thereof to the ground potential GND. In the pixel circuit P, the drive transistor 121 is connected at the drain terminal D thereof to the first power supply potential Vc1 and at the source terminal S thereof to the anode terminal A of the organic EL element 127 in such a manner as to generally form a source follower circuit.

The sampling transistor 125 is connected at the source terminal S thereof to an image signal line HS and at the drain terminal D thereof to the gate terminal G as a control input terminal of the drive transistor 121. The storage capacitor 120 is interposed between the junction between the drain terminal D of the sampling transistor 125 and the gate terminal G of the drive transistor 121 and the second power supply voltage Vc2 which may be, for example, a positive power supply voltage or may be equal to the first power supply voltage Vc1. As indicated by parentheses, the sampling transistor 125 may have a reversed connection scheme in regard to the source terminal S and the drain terminal D thereof.

In the pixel circuit P having the configuration described above, irrespective of whether or not a light emission controlling transistor is provided, when the organic EL element 127 is to be driven, the drain terminal D of the drive transistor 121 is connected to the first power supply voltage Vc1 while the source terminal S of the drive transistor 121 is connected to the anode terminal A of the organic EL element 127 thereby to generally form a source follower circuit.

It is to be noted that, as a simpler configuration, also the pixel circuit P shown in FIG. 3 may have a 2 TR driving configuration which does not include the light emission controlling transistor 122. In this instance, the organic EL display apparatus 1 adopts a configuration which does not include the driving scanning section 105.

Now, operation of the pixel circuit P of the second comparative example shown in FIG. 3 is described. It is to be noted that the description here omits description of operation of the light emission controlling transistor 122. First, the potential within an effective period from within the potential of the image signal Vsig supplied from the image signal line HS is sampled, and the organic EL element 127 which is an example of a light emitting element is placed into a light emitting state. The potential of the image signal Vsig mentioned is hereinafter referred to also as image signal line potential, and the potential within en affective period is hereinafter referred to also as signal potential.

In particular, within a time zone within which the image signal line 106HS has the signal potential within an effective period of the image signal Vsig, the potential of the writing driving pulse WS changes over to the high level to place the n-channel sampling transistor 125 into an on state. Consequently, the image signal line potential supplied from the image signal line HS is charged into the storage capacitor 120. Consequently, the potential of the gate terminal G, that is, the gate potential Vg, of the drive transistor 121 begins to rise thereby to begin to cause drain current to flow. As a result, the anode potential of the organic EL element 127 rises and the organic EL element 127 begins to emit light.

Thereafter, when the writing driving pulse WS changes over to a low level, the image signal line potential at the point of time, that is, the potential or signal potential within an effective period from within the potential of the image signal Vsig, is stored into the storage capacitor 120. Consequently, the gate potential Vg of the driving transistor 121 becomes fixed and the emission light luminance is kept fixed till a next frame or field. The period within which the potential of the writing driving line WS remains the high level becomes a sampling period of the image signal Vsig, and a period later than the point of time at which the writing driving line WS changes over to the low level becomes a storage period.

<Iel-Vel Characteristic of the Light Emitting Element and I-V Characteristic of the Driving Transistor>

Generally, the drive transistor 121 is driven within a saturation region within which the driving current Ids is fixed irrespective of the drain-source voltage as seen in FIG. 4A. Therefore, where the current flowing between the drain terminal and the source of the transistor which operates in a saturation region is represented by Ids, the mobility by μ, the channel width or gate width by W, the channel length or gate length by L, the gate capacitance, that is, the gate oxide film per unit area, by Cox, and the threshold voltage of the transistor by Vth, the drive transistor 121 serves as a constant current source having a value represented by the expression (1) given below. As can be seen apparently from the expression (1), in the saturation region, the driving current Ids of the transistor is controlled by the gate-source voltage Vgs and acts as a constant current source.

$$Ids = \frac{1}{2}\mu\frac{W}{L}Cox(Vgs - Vth)^2 \quad (1)$$

However, generally the I-V characteristic of a light emitting element of the current driven type beginning with an organic EL element deteriorates as time passes as seen from a graph shown in FIG. 4B. In the current-voltage (Iel-Vel) characteristic of the light emitting element of the current driven type represented by an organic EL element illustrated in the graph shown in FIG. 4B, a solid line curve represents the characteristic in an initial state, and a broken line curve represents the characteristic after the aged deterioration.

For example, when the light emission current Iel flows through the organic EL element 127 which is an example of a light emitting element, the anode-cathode voltage Vel is determined uniquely. However, as seen from the graph in FIG. 4B, within a light emitting period, the light emission current Iel which is determined by the drain-source current Ids, which is the driving current Ids, of the drive transistor 121 flows through the anode terminal A of the organic EL element 127, and the potential of the anode terminal A of the organic EL element 127 rises by an amount corresponding to the anode-cathode voltage Vel of the organic EL element 127.

In the pixel circuit P of the first comparative example shown in FIG. 2, the influence of the rise by the anode-cathode voltage Vel of the organic EL element 127 appears on the drain terminal D side of the drive transistor 121. However, since the drive transistor 121 is driven with constant current and operates in the saturation region, the constant current Ids continues to flow through the organic EL element 127, and even if the Iel-Vel characteristic of the organic EL element 127 is deteriorated, the emission light luminance of the organic EL element 127 does not suffer from aged deterioration.

By the configuration of the pixel circuit P which includes the drive transistor 121, light emission controlling transistor 122, storage capacitor 120 and sampling transistor 125 and has the connection scheme shown in FIG. 2, a driving signal fixing circuit which compensates for the variation of the current-voltage characteristic of the organic EL element 127, which is an example of an electro-optical element, to keep the driving current fixed is formed.

In particular, when the pixel circuit P is driven with the image signal Vsig, the source terminal S of the drive transistor 121 is connected to the first power supply potential Vc1 and is designed so that the p-channel drive transistor 121 always operates in the saturation region. Therefore, the drive transistor 121 serves as a constant current source which has a value represented by the expression (1).

Further, in the pixel circuit P of the first comparative example, while the voltage of the drain terminal D of the drive transistor 121 varies together with aged deterioration (FIG. 4B) of the Iel-Vel characteristic of the organic EL element 127, since the gate-source voltage Vgs is kept fixed in principle by a bootstrap function of the storage capacitor 120, the drive transistor 121 operates as a constant current source. As a result, current of a fixed amount flows through the organic EL element 127, and consequently, the organic EL element 127 can emit light with fixed luminance and the emission light luminance does not vary.

Also in the pixel circuit P of the second comparative example, the potential of the source terminal S, that is, the source potential Vs, of the drive transistor 121 depends upon the operating point of the drive transistor 121 and the organic EL element 127, and the drive transistor 121 is driven in its saturation region. Therefore, with the gate-source voltage Vgs corresponding to the source voltage at the operating point, driving current Ids of a current value defined by the expression (1) given hereinabove flows.

However, in a simplified circuit wherein the p-channel drive transistor 121 of the pixel circuit P of the first comparative example is replaced by the n-channel drive transistor 121, that is, in the pixel circuit P of the second comparative example, the source terminal S of the drive transistor 121 is connected to the organic EL element 127 side. As a result, the operating point of the drive transistor 121 varies because the anode-cathode voltage Vel with respect to the same light emission current Iel varies from Vel1 to Vel2 because of the Iel-Vel characteristic of the organic EL element 127 which suffers from aged deterioration as described hereinabove with reference to the curve shown in FIG. 4B. Consequently, even if the same gate potential Vg is applied, the source potential Vs of the drive transistor 121 varies. Consequently, the gate-source voltage Vgs of the drive transistor 121 varies.

As apparent from the characteristic expression (1), if the gate-source voltage Vgs fluctuates, then the driving current Ids fluctuates even if the gate potential Vg is fixed, and consequently, the value of current flowing through the organic EL element 127, that is, the light emission current Iel, fluctuates, resulting in fluctuation of the emission light luminance.

In this manner, in the pixel circuit P of the second comparative example, the anode potential fluctuation of the organic EL element 127 by aged deterioration of the Iel-Vel characteristic of the organic EL element 127 which is an example of a light emitting element appears as a fluctuation of the gate-source voltage Vgs of the driving transistor 121 and gives rise to a fluctuation of the drain current, that is, of the driving current Ids. The fluctuation of the driving current Ids by the reason described appears as a dispersion of the emission light luminance or aged deterioration for each pixel circuit P, and this gives rise to deterioration of the picture quality.

In contrast, although details are hereinafter described, also where the n-type drive transistor 121 is used, a circuit configuration and driving timings which implement a bootstrap function of causing the potential Vg of the gate terminal G of the drive transistor 121 to operate in an interlocking relationship with the fluctuation of the potential Vs of the source terminal S of the drive transistor 121 are adopted. Consequently, even if the anode potential of the organic EL element 127, that is, the source potential of the drive transistor 121, is fluctuated by the aged deterioration of the characteristic of the organic EL element 127, the gate potential Vg is fluctuated so as to cancel the fluctuation of the anode potential. This ensures the uniformity in luminance of the display. By the bootstrap function, the aged deterioration compensation capability of a light emitting element of the current driven type represented by an organic EL element can be improved.

Naturally, the bootstrap function operates also when the source potential Vs of the drive transistor 121 is fluctuated by the fluctuation of the anode-cathode voltage Vel of the organic EL element 127 in the course of rise of the anode-cathode voltage Vel is stabilized after the light emission current Iel begins to flow through the organic EL element 127 at a point of time of starting of light emission.

<Vgs-Ids Characteristic of the Drive Transistor>

While the characteristic of the drive transistor 121 does not particularly matter in the first and second comparative examples, if the characteristic of the drive transistor 121 differs among different pixels, then this has an influence on the driving current Ids flowing through the drive transistor 121. As an example, as can be recognized from the expression (1), where the mobility μ or the threshold voltage Vth disperses among pixels or is deteriorated as time passes, even if the gate-source voltage Vgs is same, a dispersion or aged deterioration occurs with the driving current Ids flowing through the drive transistor 121. Consequently, also the emission light luminance of the organic EL element 127 varies for individual pixels.

For example, a characteristic fluctuation of the threshold voltage Vth or the mobility u for each pixel circuit P is caused by a dispersion of the fabrication process for the drive transistor 121. Also where the drive transistor 121 is driven in its saturation region, even if the same gate potential is applied to the drive transistor 121, the drain current or driving current Ids is fluctuated by the characteristic fluctuation described above for each pixel circuit P, and this appears as a dispersion of the emission light luminance.

For example, another graph shown in FIG. 4C illustrates the voltage-current (Vgs-Ids) characteristic with attention paid to a threshold value dispersion of the drive transistor 121. In the graph of FIG. 4C, characteristic curves of two drive transistors 121 having different threshold voltages Vth1 and Vth2 are illustrated.

As described hereinabove, the drain current Ids when the drive transistor 121 operates in the saturation region is represented by the characteristic expression (1). As can be seen apparently from the characteristic expression (1), if the threshold voltage Vth fluctuates, then even if the gate-source voltage Vgs is fixed, the driving current Ids fluctuates. In other words, if no countermeasure is taken against the dispersion of the threshold voltage Vth, then the driving current corresponding to the gate-source voltage Vgs when the threshold voltage is Vth1 is Ids1 as seen from the graph of FIG. 4C while the driving current Ids2 corresponding to the same gate-source voltage Vgs when the threshold voltage is Vth2 is different from the driving current Ids1.

Meanwhile, FIG. 4D illustrates a voltage-current (Vgs-Igs) characteristic with attention paid to the mobility dispersion of the drive transistor 121. Characteristic curves regarding two drive transistors 121 having different mobility values μ1 and μ2 are illustrated in FIG. 4D.

As can be seen apparently from the characteristic expression (1), if the mobility μ fluctuates, then even if the gate-source voltage Vgs is fixed, the driving current Ids fluctuates. In other words, if no countermeasure is taken against the dispersion of the mobility μ, then while the driving current corresponding to the gate-source voltage Vgs when the mobility is μ1 is Ids1 as shown in FIG. 4D, the driving current corresponding to the gate-source voltage Vgs same as that when the mobility is μ2 is Ids2 and different from Ids1.

As shown in FIGS. 4C and 4D, if a great difference in the Vin-Ids characteristic is caused by the difference of the threshold voltage Vth or the mobility p, then even if the same signal amplitude Vin is applied, the driving current Ids and hence the emission light luminance differ and uniformity of the screen luminance cannot be obtained.

<Concept of the Threshold Value Correction and the Mobility Correction>

In contrast, if the driving timings are set so as to implement a threshold value correction function and a mobility correction function (details are hereinafter described), then the influence of such fluctuations can be suppressed and uniformity of the screen luminance can be assured.

In the threshold value correction operation and the mobility correction operation in the present embodiment, although details are hereinafter described, if it is assumed that the write gain is 1 which is an ideal value, then if the gate-source voltage Vgs upon light emission is set so as to satisfy "Vin+Vth−ΔV," then the driving current Ids is prevented from relying upon the dispersion or the variation of the threshold voltage Vth and from relying upon the dispersion or the variation of the mobility μ. As a result, even if the threshold voltage Vth or the mobility μ is fluctuated by the fabrication process or the aged deterioration, the driving current Ids does not fluctuate and also the emission light luminance of the organic EL element 127 does not fluctuate.

Upon mobility correction, negative feedback is applied such that, for the high mobility μ1, a mobility correction parameter ΔV1 is set to a high value, but for the low mobility μ2, also another mobility correction parameter ΔV2 is set to a low value. Therefore, the mobility correction parameter ΔV is hereinafter referred to also as negative feedback amount ΔV.

<Pixel Circuit of the Embodiment>

A pixel circuit P of the embodiment shown in FIG. 5 incorporates a circuit, that is, a bootstrap circuit, which prevents driving current fluctuation by aged deterioration of the organic EL element 127 in the pixel circuit P of the second comparative example described hereinabove with reference to FIG. 3 and adopts a driving method which prevents driving current fluctuation by a characteristic fluctuation such as a threshold voltage fluctuation or a mobility fluctuation of the drive transistor 121. The organic EL display apparatus 1 wherein the pixel circuits P of the embodiment are provided in the pixel array section 102 is hereinafter referred to as organic EL display apparatus 1 of the embodiment.

The pixel circuit P of the embodiment uses the n-channel drive transistor 121 similarly to the pixel circuit P of the second comparative example. The pixel circuit P of the embodiment additionally includes a circuit for suppressing the fluctuation of the driving current Ids to the organic EL element by aged deterioration of the organic EL element, that is, a driving signal fixing circuit which compensates for the fluctuation of the current-voltage characteristic of the organic EL element which is an example of an electro-optical element to keep the driving current Ids fixed. Further, the pixel circuit P of the embodiment has a function of fixing the driving current even where the current-voltage characteristic of the organic EL element suffers from aged deterioration.

In particular, the pixel circuit P adopts a 2 TR driving configuration which uses one switching transistor for scanning, that is, the sampling transistor 125, in addition to the drive transistor 121. The pixel circuit P is further prevents the influence of aged deterioration of the organic EL element 127 or a characteristic fluctuation such as, for example, a dispersion or a fluctuation of the threshold voltage or the mobility upon the driving current Ids by setting of the power supply driving pulse DSL for controlling the switching transistors and the on/off timings of the writing driving pulse WS.

Since the pixel circuit P has the 2 TR driving configuration and uses a comparatively small number of elements and wiring lines, a high definition can be anticipated. In addition, since the image signal Vsig can be sampled without deterioration, good picture quality can be obtained.

The pixel circuit P of the embodiment is much different in configuration from the pixel circuit P of the second comparative example described hereinabove with reference to FIG. 3 in that the connection scheme of the storage capacitor 120 is modified such that a bootstrap circuit which is an example of a driving signal fixing circuit is formed as a circuit for preventing driving current fluctuation by aged deterioration of the organic EL element 127. As a method of suppressing the influence of a characteristic fluctuation such as, for example, a dispersion or a fluctuation of the threshold voltage or the mobility of the drive transistor 121, the driving timings of the transistors 121 and 125 are optimized.

In particular, the pixel circuit P of the embodiment includes the storage capacitor 120, an n-channel drive transistor 121, an n-channel sampling transistor 125 to which an active-H (high) writing driving pulse WS is supplied, and an organic EL element 127 which is an example of an electro-optical element or light emitting element which emits light when current flows therethrough.

The storage capacitor 120 is connected between the gate terminal G (node ND122) and the source terminal S of the drive transistor 121, and the drive transistor 121 is connected at the source terminal S thereof to the anode terminal A of the organic EL element 127. The storage capacitor 120 functions as a bootstrap capacitor. The cathode terminal K of the organic EL element 127 provides a cathode potential Vcath as a reference potential. Preferably, the cathode potential Vcath is connected to a wiring line Vcath, for example, the ground wiring line GND, which is common to all pixels for supplying the reference voltage similarly as in the second comparative example described hereinabove with reference to FIG. 3.

The drive transistor 121 is connected at the drain terminal D thereof to a power supply line 105DSL from the driving scanning section 105 which functions as a power supply scanner. The power supply line 105DSL itself has a power supplying capacity to the drive transistor 121.

In particular, the driving scanning section 105 includes a power supply voltage changeover circuit which switchably supplies a first potential Vcc of the high voltage side and a second potential Vss of the low voltage side corresponding to the power supply voltages to the drain terminal D of the drive transistor 121.

The second potential Vss is sufficiently lower than a reference potential Vofs of the image signal Vsig on the image signal line 106HS. The reference potential Vofs is referred to also as offset potential Vofs. In particular, the second potential Vss of the low potential side on the power supply line 105DSL is set so that the gate-source voltage Vgs of the drive transistor 121, that is, the difference between the gate potential Vg and the source potential Vs of the drive transistor 121, may be higher than the threshold voltage Vth of the drive transistor 121. It is to be noted that the offset potential Vofs is utilized in an initialization operation prior to a threshold value correction operation and is used also to precharge the image signal line 106HS in advance.

The sampling transistor 125 is connected at the gate terminal G thereof to the writing scanning line 104WS from the writing scanning section 104, at the drain terminal D thereof to the image signal line 106HS and at the source terminal S thereof to the gate terminal G (node ND122) of the drive transistor 121. To the gate terminal G of the drive transistor 121, the active-H writing driving pulse WS from the writing scanning section 104 is supplied.

The sampling transistor 125 may be connected in a reversed connection scheme with regard to the source terminal S and the drain terminal D. Further, the sampling transistor 125 may be formed from any of a transistor of the depletion type and a transistor of the enhancement type.

<Operation of the Pixel Circuit of the Embodiment>

Figure 6A:
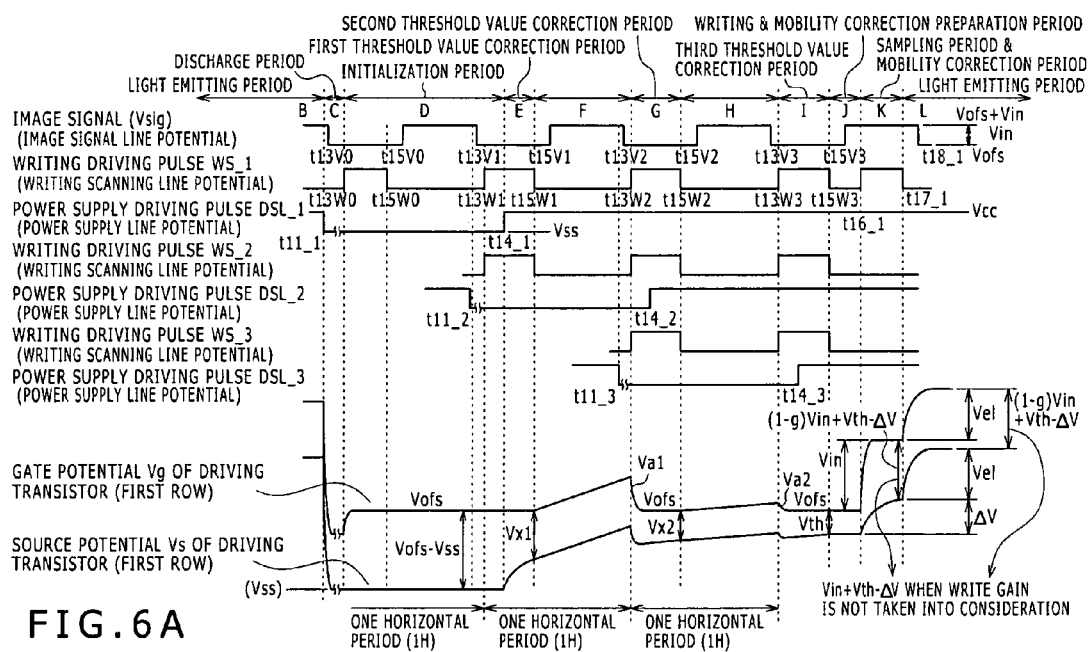
FIG. 6A is a timing chart illustrating a basic example of driving timings of the pixel circuit shown in FIG. 5.

FIG. 6A illustrates a basic example of driving timings of the embodiment of the pixel circuit P described hereinabove with reference to FIG. 5. Meanwhile, FIGS. 6B to 6L illustrate operation states of equivalent circuits within periods B to L of the timing chart of FIG. 6A. FIG. 7A illustrates a variation of the source potential Vs of the drive transistor 121 upon threshold value correction operation of the pixel circuit P, and FIG. 7B illustrates a variation of the source potential Vs of the drive transistor 121 upon mobility correction operation of the pixel circuit P.

In the following description, in order to facilitate description and understandings, unless otherwise specified, it is assumed that the write gain is 1 which is an ideal value and such simple representation as to write or store information of the signal amplitude Vin into or in the storage capacitor 120 or sample information of the signal amplitude Vin is used. Where the write gain is lower than 1, not the magnitude itself of the signal amplitude Vin but information of the signal amplitude Vin multiplied by the corresponding gain is stored into the storage capacitor 120.

Incidentally, the rate of the magnitude of information written into the storage capacitor 120 corresponding to the signal amplitude Vin is referred to as write gain Ginput. Here, the write gain Ginput relates to a charge amount distributed, in a capacitive series circuit of total capacitance C1 including parasitic capacitance disposed in parallel to the storage capacitor 120 in an electric circuit and total capacitance C2 disposed in series to the storage capacitor 120 in an electric circuit, to the total capacitance C1 when the signal amplitude Vin is supplied to the capacitive series circuit. If this is represented by an expression, where g=C1/(C1+C2), the write gain Ginput is given by Ginput=C2/(C1+C2)=1−C1/(C1+C2)=1−g. In the following description, any description which involves "g" takes the write gain into consideration.

Further, in order to facilitate description and understandings, unless otherwise specified, it is assumed that the bootstrap gain is 1 which is an ideal value. Incidentally, where the storage capacitor 120 is interposed between the gate and the source of the drive transistor 121, the rising ratio of the gate potential Vg to the rise of the source potential Vs is hereinafter referred to as bootstrap gain or bootstrap operation capacity Gbst. Here, the bootstrap gain Gbst particularly relates to a capacitance value Cs of the storage capacitor 120, a capacitance value Cgs of a parasitic capacitor C121gs formed between the gate and the source of the drive transistor 121, a capacitance value Cgd of a parasitic capacitor C121gd formed between the gate and the drain of the drive transistor 121, and a capacitance value Cws of a parasitic capacitor C125gs formed between the gate and the source of the sampling transistor 125. If this is represented by an expression, then the bootstrap gain Gbst is represented by Gbst=(Cs+Cgs)/(Cs+Cgs+Cgd+Cws).

In FIG. 6A, a potential variation of the writing scanning line 104WS, a potential variation of the power supply line 105DSL and a potential variation of the image signal line 106HS are illustrated on a common time axis. Further, in parallel to the potential variations, also variations of the gate potential Vg and the source potential Vs of the drive transistor 121 for one row, in FIG. 6A, for the first row, are illustrated.

Basically, for each one row of the writing scanning line 104WS or the power supply line 105DSL, similar driving is carried out but in a state delayed by one horizontal scanning period. Timings and signals in FIG. 6A are indicated by those same as the timings and signals for the first row independently of the processing object row. Then, where distinction is required in the description, the processing object row represented by a reference character with "_" is annexed for identification to the timing or the signal.

Further, in the driving timings in the embodiment, a period which is an ineffective period of the image signal Vsig within which the image signal Vsig has the offset potential Vofs is the front half of one horizontal period, and another period which is an effective period of the image signal Vsig within which the image signal Vsig has the signal potential Vofs+Vin is the latter half of one horizontal period. Further, for each one horizontal period which is composed of the effective period and the ineffective period of the image signal Vsig, a threshold value correction operation is repeated three times. Changeover timings t13V and t15V between the effective period and the ineffective period of the image signal Vsig and changeover timings t13W and t15W between active and inactive states of the writing driving pulse WS are distinguished from each other by annexing, to each timing, a reference character without "_" representing the cycle time number.

While, in the embodiment, a threshold value correction operation is repeated three times within a process cycle of one horizontal period, the repetitive operations are not necessarily required, but a threshold value correction operation may be executed only once within a process cycle of one horizontal period.

One horizontal period is determined as a process cycle of a threshold value correction operation from the following reason. In particular, for each row, before the sampling transistor 125 samples information of the signal amplitude Vin into the storage capacitor 120, the potential of the power supply line 105DSL is set to the second potential Vss prior to the threshold value correction operation and the gate of the drive transistor is set to the offset potential Vofs, and after an initialization operation of setting the source potential to the second potential Vss is carried out, a threshold value correction operation of rendering the sampling transistor 125 conducting in a state wherein the potential of the power supply line 105DSL is the first potential Vcc within a time zone wherein the image signal line 106HS has the offset potential Vofs so that a voltage corresponding to the threshold voltage Vth of the drive transistor 121 is stored into the storage capacitor 120.

The threshold correction period inevitably becomes shorter than one horizontal period. Accordingly, within the shortened threshold value correction operation period for one time, a case wherein an accurate voltage corresponding to the threshold voltage Vth cannot be sufficiently stored into the storage capacitor 120 may occur from a relationship in magnitude of the capacitance value Cs of the storage capacitor 120 and the second potential Vss or from some other factor. In the embodiment, the threshold value correction operation is executed by a plural number of times in order to cope with such a case as just described. In particular, a threshold value correction operation is executed by a plural number of times within a plurality of horizontal periods preceding to sampling of information of the signal amplitude Vin, that is, signal writing into the storage capacitor 120, so that a voltage corresponding to the threshold voltage Vth of the drive transistor 121 is stored into the storage capacitor 120 with certainty.

With regard to a certain row (here, the first row), within a light emitting period B of a preceding field prior to timing t11, the writing driving pulse WS is in an inactive-L state and the sampling transistor 125 is in a non-conducting state while the power supply driving pulse DSL has the first potential Vcc which is the high potential power supply voltage side.

Figure 6B:
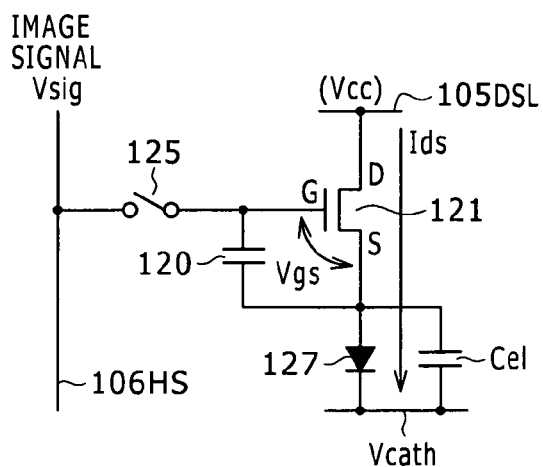
FIG. 6B is a circuit diagram showing an equivalent circuit of the pixel circuit shown in FIG. 5 within a light emitting period illustrated in the timing chart of FIG. 6A and illustrating operation of the equivalent circuit.
Figure 7A:
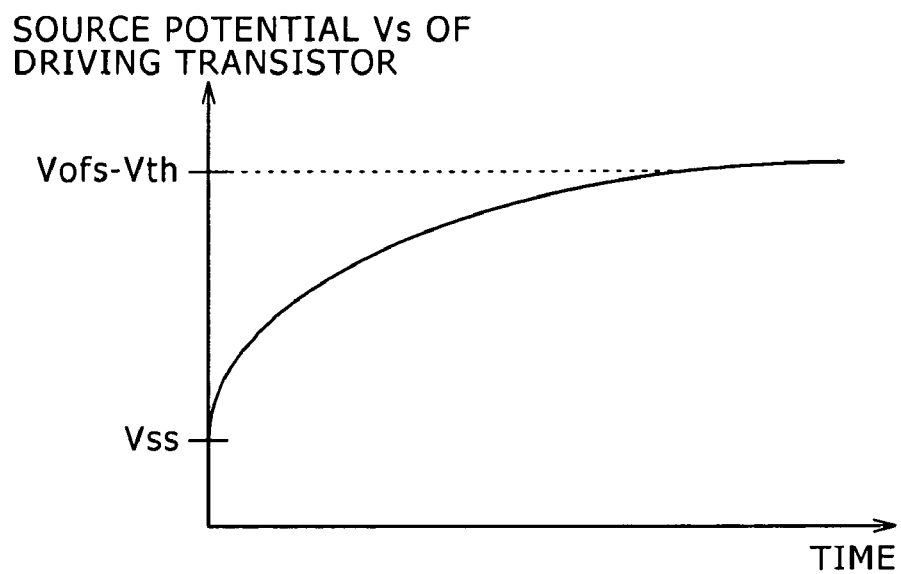
FIG. 7A is a graph illustrating a variation of the source potential of the driving transistor upon threshold value correction operation.
Figure 7B:
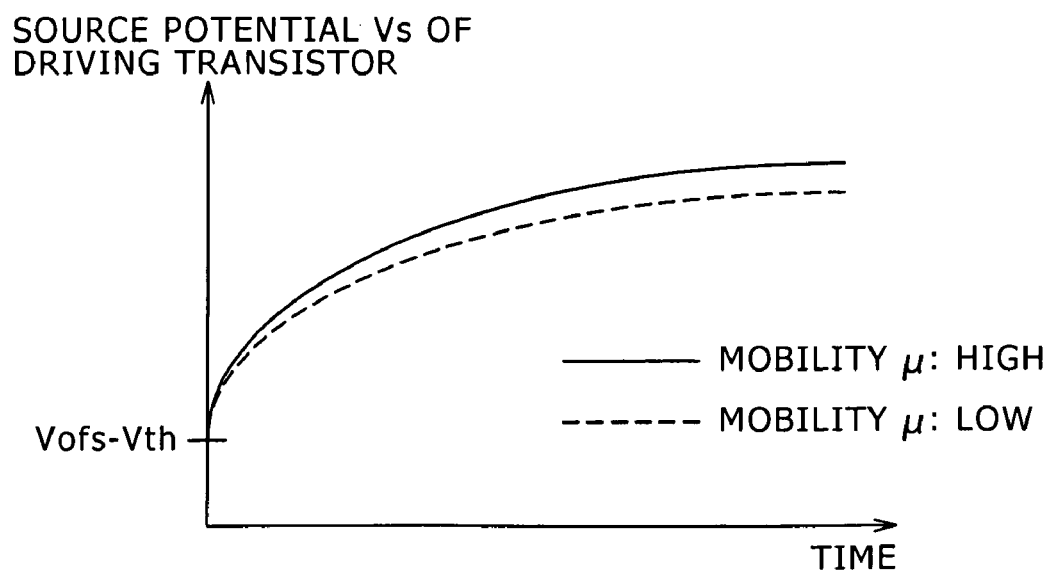
FIG. 7B is a graph illustrating a variation of the source potential of the driving transistor upon mobility correction operation.

Accordingly, as seen in FIG. 6B, driving current Ids is supplied from the drive transistor 121 to the organic EL element 127 in response to a voltage state, which is the gate-source voltage Vgs of the drive transistor 121, stored in the storage capacitor 120 as a result of operation in the preceding field irrespective of the potential of the image signal line 106HS. The driving current Ids flows into the cathode wiring line Vcath, preferably to the ground potential GND, common to all pixels. Consequently, the organic EL element 127 is in a light emitting state. At this time, since the drive transistor 121 is set so as to operate in its saturation region, the driving current Ids flowing to the organic EL element 127 assumes a value indicated by the expression (1) in response to the gate-source voltage Vgs of the drive transistor 121 stored in the storage capacitor 120.

Figure 6C:
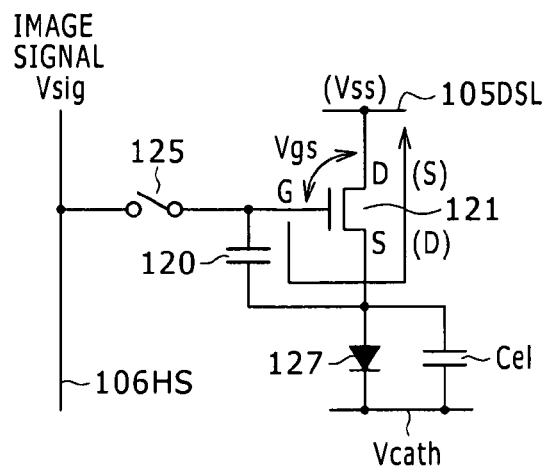
FIG. 6C is a circuit diagram showing an equivalent circuit of the pixel circuit shown in FIG. 5 within a discharging period illustrated in the timing chart of FIG. 6A and illustrating operation of the equivalent circuit.

Thereafter, a new field of line sequential scanning is entered, and the driving scanning section 105 first changes over the power supply driving pulse DSL_1 to be provided to the power supply line 105DSL_1 of the first row from the first potential Vcc of the high potential side to the second potential Vss of the low potential side while the writing driving pulse WS is in the inactive-L state (t11_1: refer to FIG. 6C). This timing t11_1 is within a period within which the image signal Vsig has the signal potential Vofs+Vin of an effective period. However, the changeover of the power supply driving pulse DSL_1 need not necessarily be carried out at this timing t11_1.

Then, the writing scanning section 104 changes over the writing driving pulse WS to the active H level while the potential of the power supply line 105DSL_1 remains the second potential Vss (t13W0). This timing t13W0 is set to a timing t13V0 at which the image signal Vsig within the immediately preceding horizontal period changes over to the offset potential Vofs after it is changed over from the offset potential Vofs in an ineffective period to the signal potential Vofs+Vin in an effective period or to a timing later a little from the timing t13V0. The timing t15W0 at which the writing driving pulse WS is thereafter changed over to the inactive L state is set to same as or a little earlier than the timing t15V0 at which the image signal Vsig changes over from the offset potential Vofs to the signal potential Vofs+Vin.

Preferably, the period t13W to t15W within which the writing driving pulse WS is set to the active H level is set within the time zone t13V to t15V within which the image signal Vsig has the offset potential Vofs in an ineffective period. This is because, if the writing driving pulse WS is set to the active H level when the power supply line 105DSL has the first potential Vcc and the image signal Vsig has the signal potential Vofs+Vin, then a sampling operation of information of the signal amplitude Vin into the storage capacitor 120, that is, a writing operation of the signal potential, is carried out, which gives rise to an obstacle to the threshold value correction operation.

Within a period referred to as discharge period C from timing t11_1 to timing 513W0, the potential of the power supply line 105DSL is discharged to the second potential Vss, and the source potential Vs of the light emission controlling transistor 122 changes to a potential proximate to the second potential Vss. Further, the storage capacitor 120 is connected between the gate terminal G and the source terminal S of the drive transistor 121, and the gate potential Vg varies in an interlocking relationship with the variation of the source potential Vs of the drive transistor 121 by an effect by the storage capacitor 120.

Figure 6D:
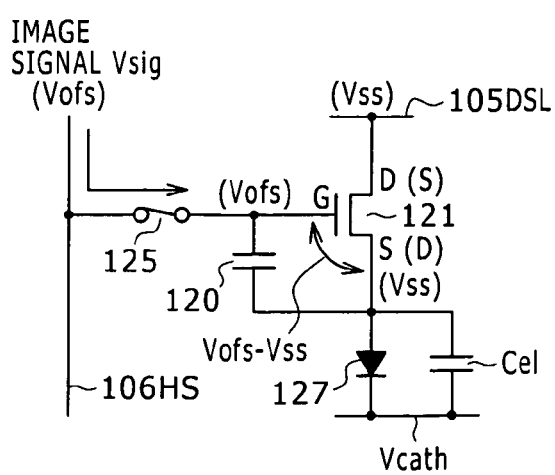
FIG. 6D is a circuit diagram showing an equivalent circuit of the pixel circuit shown in FIG. 5 within an initialization period illustrated in the timing chart of FIG. 6A and illustrating operation of the equivalent circuit.

If the writing driving pulse WS is changed over to the active H level while the power supply driving pulse DSL remains the second potential Vss of the low potential side (t13W0), then the sampling transistor 125 is rendered conducting as seen in FIG. 6D.

At this time, the image signal line 106HS has the offset potential Vofs. Accordingly, the gate potential Vg of the drive transistor 121 becomes the offset potential Vofs of the image signal line 106HS through the sampling transistor 125 rendered conducting. Simultaneously, as the drive transistor 121 is placed into an on state, the source potential Vs of the drive transistor 121 is fixed to the second potential Vss of the low potential side.

In particular, since the potential of the power supply line 105DSL is the second potential Vss which is sufficiently lower than the offset potential Vofs of the image signal line 106HS from the first potential Vcc of the high potential side, the source potential Vs of the drive transistor 121 is initialized or reset to the second potential Vss sufficiently lower than the offset potential Vofs of the image signal line 106HS. By initializing the gate potential Vg and the source potential Vs of the drive transistor 121 in this manner, preparations for a threshold value correction operation are completed. Then, the period t13W0 to t14_1 within which the power supply driving pulse DSL is set to the first potential Vcc of the high potential side becomes an initialization period D. It is to be noted that the discharge period C and the initialization period D are referred to collectively also as threshold value correction preparation period within which the gate potential Vg and the source potential Vs of the drive transistor 121 are initialized.

Where the wiring line capacitance of the power supply line 105DSL is high, the potential of the power supply line 105DSL may be changed over from the first potential Vcc to the second potential Vss at a comparatively early timing. The discharge period C and the initialization period D t11_1 to t14_1 are assured sufficiently so as to eliminate an influence of the wiring line capacitance and other pixel parasitic capacitance. Therefore, in the embodiment, the initialization process is carried out twice. In particular, after the writing driving pulse WS is changed over to the inactive L level (t15W0) while the power supply line 105DSL_1 remains in the second potential Vss state, the image signal Vsig is changed over to the signal potential Vofs+Vin (t15V0). Further, the image signal Vsig is changed over to the offset potential Vofs (t13V1), and then the writing driving pulse WS is changed over to the active H level (t13W1).

Within the discharge period C, when the second potential Vss is lower than the sum of the threshold voltage VthEL and the cathode potential Vcath of the organic EL element 127, that is, if "Vss<VthEL+Vcath" is satisfied, then the organic EL element 127 turns off to stop emission of light. Further, the source terminal and the drain terminal of the drive transistor 121 are reversed in fact such that the power supply line 105DSL becomes the source side of the drive transistor 121 and the anode terminal A of the organic EL element 127 is charged to the second potential Vss (refer to FIG. 6C).

Further, within the initialization period D, the gate-source voltage Vgs of the drive transistor 121 assumes the value of "Vofs−Vss" (refer to FIG. 6D). If this "Vofs−Vss" is not higher than the threshold voltage Vth of the drive transistor 121, then the threshold value correction operation cannot be carried out, and therefore, the offset potential Vofs, second potential Vss and threshold voltage Vth satisfy "Vofs−Vss>Vth."

Then, while the writing driving pulse WS is kept in the active H state, the power supply driving pulse DSL to be applied to the power supply line 105DSL is changed over to the first potential Vcc (t14_1). The driving scanning section 105 thereafter keeps the potential of the power supply line 105DSL to the first potential Vcc till processing for a next frame or field.

Figure 6E:
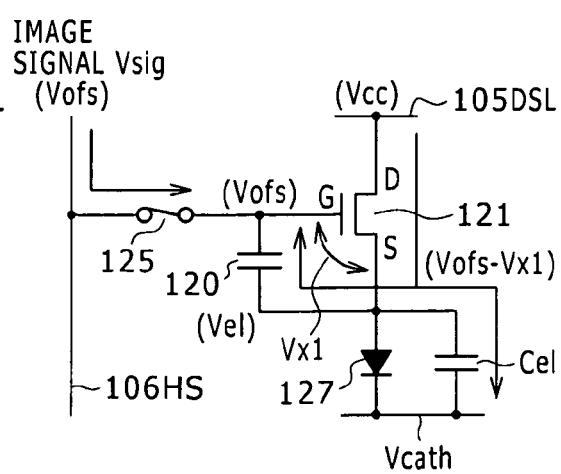
FIG. 6E is a circuit diagram showing an equivalent circuit of the pixel circuit shown in FIG. 5 within a first threshold value correction period illustrated in the timing chart of FIG. 6A and illustrating operation of the equivalent circuit.

After the power supply line 105DSL is changed over to the first potential Vcc (t14_1), the source terminal and the drain terminal of the drive transistor 121 are reversed again such that the power supply line 105DSL becomes the drain side of the drive transistor 121 (refer to FIG. 6E). Consequently, a first time threshold correction period hereinafter referred to as first threshold value correction period E wherein the driving current Ids flows into the storage capacitor 120 to compensate for or cancel the threshold voltage Vth of the drive transistor 121 is entered. This first threshold value correction period E continues to a timing t15W1 at which the writing driving pulse WS is changed over to the inactive L level.

Here, the driving scanning section 105 in the present embodiment sets the timing t14_1 at which the potential of the power supply line 105DSL is changed over from the second potential Vss of the low potential side to the first potential Vcc of the high potential side within the time zone t13V1 to t15V1 within which the image signal line 106HS has the offset potential Vofs in an ineffective period of the image signal Vsig, preferably within a time zone t13W1 to t15W1 within which the writing driving pulse WS is active.

Incidentally, within the first threshold value correction period E later than the timing t14_1, the potential of the power supply line 105DSL changes over from the second potential Vss of the low potential side to the first potential Vcc of the high potential side as seen in FIG. 6E, and the source potential Vs of the drive transistor 121 begins to rise.

In particular, the gate terminal G of the drive transistor 121 is kept at the offset potential Vofs of the image signal Vsig, and the driving current Ids tends to flow until the source potential Vs of the source terminal S of the drive transistor 121 rises to cut off the drive transistor 121. When the drive transistor 121 is cut off, the source potential Vs of the drive transistor 121 becomes "Vofs−Vth."

In particular, since the equivalent circuit of the organic EL element 127 is represented by a parallel circuit of a diode and a parasitic capacitance Cel, as far as "Vel≦Vcath+VthEL" continues, that is, as far as the leak current of the organic EL element 127 is considerably lower than the current flowing through the drive transistor 121, the driving current Ids of the drive transistor 121 is used to charge the storage capacitor 120 and the parasitic capacitance Cel.

As a result, if the driving current Ids flows through the drive transistor 121, then the voltage Vel of the anode terminal A of the organic EL element 127, that is, the potential of a node ND121, rises as time passes as seen in FIG. 7A. Then, when the potential difference between the potential of the node ND121, that is, the source potential Vs, and the voltage of a node ND122, that is, the gate potential Vg, becomes just equal to the threshold voltage Vth, the threshold value correction period is ended. In other words, after a fixed period of time elapses, the gate-source voltage Vgs of the drive transistor 121 assumes the value of the threshold voltage Vth.

Until after the gate-source voltage Vgs becomes equal to the threshold voltage Vth, since the gate-source voltage Vgs of the drive transistor 121 is higher than the threshold voltage Vth, driving current Ids flows as seen in FIG. 6E. At this time, since a reverse bias is applied to the organic EL element 127, the organic EL element 127 does not emit light.

Here, actually a voltage corresponding to the threshold voltage Vth is written into the storage capacitor 120 connected between the gate terminal G and the source terminal S of the drive transistor 121. However, the first threshold value correction period E ranges from the timing t13W1 at which the writing driving pulse WS is changed to the active H level, more particularly, from the time point t14 at which the power supply driving pulse DSL is subsequently returned to the first potential Vcc, to the timing t15W1 at which the writing driving pulse WS is returned to the inactive L level. If this period is not assured sufficiently, then the writing described above comes to an end before then.

In particular, the writing ends when the gate-source voltage Vgs becomes Vx1 higher than the threshold voltage Vth, that is, when the source potential Vs of the driving transistor 121 changes from the second potential Vss of the low potential side to "Vofs−Vx1." Therefore, at the point t15W1 of time at which the first threshold value correction period E is completed, the voltage Vx1 is written in the storage capacitor 120.

Figure 6F:
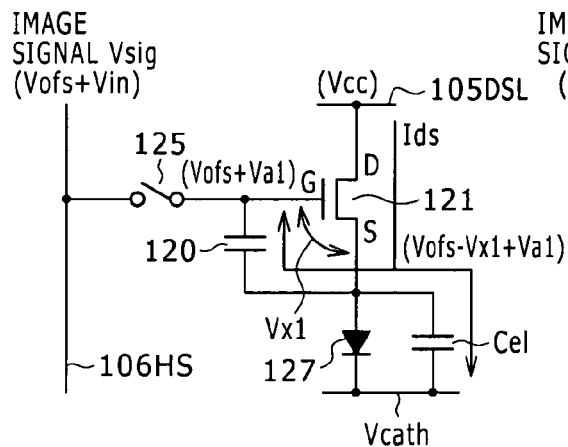
FIG. 6F is a circuit diagram showing an equivalent circuit of the pixel circuit shown in FIG. 5 within a different row writing period illustrated in the timing chart of FIG. 6A and illustrating operation of the equivalent circuit.

Then, within the latter half of the one horizontal period, the driving scanning section 105 changes over the writing driving pulse WS to the inactive L level (t15W1), and further, the horizontal driving section 106 changes over the potential of the image signal line 106HS from the offset potential Vofs to the signal potential Vofs+Vin (t15V1). Consequently, as seen in FIG. 6F, the potential of the image signal line 106HS changes to the signal potential Vofs+Vkin while the potential of the writing scanning line 104WS, that is, the writing driving pulse WS, changes to the low level.

At this time, the sampling transistor 125 is in a non-conducting or off state, and drain current corresponding to the voltage Vx1 stored in the storage capacitor 120 before then flows to the organic EL element 127. Consequently, the source potential Vs rises a little. Where the rise amount is represented by Va1, the source potential Vs is given by "Vofs−Vx1+Va1." Further, the storage capacitor 120 is connected between the gate terminal G and the source terminal S of the drive transistor 121, and the gate potential Vg varies in an interlocking relationship with a fluctuation of the source potential Vs of the drive transistor 121 by an effect by the storage capacitor 120 until the gate potential Vg becomes "Vofs+Va1."

The period F after the horizontal driving section 106 changes over the potential of the image signal line 106HS from the signal potential Vofs+Vth to the offset potential Vofs (t13V2) after the first threshold value correction period E until the driving scanning section 105 changes over the writing driving pulse WS to the active H level (t13W2) becomes a sampling period of information of the signal amplitude Vin for pixels of another row. The period F is hereinafter referred to as different row writing period. Within the different row writing period F, it is necessary to place the sampling transistors 125 of the processing object row into an off state. The processing within the one horizontal period of 1 H is completed therewith.

When the front half of a next one horizontal period of 1 H is entered, the horizontal driving section 106 changes over the potential of the image signal line 106HS from the signal potential Vofs+Vin to the offset potential Vofs (t13V2), and the driving scanning section 105 changes over the writing driving pulse WS to the active H level (t13W2). Consequently, drain current flows into the storage capacitor 120 to enter a second time threshold correction period within which the threshold voltage Vth of the drive transistor 121 is to be compensated for or canceled. The second time threshold value correction period is hereinafter referred to as second threshold value correction period G. This second threshold value correction period G continues till the timing (t15W2) at which the writing driving pulse WS is placed into the active L level.

Figure 6G:
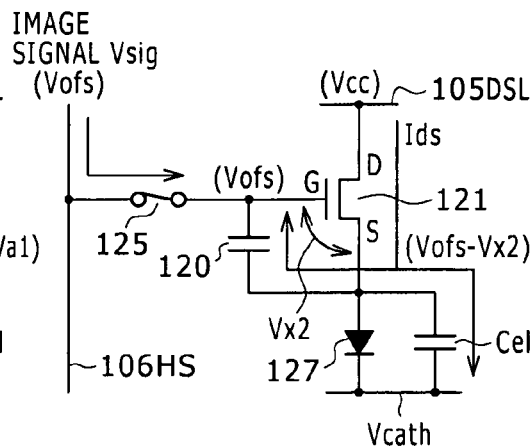
FIG. 6G is a circuit diagram showing an equivalent circuit of the pixel circuit shown in FIG. 5 within a second threshold value correction period illustrated in the timing chart of FIG. 6A and illustrating operation of the equivalent circuit.
Figure 6H:
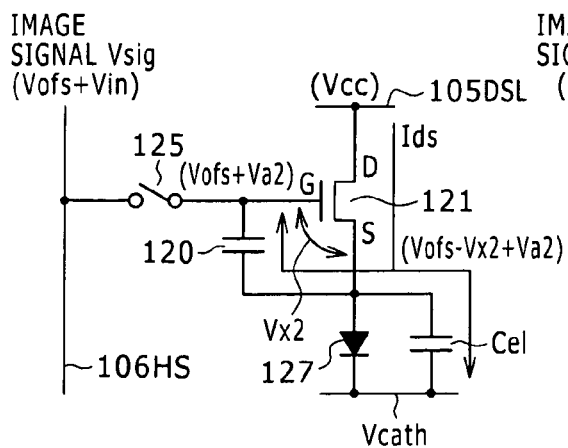
FIG. 6H is a circuit diagram showing an equivalent circuit of the pixel circuit shown in FIG. 5 within another different row writing period illustrated in the timing chart of FIG. 6A and illustrating operation of the equivalent circuit.

Within the second threshold value correction period G, similar operation to that within the first threshold value correction period E is carried out. In particular, as seen in FIG. 6G, the gate terminal G of the drive transistor 121 is kept at the offset potential Vofs of the image signal Vsig, and the gate potential changes over from "Vg=offset potential Vofs+Va1" at this point of time to the offset potential Vofs. Information of the potential fluctuation amount Va1 of the gate terminal G of the drive transistor 121 at this time is inputted to the source terminal S of the drive transistor 121 through the storage capacitor 120 and the parasitic capacitance Cgs between the gate and the source of the drive transistor 121. The input amount to the source terminal S at this time is represented by gVa1, and since the source potential Vs drops by gVa1 from "Vofs−Vx1+Va1" at this point of time, it becomes "Vofs−Vx1+(1−g)Va1."

Here, if the gate-source voltage Vx1−(1−g)Va1 of the drive transistor 121 is equal to or higher than the threshold voltage Vth of the drive transistor 121, then drain current tends to flow until the source potential Vs of the source terminal S of the drive transistor 121 thereafter rises to cut off the drive transistor 121. When the drive transistor 121 is cut off, the source potential Vs of the drive transistor 121 is "Vofs−Vth."

However, the second threshold value correction period G ranges from the timing t13W2 at which the writing driving pulse WS is placed into the active H level to the timing t15W2 at which the writing driving pulse WS returned to the inactive L level, and if this period is not assured sufficiently, the second threshold value correction period G ends before the timing t13W2. This is same as in the first threshold value correction period E, and when the gate-source voltage Vgs becomes a voltage Vx2 which is lower than the voltage Vx1 but higher than the threshold voltage Vth, that is, when the source potential Vs of the driving transistor 121 changes over from "Vofs−Vx1" to "Vofs−Vx2," the second threshold value correction period G ends. Therefore, at the time point t15W2 at which the second threshold value correction period G comes to an end, the voltage Vx2 is written into the storage capacitor 120.

Thereafter, in order to carry out sampling of the signal potential to the pixels in a different row within the rear half of the one horizontal period, the driving scanning section 105 changes over the writing driving pulse WS to the inactive L level (t15W2). Further, the horizontal driving section 106 changes over the potential of the image signal line 106HS from the offset potential Vofs to the signal potential Vofs+Vin (t15V2). Consequently, the potential of the image signal line 106HS changes to the signal potential Vofs+Vin while the potential of the writing scanning line 104WS, that is, the writing driving pulse WS, changes to the low level as seen from FIG. 6H.

At this time, the sampling transistor 125 is in a non-conducting or off state, and drain current corresponding to the voltage Vx2 stored in the storage capacitor 120 flows through the organic EL element 127. Consequently, the source potential Vs rises a little. Where this rise amount is represented by Va2, the source potential Vs becomes "Vofs−Vx2+Va2." Further, the storage capacitor 120 is connected between the gate terminal G and the source terminal S of the drive transistor 121, and the gate potential Vg varies in an interlocking relationship with the variation of the source potential Vs of the drive transistor 121 by an effect by the storage capacitor 120. Consequently, the gate potential Vg becomes "Vofs+Va2."

The period H after the horizontal driving section 106 changes over the potential of the image signal line 106HS from the signal potential Vofs+Vth to the offset potential Vofs (t13V3) after the second threshold value correction period G until the driving scanning section 105 changes over the writing driving pulse WS to the active H level (t13W3) becomes a sampling period of information of the signal amplitude Vin for pixels of a different row. The period H is hereinafter referred to as different row writing period. Within the different row writing period H, it is necessary to place the sampling transistors 125 of the processing object row into an off state. The processing within the second time one horizontal period is completed therewith.

When the front half of a next one horizontal period of 1 H is entered, the horizontal driving section 106 changes over the potential of the image signal line 106HS from the signal potential Vofs+Vin to the offset potential Vofs (t13V3), and the driving scanning section 105 changes over the writing driving pulse WS to the active H level (t13W3). Consequently, drain current flows into the storage capacitor 120 to enter a third time threshold correction period within which the threshold voltage Vth of the drive transistor 121 is to be compensated for or canceled. The third time threshold value correction period is hereinafter referred to as third threshold value correction period I. This third threshold value correction period I continues till the timing t15W3 at which the writing driving pulse WS is placed into the inactive L level.

Figure 6I:
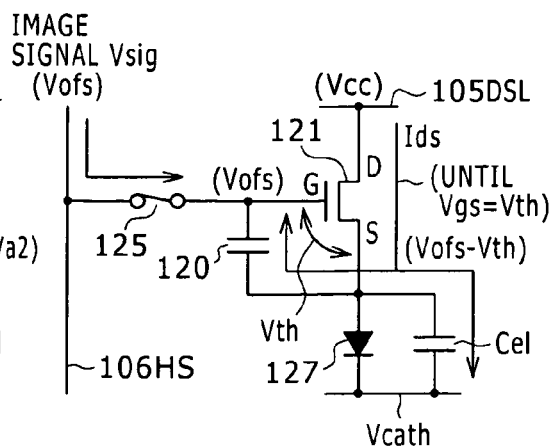
FIG. 6I is a circuit diagram showing an equivalent circuit of the pixel circuit shown in FIG. 5 within a third threshold value correction period illustrated in the timing chart of FIG. 6A and illustrating operation of the equivalent circuit.

Within the third threshold value correction period I, similar operation to that within the first threshold value correction period E or the second threshold value correction period G is carried out. In particular, as seen in FIG. 6I, the gate terminal G of the drive transistor 121 is kept at the offset potential Vofs of the image signal Vsig, and the gate potential changes over from "Vg=offset potential Vofs+Va2" at this point of time to the offset potential Vofs. Information of the potential fluctuation amount Va2 of the gate terminal G of the drive transistor 121 at this time is inputted to the source terminal S of the drive transistor 121 through the storage capacitor 120 and the parasitic capacitor Cgs between the gate and the source of the drive transistor 121. The input amount to the source terminal S at this time is represented by gVa2, and since the source potential Vs drops by gVa2 from "Vofs−Vx2+Va2" at this point of time, it becomes "Vofs−Vx2+(1−g)Va2."

Thereafter, the drain current tends to flow until the source potential Vs of the source terminal S of the drive transistor 121 rises and the drive transistor 121 is cut off. When the gate-source voltage Vgs becomes just equal to the threshold voltage Vth, the drain current is cut off. When the drain current is cut off, the source potential Vs of the drive transistor 121 becomes "Vofs−Vth."

In particular, the gate-source voltage Vgs of the drive transistor 121 assumes the value of the threshold voltage Vth as a result of processing over a plural number of times (in this example, three times) of threshold value correction periods. Here, a voltage corresponding to the threshold voltage Vth is written into the storage capacitor 120 connected between the gate terminal G and the source terminal S of the drive transistor 121.

It is to be noted that, within the three times of threshold value correction periods E, G and I, in order that drain current flows only to the storage capacitor 120 side or the parasitic capacitance Cel side of the organic EL element 127 but does not flow to the cathode potential Vcath side, the cathode potential Vcath for the common ground wiring line cath is set so that the organic EL element 127 is cut off.

Thereafter, the horizontal driving section 106 actually supplies the signal potential Vofs+Vin to the image signal line 106HS so that the period within which the writing driving pulse WS is placed in the active H state is set as a writing period or sampling period of information of the signal amplitude Vin into the storage capacitor 120. This information of the signal amplitude Vin is stored in such a manner as to be cumulatively added to the threshold voltage Vth of the drive transistor 121. In particular, where the write gain Ginput is taken into consideration, the gate terminal G described above takes part.

As a result, since the variation of the threshold voltage Vth of the drive transistor 121 is always canceled, it is considered that threshold value correction is carried out. The gate-source voltage Vgs stored in the storage capacitor 120 through this threshold value correction is Vin+Vth. If the write gain Ginput is considered, the gate-source voltage Vgs is (1−g)Vin+Vth=Vinput·Vin+Vth. Simultaneously, mobility correction is carried out within this sampling period. In particular, at the driving timing, the sampling period serves also as the mobility correction period. The signal amplitude Vin is a voltage corresponding to a gradation.

Figure 6J:
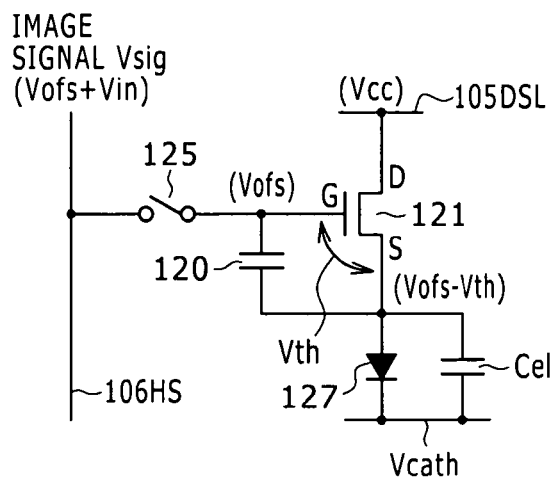
FIG. 6J is a circuit diagram showing an equivalent circuit of the pixel circuit shown in FIG. 5 within a writing and mobility correction preparation period illustrated in the timing chart of FIG. 6A and illustrating operation of the equivalent circuit.

In particular, the writing driving pulse WS is changed over to the inactive L level first (t15W3), and then the horizontal driving section 106 changes over the potential of the image signal line 106HS from the offset potential Vofs to the signal potential Vofs+Vin (t15V3) to complete the last threshold value correction period, in the present example, the third time threshold value correction period. Consequently, the sampling transistor 125 is placed into a non-conducting or off state as seen in FIG. 6J, and preparations for a next sampling operation and mobility correction operation are completed. The period till the timing t16_1 at which the writing driving pulse WS is placed into the active H level subsequently is hereinafter referred to as writing and mobility correction preparation period J.

Then, while the potential of the image signal line 106HS is kept at the signal potential Vofs+Vin, the writing scanning section 104 changes over the writing driving pulse WS to the active H level (t16_1). Then, the horizontal driving section 106 changes over the potential of the image signal line 106HS to the inactive L level (t17_1) at a suitable timing within a period till the timing t18_1 at which the potential of the image signal line 106HS is changed over from the signal potential Vofs+Vin to the offset potential Vofs, that is, at a suitable timing within a time zone within which the image signal line 106HS has the signal potential Vofs+Vin. The period t16_1 to t17_1 within which the writing driving pulse WS is in the active H state is hereinafter referred to as sampling period and mobility correction period K.

Figure 6K:
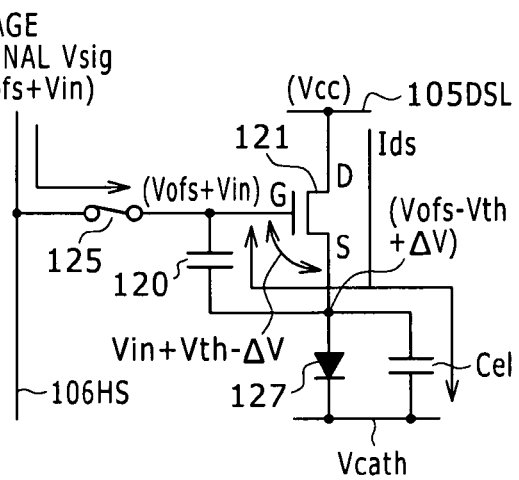
FIG. 6K is a circuit diagram showing an equivalent circuit of the pixel circuit shown in FIG. 5 within a sampling period and mobility correction period illustrated in the timing chart of FIG. 6A and illustrating operation of the equivalent circuit.

Consequently, the sampling transistor 125 is placed into a conducting or on state and the gate potential Vg of the drive transistor 121 becomes the signal potential Vofs+Vin as seen in FIG. 6K. Accordingly, within the sampling period and mobility correction period K, driving current Ids flows through the drive transistor 121 in a state wherein the potential of the gate terminal G of the drive transistor 121 is fixed to the signal potential Vofs+Vin.

Since the sampling transistor 125 is on, although the gate potential Vg of the drive transistor 121 becomes the signal potential Vofs+Vin, since current flows through the drive transistor 121 from the power supply line 105DSL, the gate-source voltage Vgs rises as time passes.

Although description is hereinafter given, when the threshold voltage of the organic EL element 127 is represented by VthEL, where the write gain is taken into consideration, if associated voltages are set so as to satisfy "Vofs−Vth+gVin+

"ΔV<VthEL+Vcath," then the organic EL element 127 does not emit light because it is placed in a reversely biased state and is in a cutoff state or high impedance state. Thus, the organic EL element 127 exhibits not a diode characteristic but a simple capacitor characteristic. If the source potential Vs at this time does not exceed the sum of the threshold voltage VthEL and the cathode potential Vcath of the organic EL element 127, then the drain current or driving current Ids flowing through the drive transistor 121 is written into the capacitor "C=Cs+Cel" which is the sum of the capacitance value Cs of the storage capacitor 120 and the parasitic capacitance Cel (equivalent capacitor) of the organic EL element 127. Consequently, the source potential Vs of the drive transistor 121 rises. At this time, since the threshold value correction operation of the drive transistor 121 has been completed at this time, the driving current Ids supplied from the drive transistor 121 reflects the mobility μ.

In the timing chart of FIG. 6A, this rise amount is represented by ΔV. When the write gain is taken into consideration, the rise amount, that is, the negative feedback amount ΔV which is a mobility correction parameter, is subtracted from the gate-source voltage "Vgs=(1−g)Vin+Vth" stored in the storage capacitor 120 by threshold value correction and becomes "Vgs=(1−g)Vin+Vth−ΔV." At this time, the source potential Vs of the drive transistor 121 becomes the value "(1−g)Vofs+g(Vofs+Vin)−Vth+ΔV"="Vofs+gVin−Vth+ΔV" obtained by subtracting the voltage "Vgs=(1−g)Vin+Vth−ΔV" stored in the storage capacitor from the gate potential Vg(=Vofs+Vin).

In this manner, in the driving timing scheme of the embodiment, adjustment of the negative feedback amount or mobility correction parameter ΔV for correcting the mobility μ of the signal amplitude Vin of the image signal Vsig is carried out within the sampling period and mobility correction period K (t16 to t17). The negative feedback amount ΔV is ΔV=Ids·t/ Cel+Cgs+Cs).

The writing scanning section 104 can adjust the time width of the sampling period and mobility correction period K and can thereby optimize the negative feedback amount of the driving current Ids to the storage capacitor 120. Here, "to optimize the negative feedback amount" signifies to make it possible to carry out mobility correction appropriately at any level within a range from the black level to the white level of the image signal potential.

Since the negative feedback amount ΔV is ΔV=Ids·t/(Cel+Cgs+Cs), the negative feedback amount ΔV of the gate-source voltage Vgs relies upon the takeout period of the driving current Ids, that is, upon the sampling period and mobility correction period K, and as this period increases, the negative feedback amount increases. Thereupon, the mobility correction period t need not necessarily be fixed, but it is sometimes preferable to adjust the mobility correction period t in response to the driving current Ids conversely. For example, where the driving current Ids is high, the mobility correction period t may be set to a comparative short period, but on the contrary where the driving current Ids is low, the mobility correction period t may be set to a comparatively long period.

Further, since the negative feedback amount ΔV is ΔV=Ids·t/(Cel+Cgs+Cs), the negative feedback amount ΔV increases as the driving current Ids which is drain-source current of the drive transistor 121 increases. On the contrary, as the driving current Ids of the drive transistor 121 decreases, the negative feedback amount ΔV decreases. In this manner, the negative feedback amount ΔV depends upon the driving current Ids.

Further, as the signal amplitude Vin increases, the driving current Ids increases and also the absolute value of the negative feedback amount ΔV increases. Accordingly, mobility correction in accordance with the emission light luminance level can be implemented. Thereupon, the sampling period and mobility correction period K need not necessarily be fixed, but it is sometimes preferable to adjust the sampling period and mobility correction period K in accordance with the driving current Ids conversely. For example, where the driving current Ids is high, the mobility correction period t may be set to a comparatively short period, but on the contrary as the driving current Ids decreases, the sampling period and mobility correction period K may be set to a comparatively short period.

For example, a slope is provided to a rising edge of the image signal potential, that is, the potential of the image signal line 106HS or to the transition characteristic of the writing driving pulse WS of the writing scanning line 104WS so that the mobility correction period may automatically follow up the image line signal potential to achieve optimization of the mobility correction period. In particular, the correction period is automatically adjusted such that, when the potential of the image signal line 106HS is high, that is, when the driving current Ids is high, the correction time becomes short, but when the potential of the image signal line 106HS is low, that is, when the driving current Ids is low, the correction time becomes long. According to such adjustment, since an appropriate correction period can be set automatically following up the image signal potential or image signal Vsig, optimum mobility correction can be achieved without depending upon the luminance or picture of the image.

Further, the negative feedback amount ΔV is ΔV=Ids·t/ (Cel+Cgs+Cs), and even if the driving current Ids is dispersed by the dispersion of the mobility μ for each pixel circuit P, since the negative feedback amount ΔV differs among different pixel circuits P, the dispersion of the negative feedback amount ΔV for each pixel circuit P can be compensated for. In other words, if it is assumed that the signal amplitude Vin is fixed, then as the mobility μ of the drive transistor 121 increases, the driving current Ids increase and the source potential Vs rises more quickly and besides the absolute value of the negative feedback amount ΔV increases as shown in FIG. 7B. As the mobility μ decreases, the driving current Ids decreases and the source potential Vs rises more slowly and besides the absolute value of the negative feedback amount ΔV decreases. In other words, since the negative feedback amount ΔV as the mobility μ increases, the gate-source voltage Vgs of the drive transistor 121 decreases reflecting the mobility μ. Then, after a fixed interval of time elapses, the gate-source voltage Vgs of the drive transistor 121 fully becomes a value for correcting the mobility μ, and therefore, a dispersion of the mobility μ for each pixel circuit P can be removed.

In this manner, according to the driving timings of the embodiment, sampling of information of the signal amplitude Vin and adjustment of the negative feedback amount ΔV for correcting the dispersion of the mobility μ are carried out simultaneously within the sampling period and mobility correction period K. Naturally, the negative feedback amount ΔV can be optimized by adjusting the time width of the sampling period and mobility correction period K.

Figure 6L:
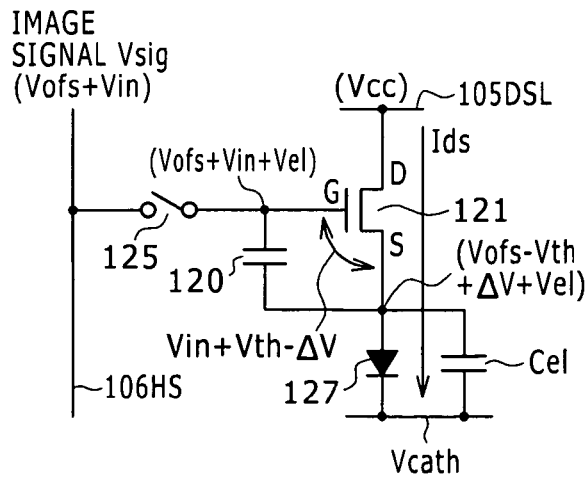
FIG. 6L is a circuit diagram showing an equivalent circuit of the pixel circuit shown in FIG. 5 within another light emitting period illustrated in the timing chart of FIG. 6A and illustrating operation of the equivalent circuit.

Thereafter, the writing scanning section 104 changes over the writing driving pulse WS to the inactive L level in a state wherein the image signal line 106HS has the signal potential Vofs+Vin (t17_1). Consequently, the sampling transistor 125 is placed into a non-conducting or off state as seen in FIG. 6L and a light emitting period L is entered. At a suitable later point of time, the horizontal driving section 106 stops supply of the signal potential Vofs+Vin to the image signal line 106HS and restores the offset potential Vofs (t18_1). Thereafter, the threshold value correction preparation operation, threshold value correction operation, mobility correction operation and light emitting operation are repeated for a next frame or field.

As a result, the gate terminal G of the drive transistor 121 is disconnected from the image signal line 106HS. Since the application of the signal potential Vofs+Vin to the gate terminal G of the drive transistor 121 is canceled, the gate potential Vg of the drive transistor 121 is permitted to rise.

At this time, the driving current Ids flowing through the drive transistor 121 flows to the organic EL element 127, and the anode potential of the organic EL element 127 rises in response to the driving current Ids. The rise amount is represented by Vel. Soon, as the source potential Vs rises, the reversely biased state of the organic EL element 127 is canceled, the organic EL element 127 actually starts emission of light in response to the driving current Ids flowing thereto. The rise amount Vel of the anode potential of the organic EL element 127 at this time is nothing but a rise of the source potential Vs of the drive transistor 121, and the source potential Vs of the drive transistor 121 becomes "(1−g)Vofs+g(Vofs+Vin)−Vth+ΔV+Vel"="Vofs+gVin−Vth+ΔV+Vel."

The relationship between the driving current Ids and the gate-source voltage Vgs can be represented like an expression (2-1) by substituting "Vin−ΔV+Vth" into Vgs of the expression (1) given hereinabove which represents the transistor characteristic. When the write gain is taken into consideration, the relationship can be represented like an expression (2-2) by substituting "(1−g)Vin−ΔV+Vth" into Vgs of the expression (1). In the expressions (2-1) and (2-2) (hereinafter referred to collectively as expressions (2)), $k=(1/2)(W/L)Cox$.

$$Ids = k\mu(Vgs-Vth)^2 = k\mu(Vin-\Delta V)^2 \ldots (2\text{-}1)$$

$$Ids = k\mu(Vgs-Vth)^2 = k\mu((1-g)Vin-\Delta V)^2 \ldots (2\text{-}2)\} \quad (2)$$

From the expressions (2), it can be recognized that the term of the threshold voltage Vth is canceled and the driving current Ids supplied to the organic EL element 127 does not rely upon the threshold voltage Vth of the drive transistor 121. The driving current Ids basically depends upon the signal amplitude Vin. In other words, the organic EL element 127 emits light with luminance provided by the signal amplitude Vin.

Thereupon, the information stored in the storage capacitor 120 is in a state corrected with the feedback amount ΔV. This correction amount ΔV acts to cancel the effect of the mobility μ just positioned at the coefficient part of the expression (2). Accordingly, the driving current Ids substantially relies only upon the signal amplitude Vin but does not rely upon the threshold voltage Vth. Therefore, even if the threshold voltage Vth fluctuates in the fabrication process, the driving current Ids between the drain and the source does not fluctuate, and also the emission light luminance of the organic EL element 127 does not fluctuate.

Further, the storage capacitor 120 is connected between the gate terminal G and the source terminal S of the drive transistor 121, and by an effect by the storage capacitor 120, a bootstrap operation is carried out at the beginning of the light emitting period. Consequently, the gate potential Vg and the source potential Vs of the drive transistor 121 rise while the gate-source voltage Vgs of the drive transistor 121 is kept fixed. As the source potential Vs of the drive transistor 121 becomes "Vofs+gVin−Vth+ΔV+Vel", the gate potential Vg becomes "Vofs+Vin+Vel."

At this time, since the gate-source voltage Vgs of the drive transistor 121 is fixed, the drive transistor 121 supplies fixed current, that is, fixed driving current Ids, to the organic EL element 127. As a result, the potential Vel of the anode terminal A of the organic EL element 127, that is, the potential of the drive transistor 121, rises to a voltage with which current of the driving current Ids in the saturation state can flow through the organic EL element 127.

Here, if the light emitting period becomes long, then the I-V characteristic of the organic EL element 127 changes. Therefore, as time passes, also the potential of the drive transistor 121 varies. However, even if the anode voltage of the organic EL element 127 fluctuates by aged deterioration, the gate-source voltage Vgs stored in the storage capacitor 120 is normally kept fixed.

Since the drive transistor 121 operates as a constant current source, even if the I-V characteristic of the organic EL element 127 suffers from aged deterioration and the source potential Vs of the drive transistor 121 varies, since the gate-source voltage Vgs of the drive transistor 121 is kept fixed (≈Vin−ΔV+Vth or ≈(1−g)Vin−ΔV+Vth) by the storage capacitor 120, the current flowing through the organic EL element 127 does not vary. Accordingly, also the emission light luminance of the organic EL element 127 is kept fixed.

An operation for keeping the gate-source voltage of the drive transistor 121 fixed to keep the luminance fixed irrespective of the characteristic fluctuation of the organic EL element 127, that is, an operation by an effect of the storage capacitor 120, is hereinafter referred to as bootstrap operation. By this bootstrap operation, image display which does not suffer from luminance deterioration even if the I-V characteristic of the organic EL element 127 fluctuation as time passes can be achieved.

In particular, in the pixel circuit P of the embodiment and at the driving timings to drive the pixel circuit P in the embodiment, a bootstrap circuit which is an example of a driving signal fixing circuit which compensates for a variation of the current-voltage characteristic of the organic EL element 127 which is an example of an electro-optical element to keep the driving current fixed is formed and the bootstrap operation functions. Therefore, even if the I-V characteristic of the organic EL element 127 deteriorates, since the driving current Ids normally continues to flow, the organic EL element 127 continues to emit light with luminance corresponding to the image signal Vsig, and the luminance does not vary.

Further, in the pixel circuit P of the embodiment and at the driving timings to drive the pixel circuit P in the embodiment, a threshold value correction circuit which is an example of a driving signal fixing circuit which corrects the threshold voltage Vth of the drive transistor 121 to keep the driving current fixed is configured and the threshold value correction operation functions. Thus, the fixed driving current Ids with which the gate-source voltage Vgs which reflects the threshold voltage Vth of the drive transistor 121 is not influenced by the dispersion of the threshold voltage Vth can be supplied.

Particularly according to the driving timings in the embodiment, the processing cycle of one time threshold value correction operation is set to one horizontal period and the threshold value correction operation is repeated over a plural number of times and the threshold voltage Vth is stored into the storage capacitor 120 with certainty. Therefore, the difference of the threshold voltage Vth between pixels is removed with certainty, and luminance unevenness arising from the dispersion of the threshold voltage Vth can be suppressed irrespective of the gradation.

In contrast, where the correction of the threshold voltage Vth is insufficient such that the number of times of threshold value correction operation is reduced to once, that is, where the threshold voltage Vth is not stored in the storage capacitor 120, a difference in luminance or in the driving current Ids appears between different pixel circuits P in a low gradation region. Therefore, where the correction of the threshold voltage is insufficient, unevenness of the luminance appears at low gradations, resulting in deterioration of the picture quality.

In addition, according to the driving timings of the embodiment, a mobility correction circuit which is an example of a driving signal fixing circuit which corrects the mobility μ of the drive transistor 121 in an interlocking relationship with the writing operation of information of the signal amplitude Vin into the storage capacitor 120 by the sampling transistor 125 to keep the driving current fixed is configured and the mobility correction operation functions. The gate-source voltage Vgs reflects the mobility μ of the drive transistor 121 so that the fixed current Ids which is not influenced by the dispersion of the mobility μ can be supplied.

In short, with the pixel circuit P of the embodiment, a threshold value correction circuit or a mobility correction circuit is formed automatically by devising the driving timings. Thus, the pixel circuit P functions as a driving signal fixing circuit which compensates for an influence of the threshold voltage Vth and the carrier mobility μ to keep the driving current fixed in order to prevent the influence of a characteristic dispersion of the drive transistor 121, in the present example, a dispersion of the threshold voltage Vth and the mobility μ upon the driving current Ids.

Since not only a bootstrap operation but also a threshold value correction operation and a mobility correction operation are executed, the gate-source voltage Vgs kept by the bootstrap operation is adjusted with the voltage corresponding to the threshold voltage Vth and the voltage ΔV for mobility correction. Therefore, the emission light luminance of the drive transistor 121 is not influenced by the dispersion of the threshold voltage Vth or the mobility μ of the drive transistor 121, nor by aged deterioration of the organic EL element 127. An image can be displayed with a stabilized gradation corresponding to the inputted signal amplitude Vin and can be displayed with high picture quality.

Further, since the pixel circuit P of the embodiment can be formed from a source follower circuit using the n-channel drive transistor 121, even if the organic EL element 27 with the anode-cathode electrode is used as it is, the organic EL element 127 can be driven.

Further, the pixel circuit P can be configured using only n-channel transistors including the driving transistor 121 and the sampling transistor 125 around the driving transistor 121, and also in TFT fabrication, an amorphous silicon (a-Si) process can be used. Consequently, reduction in cost of a TFT substrate can be achieved.

<<Storage Capacitor and Stored Voltage>>

Figure 8C:
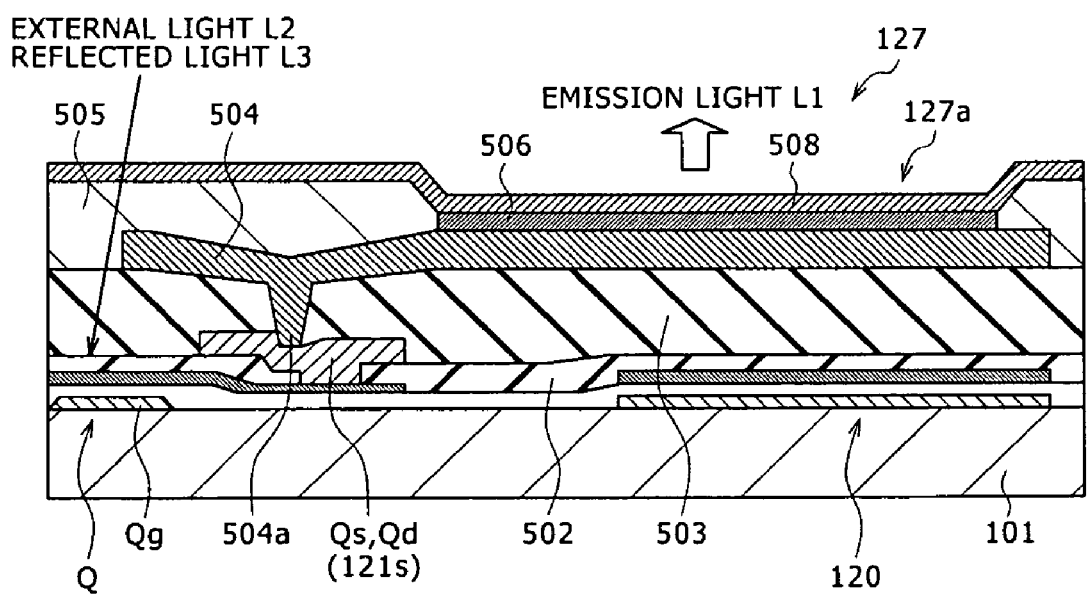

FIGS. 8A to 9 illustrate operation of a thin film transistor Q such as the sampling transistor 125. In particular, FIGS. 8A to 8C show an outline of a layer structure for one pixel of a general organic EL display apparatus. More particularly, FIG. 8A is a plan view of the organic EL display apparatus for one pixel; FIG. 8C is a sectional view taken along line A-A' of FIG. 8A; and FIG. 8B is a schematic view showing an arrangement position of the thin film transistor Q on the plan view of FIG. 8A. FIG. 9 illustrates the current-voltage (I-V) characteristic of the driving transistor 121 and the sampling transistor 125.

In the foregoing description, when the writing driving pulse WS is rendered inactive to place the writing scanning line 104WS into a non-selected state, the gate-source voltage Vgs of the driving transistor 121 is kept stably by the storage capacitor 120 in principle. As a result, even if the writing driving pulse WS is rendered inactive, the driving transistor 121 continues the constant current operation and the organic EL element 127 can continue to emit light with fixed luminance.

This signifies that the keeping performance of the gate-source voltage Vgs of the driving transistor 121 by the storage capacitor 120 has an influence on the performance for causing the organic EL element 127 to continue to emit light with fixed luminance.

<Arrangement and Characteristic of a Transistor>

Referring to FIG. 8A which shows a plan view of the pixel circuit P of the pixel array section 102 for one pixel, a lower electrode 504, for example, an anode electrode, is disposed on a substrate 101, and an EL opening 127a for the organic EL element 127 is formed above the lower electrode 504. A connection hole 504a which may be, for example, a TFT-anode contact is provided on the lower electrode 504 such that the lower electrode 504 is connected to an input/output terminal, in the example shown, the source electrode, of the driving transistor 121 disposed below the lower electrode 504 through the connection hole 504a.

The lower electrode 504 is covered on a circumference thereof with an insulating film pattern 505 in such a manner as to define the EL opening 127a through which only a portion of the organic EL element 127 in which the lower electrode 504, an organic layer 506 and an upper electrode 508 not shown which form the organic EL element 127 are laminated is exposed widely so as to form a light emission effective region.

FIG. 8C shows a sectional view taken along line A-A' of FIG. 8A. Referring to FIG. 8C, at a position on a substrate 101 which corresponds to each pixel circuit P, the thin film transistor Q which may be the driving transistor 121, the sampling transistor 125 or the like which is a component of the pixel circuit P and the storage capacitor 120 of a capacitance value Cs are disposed. An interlayer insulating film 502 is provided on the thin film transistor Q and the storage capacitor 120.

A source electrode line Qs and a drain electrode line Qd are provided on the interlayer insulating film 502 and connected to the thin film transistor Q. Further, various wiring lines not shown which compose the pixel circuit P are formed from a conductive layer which forms the thin film transistor Q and the storage capacitor 120 and another conductive layer which forms the source electrode line Qs and the drain electrode line Qd (only the source electrode 121s of the driving transistor 121 is shown in FIG. 8B).

An interlayer insulating film 503 is provided as an upper layer in such a manner as to cover over the layer of the source electrode line Qs and the drain electrode line Qd, and the organic EL element 127 is formed on the interlayer insulating film 503. The organic EL element 127 is composed of a lower electrode 504, an organic layer 506 and an upper electrode 508, which may be the cathode electrode, laminated in order from the lower layer side. Since the organic EL element 127 is structured such that the organic layer 506 of a dielectric is sandwiched between the lower electrode 504 and the upper electrode 508, it has a capacitive component of a parasitic capacitance Cel.

The lower electrode 504 is formed in a pattern as a pixel electrode and is connected to the source electrode 121s of the driving transistor 121 through a connection hole 504a formed in the interlayer insulating film 502. Meanwhile, the upper electrode 508 opposing to the lower electrode 504 is formed as a solid film which covers all pixel circuits P.

In the organic EL display apparatus 1 having such a layer structure as described above, it is effective to construct the same as a top emission type apparatus wherein emission light L1 is extracted from the opposite side to the substrate 101 on which the organic EL elements 127 are formed in an array in order to assure the numerical aperture of the organic EL elements 127. Further, with the apparatus of the top emission type, the numerical aperture of the organic EL elements 127 does not rely upon the layout of the thin film transistors Q which compose the pixel circuits P. Therefore, also it is possible to dispose a pixel circuit P composed of a plurality of thin film transistors Q or storage capacitors 120 in a corresponding relationship to each pixel.

In a display apparatus of the top emission type, a conductive material having a high light transmittance is used for the upper electrode 508 on the side from which the emission light L1 is extracted. However, a material of the type described has a high resistance value. In contrast, a material having a high reflectivity such as a metal material is used for the lower electrode 504 on the substrate 101 side.

Here, operation and characteristics of the thin film transistor Q provided in the pixel circuit P such as the driving transistor 121 or the sampling transistor 125 for signal lighting are studied. If leak current of the thin film transistor Q connected to the storage capacitor 120 is high while the organic EL element 127 emits light, then the voltage stored in the storage capacitor 120 is fluctuated depending upon the magnitude of the leak current.

As a result, the keeping performance of the gate-source voltage Vgs of the driving transistor 121 may be deteriorated by the leak current of the thin film transistor Q to such a degree that, even if dispersion correction of the element characteristics by threshold correction or mobility correction is carried out and even if the bootstrap function by the storage capacitor 120 connected between the gate and the source of the driving transistor 121 is applied, it becomes impossible for the organic EL elements 127 of the pixel circuits P to continue to emit light with fixed luminance. As a result, roughness or luminance unevenness appears on the display image.

If the value of the storage capacitor 120 is increased, then the variation of the gate-source voltage Vgs by the leak current can be reduced. However, since the variation cannot be reduced to zero, the problem of roughness and so forth arising from the leak current remains considerably.

As regard the cause of leak current, leak can be roughly divided into that arising from an element structure of the driving transistor 121 or the sampling transistor 125 itself and that arising from an external factor. It seems a possible idea to cope with the leak current arising from an element structure, for example, by adopting an LDD (Lightly Doped Drain) structure which is generally provided in order to suppress electric leak of a TFT.

On the other hand, it is considered that leak current arising from an external factor is caused by light such as external light or reflected light from the organic EL element 127 incoming to the thin film transistor Q. In particular, in an organic EL display apparatus having such a layer structure as described above, the pixel circuit P is disposed in a lower layer below the organic EL element 127, and a circuit component of the pixel circuit P such as the thin film transistor Q or the storage capacitor 120 may possibly be disposed in an extruding relationship from below the lower electrode 504 of the component of the organic EL element 127 (refer to FIGS. 8B and 8C). In this instance, if the display apparatus is of the top emission type, then light incoming from the display face side (such light is hereinafter referred to as external light L2) passes through the upper electrode 508 which covers the overall area of the display region, leaks into the lower layer through a gap between the lower electrodes 504 and is irradiated upon the circuit elements of the pixel circuits P disposed in the lower layer.

For example, it is assumed that the thin film transistor Q is formed from amorphous silicon (a-Si). Generally, the leak characteristic of the thin film transistor Q formed from a-Si is fluctuated by a great amount when a channel portion CH of the thin film transistor Q is exposed to the reflected light L3 originating from the emission light L1 or external light L2. FIG. 9 illustrates an example of the leak characteristic of the thin film transistor Q. Referring to FIG. 9, where the thin film transistor Q is placed at a light place and hence is irradiated by light, the leak current is high and the leak characteristic is deteriorated as seen from a curve indicated by a solid line in FIG. 9 in comparison with the leak characteristic of the thin film transistor Q indicated by a dotted line in FIG. 9 where the thin film transistor Q is placed at a dark place. Particularly the leak current in an off region exhibits an increase by approximately one or two digits. Such deterioration of the leak characteristic caused by light such as the emission light L1 or the external light L2 deteriorates the picture quality.

In the pixel circuit P, where the leak current of the driving transistor 121 or the sampling transistor 125 as a switching transistor connected to a terminal of the storage capacitor 120 is high, the voltage stored in the storage capacitor 120, that is, the gate-source voltage Vgs of the storage capacitor 120, is fluctuated by the magnitude of the leak current. As a result, even if the threshold voltage Vth or the mobility μ of the driving transistor 121 is corrected, roughness by leak current arising from the external light L2 of the sampling transistor 125 or the driving transistor 121 appears on the display image, and the picture quality is deteriorated.

Here, the composite capacitance as viewed from the driving transistor 121 is higher than the capacitance of the storage capacitor 120 because the capacitance value Cs of the storage capacitor 120, the parasitic capacitance Cgs between the gate and the source of the driving transistor 121 and the parasitic capacitance Cel of the organic EL element 127 look provided in parallel. Therefore, the composite capacitance has a small influence from the leak current, and it is considered that the sampling transistor 125 has a narrower margin to the leak current than that of the driving transistor 121.

Therefore, in the present embodiment, a mechanism which takes a countermeasure for reducing leak current arising from light incoming to the thin film transistor Q, particularly the sampling transistor 125 which participates in the driving signal fixing function, to prevent a characteristic fluctuation of the circuit elements by light irradiation upon the lower layer than the organic EL element 127 to achieve improvement of the picture quality. In the following, the mechanism is described more particularly.

<Improving Method Against Leak Current Arising from Light>

Figure 10A:
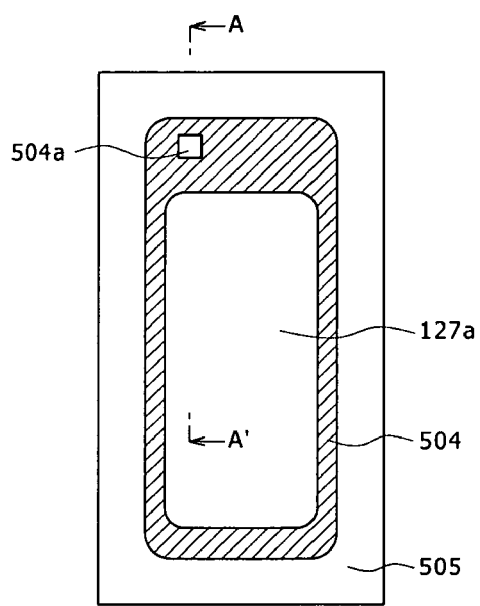
FIGS. 10A to 10C are views showing arrangement of the driving transistor and a sampling transistor as an example of a switching transistor used in the pixel circuit shown in FIG. 5.
Figure 10B:
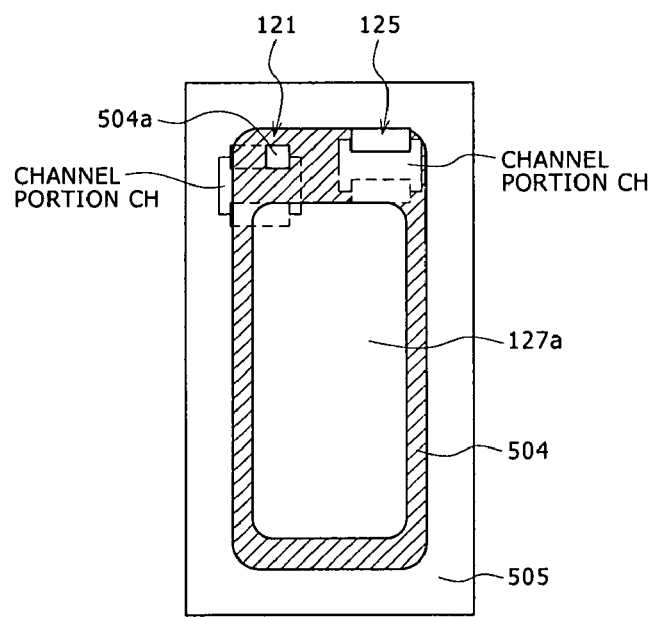
Figure 10C:
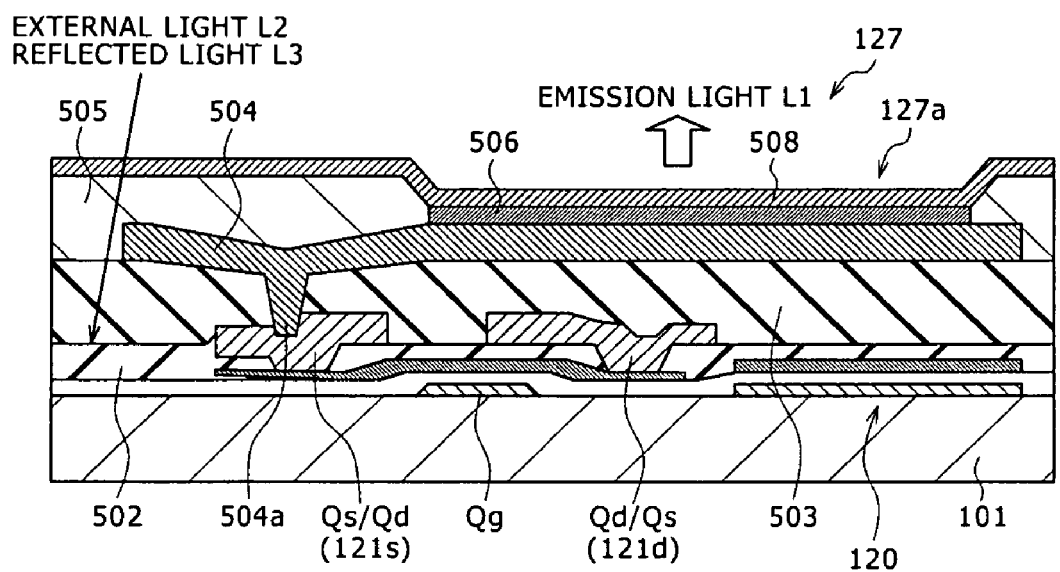

FIGS. 10A to 10C illustrate arrangement of the driving transistor 121 and the sampling transistor 125 as an example of a switching transistor adopted in the present embodiment. In particular, FIG. 10A is a plan view for one pixel; FIG. 10C is a sectional view taken along line A-A' of FIG. 10A; and FIG. 10B is a schematic view showing an arrangement position of a thin film transistor Q on the plan view shown in FIG. 10A.

Referring to FIG. 10A which shows a plan view of the pixel circuit P for one pixel, a layer structure including a lower electrode 504, for example, an anode electrode, an organic layer 506 and an upper electrode 508 is disposed on a substrate 101, and an EL opening 127a is formed above the lower electrode 504. A connection hole 504a which may be, for example, a TFT-anode contact is provided on the lower electrode 504 such that the lower electrode 504 is connected to the driving transistor 121 disposed below the lower electrode 504 through the connection hole 504a. The lower electrode 504 is covered on a circumference thereof with an insulating film pattern 505 in such a manner as to define the EL opening 127a through which only a central portion of the lower electrode 504 is exposed widely. The structure described is similar to the related-art structure described hereinabove with reference to FIG. 8A.

FIG. 10C shows a sectional view taken along line A-A' of FIG. 10A. Referring to FIG. 10C, at a position on the substrate 101 which corresponds to each pixel circuit P, a thin film transistor Q which may be the driving transistor 121, the sampling transistor 125 or the like which is a component of the pixel circuit P and a storage capacitor 120 of a capacitance value Cs are disposed. An interlayer insulating film 502 is provided on the thin film transistor Q and the storage capacitor 120. A light blocking metal layer not shown for preventing light leak or for temperature diffusion is sometimes provided on a face of the substrate 101 remote from the side on which the thin film transistor Q and the organic EL element 127 are disposed.

A source electrode line Qs and a drain electrode line Qd are provided on the interlayer insulating film 502 and connected to the thin film transistor Q. Further, various wiring lines not shown which compose the pixel circuit P are formed from a conductive layer which forms the thin film transistor Q and the storage capacitor 120 and another conductive layer which forms the source electrode line Qs and the drain electrode line Qd (only the source electrode 121s of the driving transistor 121 is shown in FIG. 10B).

An interlayer insulating film 503 is provided as an upper layer in such a manner as to cover over the layer of the source electrode line Qs and the drain electrode line Qd, and the organic EL element 127 is formed on the interlayer insulating film 503. The organic EL element 127 is composed of a lower electrode 504, an organic layer 506 and an upper electrode 508, which may be the cathode terminal, laminated in order from the lower layer side. In particular, the organic EL element 127 includes the lower electrode 504 connected to the source electrode line 121s of the driving transistor 121 through the connection hole 504a formed in the interlayer insulating film 503. In the present example, the lower electrode 504 is used as the anode electrode and is patterned as a pixel electrode. Further, the lower electrode 504 is covered on a circumference thereof with an insulating film pattern 505 such that only a central portion thereof is exposed widely. The portion of the insulating film pattern 505 through which the lower electrode 504 is exposed forms an EL opening 127a as a light emitting portion.

The organic layer 506 including at least a light emitting layer is layered in a patterned state above the EL opening 127a of the lower electrode 504. The light emitting layer provided in the organic layer 506 is made of an organic material which emits light by recombination of holes and electrons injected into the light emitting layer. Further, the upper electrode 508 is disposed and formed in an insulated relationship from the lower electrode 504 above the organic layer 506 and the insulating film pattern 505. The upper electrode 508 is used, in the example shown, as the cathode electrode and is formed as a common electrode to the organic EL elements 127 of all pixel circuits P.

As can be recognized from the configuration described above, the organic EL display apparatus 1 of the present embodiment is of the top emission type wherein emission light L1 is extracted from the opposite side to the substrate 101. Therefore, the lower electrode 504 is made of a material having a high light blocking property and a high reflectivity. Meanwhile, the upper electrode 508 is formed using a material having a high light transmittance. The lower electrode 504 and the upper electrode 508 may be made, at least at a layer thereof which contacts with the organic layer 506, of a material selected suitably from anode electrode materials and cathode electrode materials, respectively. The lower electrode 504 and the upper electrode 508 are sometimes formed from a layer structure having such a light blocking property or a light transmitting property as described hereinabove.

Here, in the organic EL display apparatus 1 of the present embodiment, the thin film transistor Q which composes the pixel circuit P is covered with a layer having a light blocking property (such layer is hereinafter referred to as light blocking layer CL (Covering Layer)), or in other words, and the thin film transistor Q is disposed only below the light blocking layer CL. Particularly, in the organic EL display apparatus 1 of the present embodiment, the lower electrode 504 is utilized as the light blocking layer CL.

Where such a structure as described above is used, as shown in FIG. 10C, the thin film transistor Q is not disposed in a gap of the lower electrodes 504, for example, between adjacent pixels. In this gap, a wiring line portion or a resistance element of the pixel circuit P formed using the thin film transistor Q is disposed.

In order to cover the thin film transistor Q with the light blocking layer CL such as, for example, the lower electrode 504, it is significant that a channel portion CH of the thin film transistor Q, that is, a portion of the thin film transistor Q at which the gate electrode Qg is layered, is disposed only below the light blocking layer CL, that is, below the lower electrode 504. However, the source/drain of the thin film transistor Q and wiring line portions extending from the source and the drain of the thin film transistor Q may be disposed in a gap of the light blocking layer CL, that is, of the lower electrode 504.

In the arrangement described, external light L2 incoming from the display face side, that is, from the upper electrode 508 side, passes through the layer of the upper electrode 508 which has a light transmitting property and reaches the layer of the lower electrode 504 having a light blocking property. The external light L2 coming to the layer of the lower electrode 504 leaks to the lower layer through the gap of the lower electrodes 504 and is irradiated upon the pixel circuit P disposed in the lower layer. However, since the thin film transistor Q, particularly the channel portion CH of the thin film transistor Q forming the pixel circuit P, is selectively disposed only below the lower electrode 504, the external light L2 does not pass through the lower electrode 504. Consequently, the thin film transistor Q can be prevented from being exposed to the external light L2. As a result, a characteristic fluctuation of the thin film transistor Q, particularly deterioration of the leak characteristic, by light irradiation is prevented, and improvement of the picture quality of the organic EL display apparatus 1 can be achieved.

As described above, from between the driving transistor 121 and the sampling transistor 125, the sampling transistor 125 has a narrower margin to leak current caused by light. Therefore, in the present embodiment, the light blocking property by the light blocking layer CL, that is, by the lower electrode 504, is set higher in the sampling transistor 125 than in the driving transistor 121. In an extreme case, the driving transistor 121 is not shielded against light.

If the overlapping degrees of the transistors particularly at the channel portion CH thereof with the light blocking layer, that is, the overlapping amounts, are equal, then the light blocking property enhances as the film thickness increases. Further, if the materials or the film thicknesses of the transistors particularly at the channel portion CH are same, then the light blocking performance enhances as the overlapping degrees, that is, the overlap amounts, of the transistors particularly at the channel portion CH and the light blocking film increase.

Thus, since, as an example, the lower electrode 504 formed from a light blocking material can be utilized as a light blocking layer, the overlap amount of the sampling transistor 125 of the thin film transistor Q selectively disposed below the lower electrode 504 with the lower electrode 504 is set greater than the overlap amount between the driving transistor 121 and the lower electrode 504. While, in FIG. 10B, the entire channel portion CH of the sampling transistor 125 is fully disposed below the lower electrode 504 which composes the organic EL element 127, the driving transistor 121 is disposed such that part of the channel portion CH protrudes from below the lower electrode 504 which composes the organic EL element 127.

The emission light L1 from the organic EL element 127 or the external light L2 is less likely to enter the channel of the sampling transistor 125 than the channel of the driving transistor 121, and leak current arising from light irradiation can be suppressed low with certainty. By suppressing the leak current of the sampling transistor 125, which is an example of a switching transistor connected to the storage capacitor 120, to a low level, the dispersion of the voltage stored in the storage capacitor 120 can be reduced and the picture quality deterioration arising from leak current such as image roughness can be reduced or eliminated.

For example, if the thin film transistor Q is selectively disposed only below the lower electrode 504, then the emission light L1 and the external light L2 can be prevented from entering the channel of the thin film transistor Q. However, light cannot be blocked fully on an edge side of the light blocking layer CL, that is, of the lower electrode 504.

Therefore, by preferentially blocking light to the sampling transistor 125, on which leak current arising from light irradiation influences more, to light to the driving transistor 121, the picture quality dispersion by leak current arising from light can be suppressed with a higher degree of certainty. By taking a countermeasure of blocking light, which utilizes the light blocking layer CL to block light incoming to the thin film transistor Q disposed on the lower layer than the organic EL element 127, that is, incoming to the sampling transistor 125 for the driving signal fixing function, leak current arising from light irradiation can be further reduced and improvement of the picture quality can be achieved.

Particularly where the lower electrode 504 is utilized as the light blocking layer CL, even if reflected light L3 originating from the emission light L1 enters, since the driving transistor 121 and the sampling transistor 125 are shielded against light by the lower electrode 504, in the example shown, by the anode electrode of the lower electrode 504, a leak characteristic variation of the transistors 121 and 125 by light irradiation does not occur. Therefore, display unevenness according to an image pattern by leak current arising from light irradiation can be suppressed or eliminated.

While description of the embodiment of the present invention is given above, the technical scope of the present invention is not limited to the range of the description of the embodiment. Various alterations and modifications can be made without departing from the subject matter of the present invention. Also such alterations and the modifications are included in the technical scope of the present invention.

Further, the embodiment described above shall not restrict the invention as set forth in claims, and all of the combinations of the characteristics described in the description of the embodiment are not required as essential means for the achievement of the object of the present invention. Various stages of the invention are included in the embodiment described above, and various inventions can be extracted by a suitable combination of a plurality of ones of the features disclosed in the present application. Even if several features are deleted from all of the features of the embodiment, as far as intended effects are achieved, the configuration from which such several features are deleted may be extracted as an invention.

<Modification to the Improving Method Against Leak Current Arising from Light>

For example, while the example wherein the lower electrode 504 formed from a light blocking material is described as the light blocking layer CL is described as a mechanism for suppressing leak current arising from light, the light blocking layer CL need not necessarily be formed using the lower electrode 504. For example, where a different wiring line is provided in the same layer with the lower electrode 504, the different wiring line may be formed from a light blocking material and utilized as the light blocking layer CL while the transistors, particularly switching transistors which participate in the driving signal fixing function, are disposed below the different wiring line.

Further, in addition to or separately from utilization of such a different wiring line, that is, the lower electrode 504 or the different layer in the same layer with the lower electrode 504 as the light blocking layer CL, another light blocking layer CL for exclusive use may be provided. For example, where the organic EL display apparatus 1 is for color image display, while a color filter is provided in an upper layer than the organic EL element 127 in the configuration shown in FIG. 8C, non-opening portions of the color filter may be disposed as the light blocking layer CL in an upper layer than the transistors, particularly the switching transistors which relate to the driving signal fixing function. Further, the metal material of the source electrode line Qs and the drain electrode line Qd may be overlapped above the channels to achieve light blocking.

<Modifications to the Driving Timings>

In the aspect of the driving timings, various modifications are possible while the timing at which the potential of the power supply line 105DSL is changed from the second potential Vss to the first potential Vcc is set to a period of the offset potential Vofs which is an ineffective period of the image signal Vsig.

For example, as a first modification, though not shown, the setting method of the sampling period and mobility correction period K can be modified with regard to the driving timings illustrated in FIG. 6A. In particular, the timing t15V at which the image signal Vsig changes from the offset potential Vofs to the signal potential Vofs+Vin is first shifted to the rear half side of one horizontal period from the diving timing illustrated in FIG. 6A to narrow the signal potential Vofs+Vin.

Further, upon completion of the threshold value correction operation, that is, upon completion of the threshold value correction period 1, first the period until, while the writing driving pulse WS is kept at the active H level, the signal potential Vofs+Vin is supplied from the horizontal driving section 106 to the image signal line 106HS (t15) to set the potential of the writing driving pulse WS to the inactive L level (t17) is determined as a writing period of the signal amplitude Vin into the storage capacitor 120. The information of the signal amplitude Vin is stored in a form cumulatively added to the threshold voltage Vth of the drive transistor 121. As a result, since the variation of the threshold voltage Vth of the drive transistor 121 is always canceled, this is execution of threshold value correction. By the threshold value correction operation, the gate-source voltage Vgs stored in the storage capacitor 120 becomes "(1−g)Vin+Vth." Simultaneously, mobility correction is executed within the signal wiring period t15 to t17. In particular, the period from timing t15 to timing 17 serves as both of the signal writing period and the mobility correction period.

It is to be noted that, within the period t15 to t17 within which the mobility correction is executed, since the organic EL element 127 actually is in a reversely biased state, it does not emit light. Within this mobility correction period t15 to t17, driving current Ids flows through the drive transistor 121 wherein the potential of the gate terminal G of the drive transistor 121 is fixed to the image signal potential Vsig. Later driving timings are similar to those described hereinabove with reference to FIG. 6A.

The driving sections 104, 105 and 106 can adjust relative phases of the image signal Vsig to be supplied to the image signal line 106HS from the horizontal driving section 106 and the writing driving pulse WS to be supplied from the writing scanning section 104 to optimize the mobility correction period.

However, the period from timing t15V3 to timing t17 becomes the sampling period and mobility correction period K without the presence of the writing and mobility correction preparation period J. Therefore, there is the possibility that the difference in waveform characteristic arising from an influence of distance dependence of the wiring line resistance or the wiring line capacitance of the writing scanning line 104WS and the image signal line 106HS may have an influence on the sampling period and mobility correction period K. Since the sampling potential and the mobility correction time are different between the side of the screen nearer to the writing scanning section 104 and the side of the screen farther to the writing scanning section 104, that is, between left and right portions of the screen, there is the possibility that a luminance difference may appear between the left and the right of the screen and be visually observed as a shading.

Meanwhile, as a second modification, the turning off timing of the power supply, that is, the changeover timing to the second potential Vss side, may be modified. In particular, the turning off timing and the turning on timing of a row can be placed into the same horizontal period.

In the driving timings of the second modification, a power supply switching operation is carried out within a period within which the image signal Vsig has the offset potential Vofs. Further, at this time, the sampling transistor 125 is placed into an on state to fix the gate terminal G of the drive transistor 121 to the offset potential Vofs to establish a low-impedance state. The resisting property against coupling noise arising from a power supply pulse, that is, the power supply driving pulse DSL, is improved thereby.

<<Modifications to the Pixel Circuit>>

In regard to the pixel circuit, an example wherein driving timings are devised while a 2 TR configuration which uses an n-channel transistor as the drive transistor 121 is used is described as a configuration example of a bootstrap circuit or a threshold value and mobility correction circuit which is an example of a driving signal fixing circuit for keeping driving current fixed. However, this is a mere example of a driving signal fixing circuit and driving timings for keeping a driving signal for driving the organic EL element 127 fixed, and other various circuits can be applied as a driving signal fixing circuit for preventing aged deterioration of the organic EL element 127 and an influence of a variation of a characteristic of the n-channel drive transistor 121, for example, a dispersion or a variation of the threshold voltage, mobility and so forth upon the driving current Ids.

It is to be noted that, the technique for the circuit alteration is not limited to the 2 TR configuration. A configuration other than the 2 TR configuration which includes, in addition to a sampling transistor, which is an example of a switching transistor, and a driving transistor, a different transistor for carrying out control of keeping driving current fixed may be applied. Some of modification examples will be described hereinafter.

<Modification to the Pixel Circuit: First Example>

Figure 11:
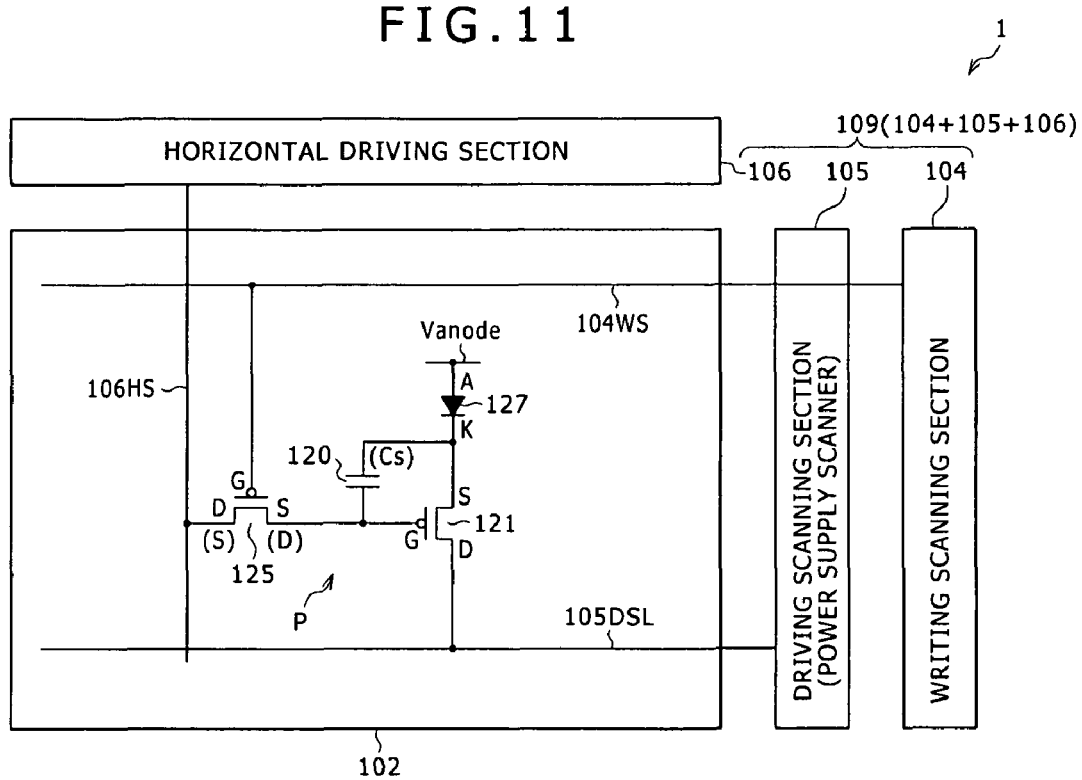
FIGS. 11, 12 and 13A are circuit diagrams showing different modifications to the pixel circuit shown in FIG. 5.

FIG. 11 shows a first example of a modification, that is, a modification 1, to the pixel circuit P which composes the organic EL display apparatus 1 shown in FIG. 1. Since the "duality theory" is satisfied on the circuit theory, modification to the pixel circuit P can be applied from this point of view. In this instance, while the pixel circuit P shown in FIG. 5 is formed using an n-channel drive transistor, a p-channel driving transistor is used to form the pixel circuit P. Corresponding to this, alteration in accordance with the duality theory such as to reverse the relationship in polarity of the signal amplitude Vin, that is, the signal potential Vofs+Vin, with respect to the offset potential Vofs of the image signal Vsig or the magnitude relationship of the power supply voltages is applied.

For example, the pixel circuit P of the duality theory includes a storage capacitor 120 connected between the gate terminal G and the source terminal S of a p-channel driving transistor 121. The driving transistor 121 is connected at the source terminal S thereof directly to the cathode terminal K of the organic EL element 127. The anode terminal A of the organic EL element 127 has an anode potential Vanode as a reference potential. This anode potential Vanode is connected to a reference power source of the high potential side common to all pixels for supplying the reference potential.

The driving transistor 121 is connected at the drain terminal D thereof to a power supply line 105DSL from the driving scanning section 105 which functions as a power supply scanner. The power supply line 105DSL itself has a power supplying capacity to the driving transistor 121. The driving scanning section 105 changes over the potential to be supplied to the drain terminal D of the driving transistor 121 between a second potential Vss of the low potential side and a first potential Vcc of the high potential side. In other words, while the driving scanning section 105 for driving the pixel circuits P shown in FIG. 5 has a power supply capacity of the active H level, the driving scanning section 105 for driving the pixel circuits P to which the duality theory is applied has another power supply capacity of the active L level. The first potential Vcc is sufficiently higher than the offset potential Vofs of the image signal Vsig on an image signal line 106HS.

The p-channel sampling transistor 125 is connected at the gate terminal G thereof to the writing scanning line 104WS from the writing scanning section 104, at the source terminal S thereof to the image signal line 106HS and at the drain terminal D thereof to the gate terminal G of the driving transistor 121. To the gate terminal G of the sampling transistor 125, a writing driving pulse WS of the active L level is supplied from the writing scanning section 104.

Also in the modified pixel circuit P to which the duality theory is applied, it is possible to execute a threshold value correction operation, a mobility correction operation and a bootstrap operation. To the thin film transistor Q which composes the pixel circuit P, the concept of the present embodiment that the light blocking performance by the light blocking layer CL, in the present example, by the cathode electrode serving as the lower electrode, is set higher to the sampling transistor 125 than to the driving transistor 121 is applied.

It is to be noted that, although the modified pixel circuit P described above is formed by applying alteration to the pixel circuit P shown in FIG. 5 in accordance with the "duality theory," the method of circuit alteration is not limited to this. Where the pixel circuit P is basically formed in a 2 TR configuration, the concept of the present embodiment that the light blocking performance by the light blocking layer CL, which is, in the present example, the cathode electrode serving as the lower electrode, is set higher to the sampling transistor 125 than to the driving transistor 121 can be applied to all pixels which are driven, when the threshold value correction operation is to be executed, such that the image signal Vsig which changes over between the offset potential Vofs and the signal potential Vofs+Vin within each horizontal period is transmitted to the image signal line 106HS in synchronism with line-sequential scanning by the writing scanning section 104.

Further, the pixel circuit P to which the concept of the present embodiment that the light blocking performance by the light blocking layer CL, preferably by the lower electrode, is set higher to the sampling transistor 125 than to the driving transistor 121 can be applied is not limited to the 2 TR configuration and may have any number of thin film transistors Q only if one or any combination of, for example, the threshold value correction function, mobility correction function and bootstrap function is implemented. In the following, different modifications having configurations other than the 2 TR configuration are described in regard to several examples.

It is to be noted that, in order to implement a display apparatus of a small size for which display of a high definition is demanded, it is optimum to use the 2 TR configuration to implement a driving signal fixing function. Further, if the number of transistors is small, then where the lower electrode 504 is utilized as a light blocking layer, since the degree of freedom of the layout when the transistors are disposed below the lower electrode 504 is high, it is facilitated to dispose all transistors fully below the lower electrode 504. Conversely speaking, as the number of transistors increases, the degree of freedom of the layout when the transistors are disposed below the lower electrode 504 decreases, and therefore, it becomes difficult to dispose the entire channel portion CH fully below the lower electrode 504 with regard to some of the transistors. In this regard, the significance of the mechanism of the present embodiment wherein those switching transistors which participate in the driving signal fixing function are disposed below the lower electrode 504 preferentially to the driving transistor 121.

<Modification to the Pixel Circuit: Second Example>

Figure 12:
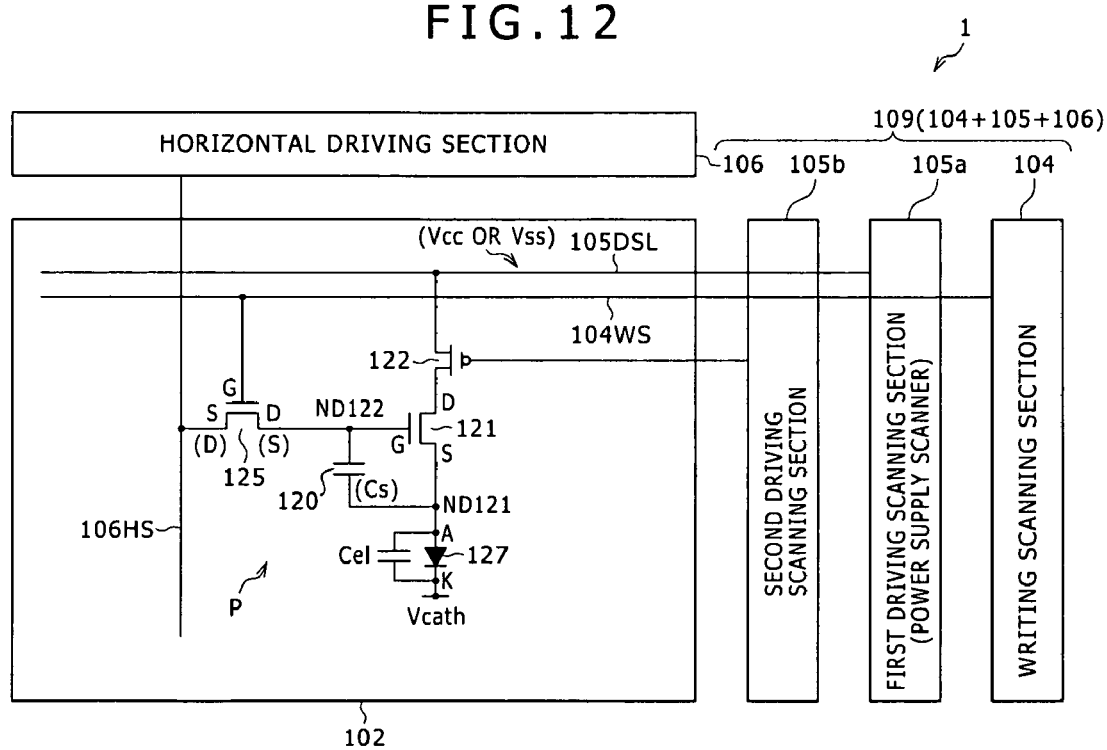

FIG. 12 shows a second example of a modification, that is, a modification 2, to the pixel circuit P which composes the organic EL display apparatus 1 shown in FIG. 1. It is to be noted that also the vertical driving section 103 and the horizontal driving section 106 provided at peripheral portions of the pixel circuits P on the substrate 101 of the display panel section 100 are shown.

The pixel circuit P of the modification 2 shown in FIG. 12 has a 3 TR configuration wherein, based on the pixel circuit P of the 2 TR configuration shown in FIG. 5, the driving transistor 121 is connected at the drain terminal D thereof, which is a power supplying terminal of the driving transistor 121, to a power supply line 105DSL through a light emission controlling transistor 122. The light emission controlling transistor 122 may be formed from a transistor of the p-channel type as seen in FIG. 12 or of the n-channel type not shown.

The driving scanning section 105 is divided into a first driving scanning section 105a for switchably supplying the first potential Vcc and the second potential Vss to the power supply line 105DSL and a second driving scanning section 105b for controlling the light emission controlling transistor 122 between on and off states. The on-period of the light emission controlling transistor 122 is controlled by the second driving scanning section 105b to adjust the light emitting period and the no-light emitting period of the organic EL element 127 thereby to make it possible to carry out duty driving.

Although a timing chart is not shown, the on-period of the light emission controlling transistor 122 may be controlled while a power supply driving pulse DSL is set to the first potential Vcc within the light emitting period in the timing chart shown in FIG. 6A.

<Modification to the Pixel Circuit: Third Example>

Figure 13A:
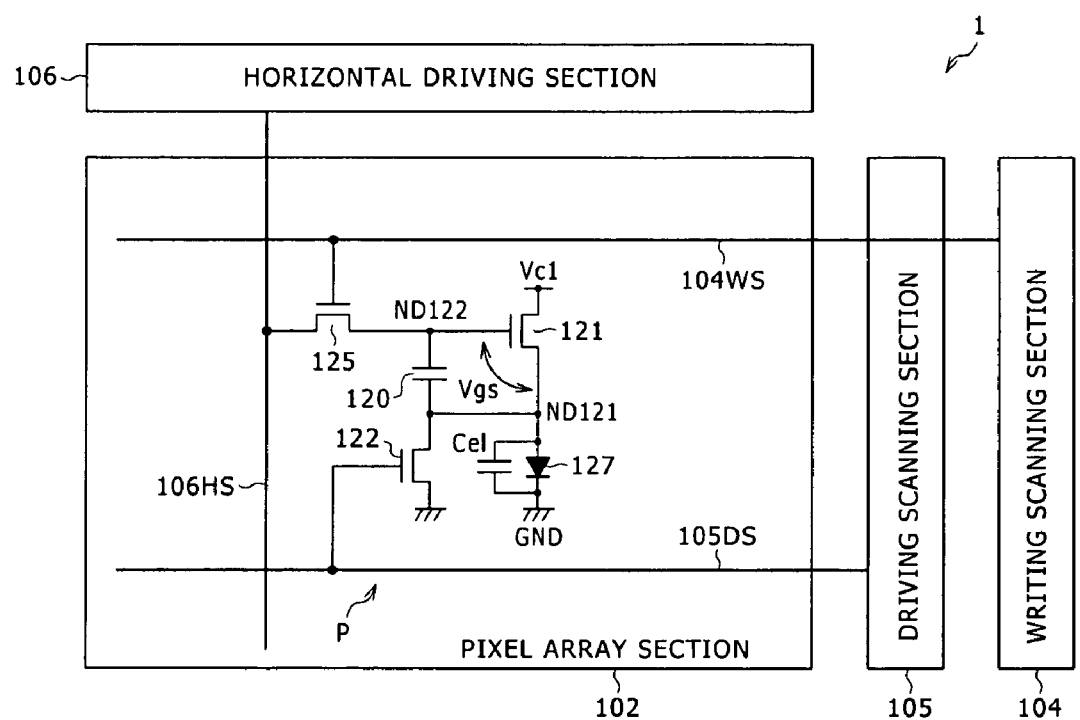

FIG. 13A shows a third example of a modification, that is, a modification 3, to the pixel circuit P which composes the organic EL display apparatus 1 shown in FIG. 1. It is to be noted that also the vertical driving section 103 and the horizontal driving section 106 provided at peripheral portions of the pixel circuits P on the substrate 101 of the display panel section 100 are shown.

In the pixel circuit P of the modification 3, the arrangement and the connection scheme of the storage capacitor 120 and the light emission controlling transistor 122 in the second comparative example shown in FIG. 3 are modified such that a bootstrap circuit 130 which is an example of a driving signal fixing circuit is formed.

The vertical driving section 103 which drives the pixel circuits P includes a writing scanning section 104 and a driving scanning section 105. To the pixel circuits P arrayed in a matrix, writing scanning lines 104WS_1 to 104WS_n for n rows driven with a writing driving pulse WS by the writing scanning section 104 and driving scanning lines 105DS_1 to 105DS_n for n rows driven with a scanning driving pulse DS by the driving scanning section 105 are wired individually for the pixel rows.

The storage capacitor 120 is connected between the gate and the source of the driving transistor 121, that is, between the node ND121 and the node ND122 similarly as in the 2 TR configuration shown in FIG. 5. This makes it possible for a bootstrap function to operate.

The driving transistor 121 is connected at the drain terminal thereof to the first power supply potential Vc1. Further, the driving transistor 121 is connected at the source terminal thereof directly to the anode terminal of the organic EL element 127. The organic EL element 127 is connected at the cathode terminal thereof to a cathode wiring line Vcath to which a reference potential is applied. In the present modification, the ground potential GND is applied to the cathode terminal of the organic EL element 127. A source follower circuit is formed thereby.

The light emission controlling transistor 122 is a switching transistor and is connected at the drain terminal thereof to the node ND121 and at the source terminal thereof to the ground potential GND which is an example of the reference potential. The light emission controlling transistor 122 has a significant function to the bootstrap operation and is used also to control the light emission time, that is, the duty, of the organic EL element 127 occupying in one field period. The storage capacitor 120 is connected between the gate and the source of the driving transistor 121, and the potential of the source terminal of the driving transistor 121 is connected to a fixed potential through the light emission controlling transistor 122.

The bootstrap circuit 130 includes an n-channel light emission controlling transistor 122 connected in parallel to the organic EL element 127, and a storage capacitor 120 connected to the light emission controlling transistor 122 between the gate and the source of the driving transistor 121.

<Timing Chart: Modification 3>

Figure 13B:
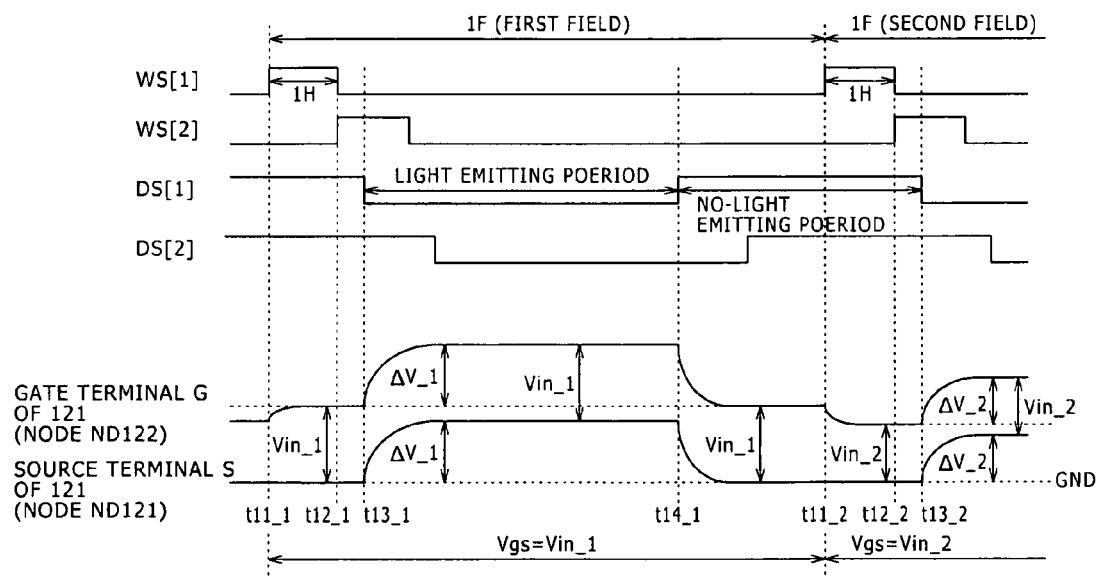
FIG. 13B is a timing chart illustrating general operation of the modified pixel circuit shown in FIG. 13A.

FIG. 13B illustrates general operation of the pixel circuit P of the modification 3. In particular, FIG. 13A illustrates a timing relationship within one field period (1F) of writing driving pulses WS[1] and WS[2] applied to the pixel circuit P from the writing scanning section 104 through the writing scanning line 104WS, scanning driving pulses DS[1] and DS[2] applied to the pixel circuit P from the driving scanning section 105 through the driving scanning line 105DS, the gate potential Vg of the driving transistor 121, that is, the potential of the node ND122, and the source potential Vs, that is, the potential of the node ND121 when the pixel circuits P of two adjacent rows are driven. A timing point t@ is indicated with a reference character _* applied thereto for each field with attention paid to the writing driving pulse WS[1] and the scanning driving pulse DS[1].

Within a no-light emitting period (for example, t14_1 to t13_2), in a state wherein the sampling transistor 125 is off, the light emission controlling transistor 122 is placed into an on state first. Then, after a next field referred to as second field is entered, in the state wherein the light emission controlling transistor 122 is on, the sampling transistor 125 is placed into an on state to write a pixel signal Vin_2 into the storage capacitor 120 (t11_2).

Thereafter, the sampling transistor 125 is placed into an off state to end the writing (t12_2), and the light emission controlling transistor 122 is placed into an off state (t13_2). Consequently, the source potential Vs of the driving transistor 121 rises, and driving current Ids corresponding to the pixel signal Vin_2 flows through the organic EL element 127.

Although the source potential Vs of the driving transistor 121 is fluctuated, since the storage capacitor 120 is connected between the gate and the source of the driving transistor 121, the rise of the source potential Vs can be followed up by the rise of the gate potential Vg at a high ratio. Consequently, the gate-source voltage Vgs of the driving transistor 121 is always kept substantially at the pixel signal Vin_2.

Since the driving transistor 121 operates within its saturation region, the driving current Ids depends upon the gate-source voltage Vgs, and this driving current Ids flows through the organic EL element 127 so that the organic EL element 127 emits light. At this time, the potential of the node ND121 rises to a voltage which is reached when the driving current Ids flows through the organic EL element 127. As the voltage rises, also the potential of the node ND122 rises similarly through the storage capacitor 120. Consequently, the gate-source voltage Vgs of the driving transistor 121 is kept substantially at the pixel signal Vin_2 as described hereinabove.

After the writing of information of the signal amplitude Vin into the storage capacitor 120 ends, if the light emission controlling transistor 122 is placed into an off state within the light emitting period of the organic EL element 127, then current begins to flow through the organic EL element 127. At this time, since the storage capacitor 120 exists between the gate and the source of the driving transistor 121, the gate-source voltage Vgs of the driving transistor 121 always remains substantially the signal amplitude Vin regardless of fluctuation of the source potential Vs of the driving transistor 121.

Further, since the driving transistor 121 operates as a constant current source, even if the I-V characteristic of the organic EL element 127 varies as time passes and the source potential Vs of the driving transistor 121 varies in response to the variation, since the gate-source voltage Vgs of the driving transistor 121 is kept fixed (≈Vin) by the bootstrap function of the storage capacitor 120, the current flowing through the organic EL element 127 does not vary and also the emission light luminance of the organic EL element 127 is kept fixed. Even if the Iel-Vel characteristic of the organic EL element 127 varies as time passes, the bootstrap operation makes it possible to display an image which does not suffer from luminance deterioration by the variation of the Iel-Vel characteristic.

In addition, also in the pixel circuit P of the modification 3, the sampling transistor 125 connected to the storage capacitor 120 on the node ND122 side which is influenced much by leak current arising from light irradiation is shielded against light by the light blocking layer CL, preferably by the lower electrode 504, preferentially to the driving transistor 121, then the picture quality dispersion by leak current arising from light irradiation can be suppressed with a higher degree of certainty.

Further, in the case of the pixel circuit P of the modification 3, the switching transistors connected to the storage capacitor 120 include, in addition to the sampling transistor 125, the light emission controlling transistor 122 connected to the node ND121 side, and it is considered that the light emission controlling transistor 122 has a narrower margin to the leak current than the driving transistor 121.

Accordingly, if also the light emission controlling transistor 122 connected to the node ND121 side of the storage capacitor 120 is shielded against light by the light blocking layer CL, preferably by the lower electrode 504, preferentially to the driving transistor 121, then the picture quality dispersion by leak current arising from light irradiation can be suppressed with a higher degree of certainty.

<Modification to the Pixel Circuit: Fourth Example>

Figure 14A:
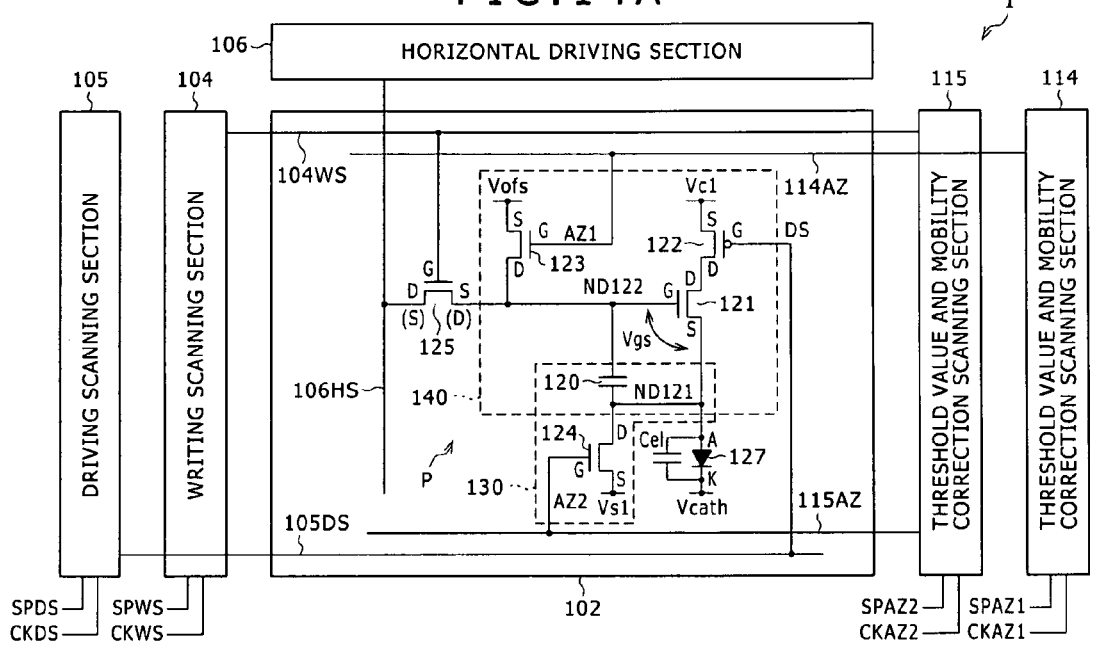
FIG. 14A is a circuit diagram showing a different modification to the pixel circuit shown in FIG. 5.

FIG. 14A shows a fourth example of a modification, that is, a modification 4, to the pixel circuit P which composes the organic EL display apparatus 1 shown in FIG. 1. It is to be noted that also the vertical driving section 103 and the horizontal driving section 106 provided at peripheral portions of the pixel circuits P on the substrate 101 of the display panel section 100 are shown.

In the pixel circuit P of the modification 4 shown in FIG. 14A, the drive transistor is formed from an n-channel thin film field effect transistor. The pixel circuit P of the modification 4 includes a circuit for suppressing the fluctuation of the driving current Ids to the organic EL element by aged deterioration of the organic EL element, that is, a driving signal fixing circuit (part 1) which implements a threshold value correction function and a mobility correction function which compensate for the variation of the current-voltage characteristic of the organic EL element which is one of electro-optical elements to keep the driving current Ids fixed. In addition, the pixel circuit P of the modification 4 includes another driving signal fixing circuit (part 2) which implements a bootstrap function of making the driving current fixed even where the current-voltage characteristic of the organic EL element suffers from aged deterioration.

The pixel circuit P of the modification 4 includes an n-channel storage capacitor 120, a driving transistor 121, and an n-channel light emission controlling transistor 122 having the gate terminal G as a control input terminal to which a driving pulse of the active L level, that is, a scanning driving pulse DS, is supplied. The pixel circuit P further includes an n-channel sampling transistor 125 having the gate terminal G as a control input terminal to which a driving pulse of the active H level, that is, a writing driving pulse WS, is supplied.

The pixel circuit P further includes an organic EL element 127 which is an example of an electro-optical element or light emitting element which emits light when current flows therethrough.

The sampling transistor 125 is a switching transistor provided on the gate terminal G side or control input terminal side of the driving transistor 121. Also the light emission controlling transistor 122 is a switching transistor.

If all switching transistors can be formed not from a p-channel transistor but from an n-channel transistor, then it is possible to use a related-art amorphous silicon (a-Si) process for transistor fabrication. This makes it possible to reduce the cost for a transistor substrate, and development of the pixel circuits P of such a configuration as just described is expected. The pixel circuit P of the modification 4 uses a p-type transistor for the light emission controlling transistor 122 and is somewhat disadvantageous in this regard. Also in the pixel circuit P of the modification 4, if an n-type transistor is used for the light emission controlling transistor 122, then the disadvantage is eliminated.

In the pixel circuit P of the modification 4, the light emission controlling transistor 122 is disposed on the drain terminal D side of the driving transistor 121 and the storage capacitor 120 is connected between the gate and the source of the driving transistor 121 such that a bootstrap circuit 130 and a threshold value and mobility correction circuit 140 are provided.

Since the organic EL element 127 is a current light emitting element, a gradation of color development is obtained by controlling the amount of current flowing through the organic EL element 127. Therefore, the application voltage to the gate terminal G of the driving transistor 121 is varied to control the value of current to flow through the organic EL element 127.

In this instance, the bootstrap circuit 130 and the threshold value and mobility correction circuit 140 are provided so that the influence of aged deterioration of the organic EL element 127 and a characteristic dispersion of the driving transistor 121 is eliminated. To this end, the vertical driving section 103 for driving the pixel circuit P includes two threshold value and mobility correction scanning sections 114 and 115 in addition to the writing scanning section 104 and the driving scanning section 105.

Although only one pixel circuit P is shown in FIG. 14A, as described hereinabove with reference to FIG. 1, pixel circuits P of a similar configuration are arrayed in a matrix. To the pixel circuits P arrayed in a matrix, threshold value and mobility correction scanning lines 114AZ_1 to 114AZ_n for n rows driven with a threshold value and mobility correction pulse AZ1 by a first threshold value and mobility correction scanning section 114 and threshold value and mobility correction scanning lines 115AZ_1 to 115AZ_n for n rows driven with another threshold value and mobility correction pulse AZ2 by a second threshold value and mobility correction scanning section 115 are wired for the individual pixel rows in addition to writing scanning lines 104WS_1 to 104WS_n for n rows driven with a writing driving pulse WS by the writing scanning section 104 and driving scanning lines 105DS_1 to 105DS_n for n rows driven with a scanning driving pulse DS by the driving scanning section 105.

The bootstrap circuit 130 includes an n-channel detection transistor 124 connected in parallel to the organic EL element 127 and receives the threshold value and mobility correction pulse AZ2 of the active H level supplied thereto. The bootstrap circuit 130 further includes a storage capacitor 120 connected between the gate and the source of the driving transistor 121. The storage capacitor 120 functions also as a bootstrap capacitor.

The threshold value and mobility correction circuit 140 includes an n-channel detection transistor 123 connected between the gate terminal G of the driving transistor 121 and the second power supply potential Vofs so as to receive the threshold value and mobility correction pulse AZ1 of the active H level. The threshold value and mobility correction circuit 140 further includes a driving transistor 121, a light emission controlling transistor 122, and a storage capacitor 120 connected between the gate and the source of the driving transistor 121. The storage capacitor 120 functions also as a threshold voltage storage capacitor for storing the detected threshold voltage Vth.

The driving transistor 121 is first connected at the drain terminal D thereof to the drain terminal D of the light emission controlling transistor 122. The light emission controlling transistor 122 is connected at the source terminal S thereof to the first power supply potential Vc1. Further, the driving transistor 121 is connected at the source terminal S thereof directly to the anode terminal A of the organic EL element 127. The junction between the source terminal S of the driving transistor 121 and the anode terminal A of the organic EL element 127 is denoted by node ND121. The organic EL element 127 is connected at the cathode terminal K thereof to a cathode wiring line Vcath, which has, in the example shown, the ground potential GND and is common to all pixels for supplying a reference potential such that the cathode potential is supplied to the cathode terminal K of the organic EL element 127.

The sampling transistor 125 is connected at the gate terminal G thereof to the writing scanning line 104WS from the writing scanning section 104, at the drain terminal D thereof to the image signal line 106HS and at the source terminal S thereof to the gate terminal G of the driving transistor 121. The junction between the source terminal S of the sampling transistor 125 and the gate terminal G of the driving transistor 121 is denoted by node ND122. A writing driving pulse WS of the active H level is supplied from the writing scanning section 104 to the gate terminal G of the sampling transistor 125. The sampling transistor 125 may be connected in a connection scheme wherein the source terminal S and the drain terminal D are reversed. The storage capacitor 120 is connected at one terminal thereof to the source terminal S of the driving transistor 121 and at the other terminal thereof to the gate terminal G of the driving transistor 121.

The detection transistor 123 is a switching transistor provided on the gate terminal G side of the driving transistor 121, that is, on the control input terminal side of the driving transistor 121. The detection transistor 123 is connected at the source terminal S thereof to the second power supply potential Vofs which is an example of an offset voltage and at the drain terminal D thereof to the gate terminal G of the driving transistor 121, that is, to the node ND122. Further, the detection transistor 123 is connected at the gate terminal G as a control input terminal thereof to a threshold value and mobility correction scanning line 114AZ. If the detection transistor 123 is placed into an on state, then the potential of the gate terminal G of the driving transistor 121 is connected to the second power supply potential Vofs which is a fixed potential through the detection transistor 123.

The detection transistor 124 is a switching transistor and is connected at the drain terminal D thereof to the node ND121 which is the junction between the source terminal S of the driving transistor 121 and the anode terminal A of the organic EL element 127. Further, the detection transistor 124 is connected at the source terminal S thereof to a fixed potential Vs1 which is an example of a reference potential and at the gate terminal G as a control input terminal thereof to a threshold value and mobility correction scanning line 115AZ.

The storage capacitor 120 is connected between the gate and the source of the driving transistor 121 such that, when the detection transistor 124 is turned on, the potential of the source terminal S of the driving transistor 121 is connected to the fixed potential Vs1 through the detection transistor 124.

The sampling transistor 125 operates when it is selected by the writing scanning line 104WS, and samples information of the signal amplitude Vin from the image signal line 106HS and stores a voltage of a magnitude corresponding to the signal amplitude Vin into the storage capacitor 120 through the node ND112.

The driving transistor 121 current drives the organic EL element 127 in response to the driving voltage stored in the storage capacitor 120, that is, in response to the gate-source voltage Vgs of the driving transistor 121 at this point of time, while the light emission controlling transistor 122 is in an on state under the scanning driving pulse DS. The light emission controlling transistor 122 is rendered conducting to supply current from the first power supply potential Vc1 to the driving transistor 121 when it is selected by the driving scanning line 105DS.

By connecting the drain terminal D side which is the current supply terminal of the driving transistor 121 to the first power supply potential Vc1 through the light emission controlling transistor 122 and controlling the on time of the light emission controlling transistor 122 in this manner, the light emitting period and the no-light emitting period of the organic EL element 127 can be adjusted to carry out duty driving.

The detection transistors 123 and 124 operate when the threshold value and mobility correction pulses AZ1 and AZ2 of the active H level are supplied from the threshold value and mobility correction scanning sections 114 and 115 to the threshold value and mobility correction scanning lines 114AZ and 115AZ to place the threshold value and mobility correction scanning lines 114AZ and 115AZ into a selected state and carry out a predetermined correction operation, here, an operation of compensating for the dispersion of the threshold voltage Vth and the mobility μ.

For example, prior to current driving of the organic EL element 127, the threshold voltage Vth of the driving transistor 121 is detected, and the detected potential is stored into the storage capacitor 120 in order to cancel the influence of the threshold voltage Vth.

As a condition for assuring normal operation of the pixel circuit P having such a configuration as described above, the fixed potential Vs1 is set lower than the level obtained by subtracting the threshold voltage Vth of the driving transistor 121 from the second power supply potential Vofs. In other words, "Vs1<Vofs−Vth" is satisfied.

Further, the level obtained by adding the threshold voltage VthEL of the organic EL element 127 to the potential Vcath of the cathode terminal K of the organic EL element 127 is set higher than the level obtained by subtracting the threshold voltage Vth of the driving transistor 121 from the second power supply potential Vofs. In other words, "Vcath+VthEL>Vofs−Vth" is satisfied. Preferably, the level of the second power supply potential Vofs is set to a value in the proximity of the lowest level of the pixel signal Vsig supplied from the image signal line 106HS within a range lower than the lowest level.

<Timing Chart: Modification 4>

FIG. 14B illustrates operation of the pixel circuit P of the modification 4. In FIG. 14B, the waveforms of the writing driving pulse WS, threshold value and mobility correction pulses AZ1 and AZ2 and scanning driving pulse DS are illustrated along the time axis t. As can be recognized from the foregoing description, since the switching transistors 123, 124 and 125 are of the n-channel type, they are turned on when the pulses WS, AZ1 and AZ2 have the high (H) level, but are turned off when the pulses WS, AZ1 and AZ2 have the low (L) level. Meanwhile, since the light emission controlling transistor 122 is of the p-channel type, it is turned off when the scanning driving pulse DS has the high level, but is turned on when the scanning driving pulse DS has the low level. It is to be noted that the timing chart of FIG. 14B illustrates also a potential variation of the gate terminal G of the driving transistor 121 and a potential variation of the source terminal S of the driving transistor 121 together with the waveforms of the pulses WS, AZ1, AZ2 and DS.

In the pixel circuit P of the modification 4, the sampling transistor 125 conducts in response to the writing driving pulse WS supplied thereto from the writing scanning line 104WS within a predetermined signal writing period, that is, within a sampling period, to sample the image signal Vsig supplied from the image signal line 106HS into the storage capacitor 120 (t8 to t10). The storage capacitor 120 applies an input voltage between the gate and the source of the driving transistor 121, that is, a gate-source voltage Vgs, in response to the image signal Vsig sampled therein.

The driving transistor 121 supplies output current corresponding to the gate-source voltage Vgs as driving current Ids to the organic EL element 127 within a predetermined light emitting period (before t1 or after t10). It is to be noted that this driving current Ids has dependency on the carrier mobility μ of the channel region and the threshold voltage Vth of the driving transistor 121. The organic EL element 127 emits light with luminance corresponding to the signal amplitude Vin of the driving current Ids supplied thereto from the driving transistor 121.

Here, the pixel circuit P of the modification 4 includes correction means formed from switching transistors (the light emission controlling transistor 122 and the detection transistors 123 and 124) and corrects the gate-source voltage Vgs stored in the storage capacitor 120 within a predetermined mobility correction period in order to cancel the dependency of the driving current Ids upon the carrier mobility μ.

In particular, this correction means (switching transistors 122, 123 and 124) operates within part of a signal writing period, for example, within the latter half side t9 to t10, in response to the writing driving pulse WS and the scanning driving pulse DS supplied thereto from the writing scanning line 104WS and the driving scanning line 105DS, respectively, to extract the driving current Ids from the driving transistor 121 in a state wherein the image signal Vsig is sampled and negatively feed back the extracted driving current Ids to the storage capacitor 120 to correct the gate-source voltage Vgs. Further, this correction means (switching transistors 122, 123 and 124) detects the threshold voltage Vth of the driving transistor 121 prior to a signal writing period and cumulatively adds the detected threshold voltage Vth to the gate-source voltage Vgs in order to cancel the dependency of the driving current Ids upon the threshold voltage Vth (t5 to t6).

Particularly in the pixel circuit P of the modification 4, the driving transistor 121 is an n-channel transistor and connected at the drain thereof to the positive power supply side while it is connected at the source thereof to the organic EL element 127 side. In this instance, the correction means described above extracts the driving current Ids from the driving transistor 121 and negatively feeds back the extracted Ids to the storage capacitor 120 side within a part of the mobility correction period which overlaps with a rear part of the signal writing period.

Thereupon, the driving current Ids which flows to the source terminal S side of the driving transistor 121 within the part of the mobility correction period flows into the parasitic capacitance Cel which the organic EL element 127 has. In particular, the organic EL element 127 is a light emitting element of the diode type having the anode terminal A and the cathode terminal K, and is connected at the anode terminal A side thereof to the source terminal S of the driving transistor 121 and at the cathode terminal K side thereof to the ground side, in the present example, to the cathode potential Vcath.

In the configuration described above, the correction means (switching transistors 122, 123 and 124) sets the anode and the cathode of the organic EL element 127 to a reversely biased state in advance such that the organic EL element 127 of the diode type functions as a capacitive element so that the driving current Ids flowing to the source terminal S side of the driving transistor 121 may not flow to the cathode wiring line Vcath (t2 to t4).

It is to be noted that the correction means can adjust the time width t (t9 to t10) within which the driving current Ids is to be extracted from the driving transistor 121 within the signal writing period so that the negative feedback amount of the driving current Ids to the storage capacitor 120 is optimized.

Also in the pixel circuit P of the modification 4, where the difference when the second power supply potential Vofs is subtracted from the potential of the image signal line 106HS, that is, from the image signal Vsig, is denoted by signal amplitude Vin, the gate-source voltage Vgs upon light emission can be controlled to a value represented by "$(1-g)Vin+Vth-\Delta V$" by the threshold value correction operation and the mobility correction operation so that the driving current Ids does not rely upon the dispersion or fluctuation of the threshold voltage Vth and does not rely upon the dispersion or the fluctuation of the mobility $\mu$. As a result, even if the threshold voltage Vth or the mobility $\mu$ fluctuates in a fabrication process or by passage of time, the driving current Ids does not fluctuate and the emission light luminance of the organic EL element 127 does not fluctuate either.

Further, the storage capacitor 120 is connected between the gate and the source of the driving transistor 121 and the bootstrap function can operate. Thus, even if a characteristic of the organic EL element 127 suffers from aged deterioration, the gate-source voltage Vgs is normally kept substantially at "$Vin+Vth-\Delta V$," and consequently, the current flowing through the organic EL element 127 does not vary. Therefore, even if the I-V characteristic of the organic EL element 127 is deteriorated, since the constant driving current Ids always continues to flow, the organic EL element 127 continues to emit light with luminance corresponding to the image signal Vsig, and the luminance thereof does not vary.

In addition, also in the pixel circuit P of the modification 4, since the sampling transistor 125 connected to the storage capacitor 120, that is, to the node ND122 side, which is influenced much by leak current arising from light irradiation, is shielded against light by the light blocking layer CL, preferably by the lower electrode 504, preferentially to the driving transistor 121, the picture quality dispersion by leak current arising from light can be suppressed with a higher degree of certainty.

Further, in the case of the pixel circuit P of the modification 4, switching transistors connected to the storage capacitor 120 include the two detection transistors 123 and 124 in addition to the sampling transistor 125, and it can be considered that the detection transistors 123 and 124 have a narrower margin to leak current than the driving transistor 121.

Accordingly, where also the detection transistors 123 and 124 connected to the storage capacitor 120 are shielded against light by the light blocking layer CL, preferably by the lower electrode 504, preferentially to the driving transistor 121, the picture quality dispersion by leak current arising from light can be suppressed with a higher degree of certainty.

Furthermore, in the case of the pixel circuit P of the modification 4, also the light emission controlling transistor 122 participates in threshold value correction and mobility correction. In particular, if the off characteristic of the light emission controlling transistor 122 is insufficient and comparatively high leak current flows, then the correction performance drops. In this regard, where also the light emission controlling transistor 122 which is not connected to the storage capacitor 120 is shielded against light by the light blocking layer CL, preferably by the lower electrode 504, the picture quality dispersion by leak current arising from light can be suppressed with a higher degree of certainty.

<Modification to the Pixel Circuit: Fifth Example>

Figure 15A:
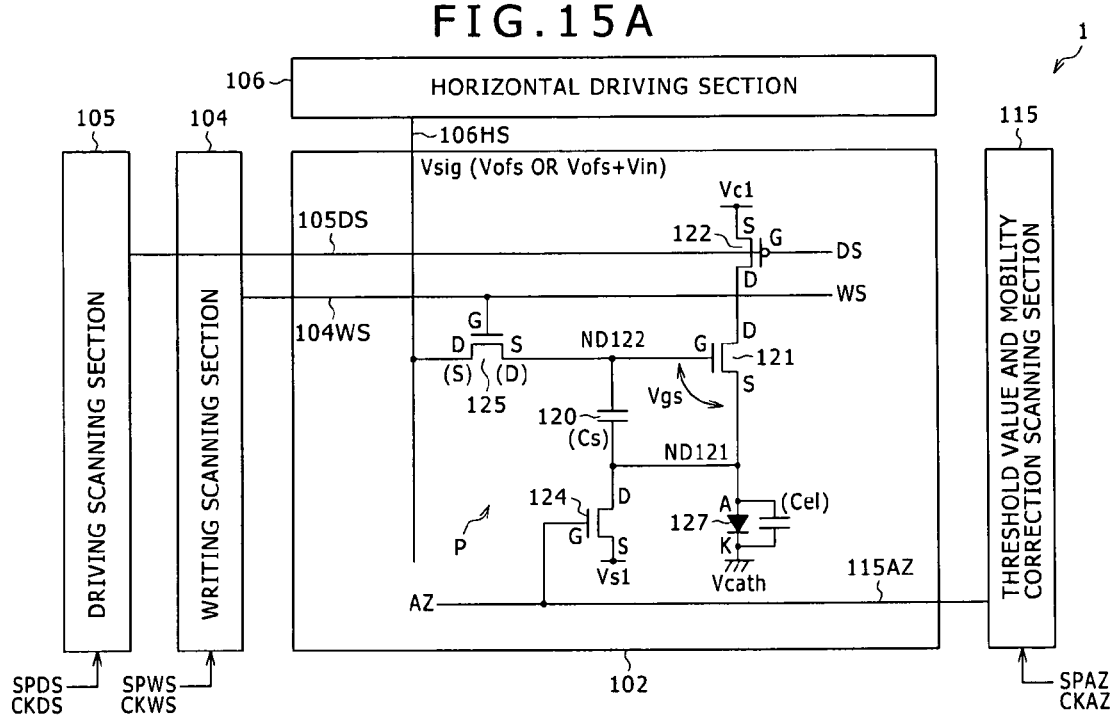
FIG. 15A is a circuit diagram showing another different modification to the pixel circuit shown in FIG. 5.

FIG. 15A shows a fifth example of a modification, that is, a modification 5, to the pixel circuit P which composes the organic EL display apparatus 1 shown in FIG. 1. It is to be noted that also the vertical driving section 103 and the horizontal driving section 106 provided at peripheral portions of the pixel circuits P on the substrate 101 of the display panel section 100 are shown.

The pixel circuit P of the modification 5 shown in FIG. 15A has a configuration wherein, based on the pixel circuit P of the modification 4, the detection transistor 123 and the first threshold value and mobility correction scanning section 114 for driving the detection transistor 123 are removed. The light emission controlling transistor 122 is formed from a transistor of the p-channel type.

Further, corresponding to the removal of the detection transistor 123, the image signal Vsig has the offset potential Vofs in the front half of one horizontal period and the signal potential Vofs+Vin in the latter half of one horizontal period similarly as in the case wherein the 2 TR configuration is used. The offset potential Vofs as a fixed potential of the image signal Vsig on the image signal line 106HS and a reference potential Vs1 of the source terminal S side of the detection transistor 124 from within the image signal Vsig are utilized to a preparation operation prior to threshold value correction. This preparation operation initializes the potentials of the control input terminal or gate terminal G and the output terminal or source terminal S of the driving transistor 121 such that the potential difference between them, that is, the gate-source voltage Vgs, becomes higher than the threshold voltage Vth. It is to be noted that the offset potential Vofs of the image signal Vsig is utilized for the initialization operation prior to the threshold value correction operation and also to precharge the image signal line 106HS in advance.

In particular, the pixel circuit P of the modification 5 adopts a 4 TR configuration which uses, based on the configuration of the 2 TR driving which uses one switching transistor, that is, the sampling transistor 125, for scanning of the image signal Vsig in addition to the driving transistor 121, the light emission controlling transistor 122 is provided on the drain terminal D side of the driving transistor 121 in order to dynamically control the display period, or in other words, the no-light emitting period and one switching transistor, that is, the sampling transistor 124, is used for scanning for correction of the threshold value and the mobility.

In addition, in the pixel circuit P of the modification 5, by setting of on/off timings of the writing driving pulse WS, scanning driving pulse DS and threshold value and mobility correction pulse AZ for controlling the switching transistors, the influence of aged deterioration of the organic EL element 127 and a characteristic fluctuation of the driving transistor 121, for example, dispersions and fluctuations of the threshold voltage, mobility and so forth, upon the driving current Ids is prevented. The pixel circuit P of the modification 5 is different from that of the modification 4 particularly in that initialization prior to the threshold value correction operation, particularly initialization of the gate potential Vg of the driving transistor 121, is carried out using the offset potential Vofs of the image signal Vsig.

<Timing Chart: Modification 5>

FIG. 15B is timing charts illustrating operation of the pixel circuit P of the modification 5. The operation illustrated includes a threshold value correction operation repeated by three times.

In the pixel circuit P of the modification 5, the sampling transistor 125 conducts in response to the writing driving pulse WS supplied thereto from the writing scanning line 104WS within a predetermined signal writing period or sampling period to sample information of the signal amplitude Vin supplied thereto from the image signal line 106HS into the storage capacitor 120. The storage capacitor 120 applies an input voltage between the gate and the source of the driving transistor 121, that is, a gate-source voltage Vgs, in response to the sampled information of the signal amplitude Vin.

The driving transistor 121 supplies output current thereof corresponding to the gate-source voltage Vgs as driving current Ids to the organic EL element 127 within a predetermined light emitting period such as a period prior to time t50 or after time t68. When the organic EL element 127 is to be driven, the first potential Vc1 is supplied to the drain terminal D of the driving transistor 121 and the driving transistor 121 is connected at the source terminal S thereof to the anode terminal A side of the organic EL element 127 so that a source follower circuit is formed as a whole.

The driving current Ids has dependency upon the carrier mobility μ of the channel region and the threshold voltage Vth of the driving transistor 121. The organic EL element 127 emits light with luminance corresponding to the signal amplitude Vin in accordance with the driving current Ids supplied thereto from the driving transistor 121.

Here, the pixel circuit P of the modification 5 includes correction means formed from switching transistors, that is, the light emission controlling transistor 122 and the detection transistor 124, and corrects the gate-source voltage Vgs stored in the storage capacitor 120 in advance within a predetermined mobility correction period in order to cancel the dependency of the driving current Ids upon the carrier mobility μ.

In particular, this correction means (switching transistors 122 and 124) operates within part of a signal writing period t66 to t67, for example, within the latter half side t68μ to t67, in response to the writing driving pulse WS and the scanning driving pulse DS supplied thereto from the writing scanning line 104WS and the driving scanning line 105DS, respectively, to extract the driving current Ids from the driving transistor 121 in a state wherein the image signal Vsig is sampled and negatively feed back the extracted driving current Ids to the storage capacitor 120 to correct the gate-source voltage Vgs. Further, this correction means (switching transistors 122 and 124) detects the threshold voltage Vth of the driving transistor 121 prior to a signal writing period and cumulatively add the detected threshold voltage Vth to the gate-source voltage Vgs in order to cancel the dependency of the driving current Ids upon the threshold voltage Vth (t62 to t64 within each operation cycle).

Within the initialization period t51 to t62, after the light emission controlling transistor 122 is turned off, the detection transistor 124 is turned on to set the source potential Vs of the driving transistor 121 to the reference potential Vs1 and then the offset potential Vofs of the image signal Vsig is utilized to set the gate potential Vg of the driving transistor 121 to the offset potential Vofs. At this time, the correction means (switching transistors 122 and 124) sets a reversely biased state between the anode and the cathode of the organic EL element 127 in advance such that, when the driving current Ids extracted from the source terminal S side of the driving transistor 121 flows into the organic EL element 127, the organic EL element 127 functions as a capacitive element.

Also in the pixel circuit P of the modification 5, where the signal amplitude is represented by Vin, the gate-source voltage Vgs upon light emission can be controlled so as to be represented by "(1−g)Vin+Vth−ΔV" in the threshold value correction operation and the mobility correction operation. Consequently, the drain-source current Ids can be prevented from relying upon the dispersion or the fluctuation of the threshold voltage Vth and can be prevented from relying upon the dispersion or the fluctuation of the mobility μ. As a result, even if the threshold voltage Vth or the mobility μ is fluctuated by a fabrication process or by aged deterioration, the driving current Ids does not fluctuate and the emission light luminance of the organic EL element 127 does not fluctuate either.

Further, the storage capacitor 120 is connected between the gate and the source of the driving transistor 121, and consequently, the bootstrap function can operate. Further, even if the characteristic of the organic EL element 127 fluctuates as time passes, since the gate potential Vg is always kept substantially at "(1−g)Vin+Vth−ΔV," the current flowing through the organic EL element 127 does not vary. Therefore, even if the I-V characteristic of the organic EL element 127 is deteriorated, since the constant driving current Ids always continues to flow, the organic EL element 127 continues to emit light with luminance corresponding to the image signal Vsig and the luminance does not vary.

In addition, also in the pixel circuit P of the modification 5, since the sampling transistor 125 or the detection transistor 124 connected to the storage capacitor 120 which is influenced much by leak current arising from light irradiation is shielded against light by the light blocking layer CL, preferably by the lower electrode 504, preferentially to the driving transistor 121, the picture quality dispersion by leak current arising from light can be suppressed with a higher degree of certainty.

Further, in the case of the pixel circuit P of the modification 5, similarly as in the case of the pixel circuit P of the modification 4, also the light emission controlling transistor 122 participates in threshold value correction and mobility correction. In particular, if the off characteristic of the light emission controlling transistor 122 is insufficient and comparatively high leak current flows, then the correction performance drops. In this regard, where also the light emission controlling transistor 122 which is not connected to the storage capacitor 120 is shielded against light by the light blocking layer CL, preferably by the lower electrode 504, the picture quality dispersion by leak current arising from light can be suppressed with certainty.

While a preferred embodiment of the present invention has been described using specific terms, such description is for illustrative purpose only, and it is to be understood that changes and variations may be made without departing from the spirit or scope of the following claims.

What is claimed is:

1. A display apparatus, comprising: a pixel array section including a plurality of pixel circuits disposed in a matrix and each including a driving transistor configured to produce driving current, a storage capacitor configured to store information in accordance with a signal amplitude of an image signal, an electro-optical element connected to an output terminal side of said driving transistor, and a sampling transistor configured to write information in accordance with the signal amplitude into said storage capacitor, said driving transistor being operable to produce driving current based on the information stored in said storage capacitor and supply the driving current to said electro-optical element to cause said electro-optical element to emit light;
   a driving signal fixing circuit configured to keep the driving current fixed; and
   a light blocking layer provided on a light input side of a transistor which participates in keeping the driving current fixed and is configured to prevent an appearance of leakage current of one or more said driving transistor and said sampling transistor arising from light irradiation;
   wherein said light blocking layer is provided on the light input side of said driving transistor; and
   the light blocking performance of the transistor which participates in keeping the driving current fixed is set higher than the light blocking performance of said driving transistor.

2. The display apparatus according to claim 1, wherein the overlapping degree between the transistor which participates in keeping the driving current fixed and said light blocking layer is set higher than the overlapping degree between said driving transistor and said light blocking layer.

3. The display apparatus according to claim 1, wherein:
   said driving signal fixing circuit is formed on a substrate and said electro-optical element is formed on said driving signal fixing circuit such that emitted light from said electro-optical element is extracted from the opposite side to said substrate;
   said electro-optical element includes said light blocking layer, a light emitting layer and an upper electrode made of a light blocking material and is laminated in this order from the lower layer side; and
   said transistor which participates in keeping the driving current fixed is disposed below said light blocking layer.

4. The display apparatus according to claim 1, wherein said driving signal fixing circuit supplies an image signal, which changes over between a reference potential and a signal potential, to said sampling transistor and renders said sampling transistor conducting within a time zone, within which a voltage corresponding to a first potential to be used to supply the driving current to said electro-optical element is supplied to a power supply terminal of said driving transistor and the reference potential of the image signal is supplied to said sampling transistor, to store a voltage corresponding to a threshold voltage of said driving transistor into said storage capacitor to implement a threshold value correction function.

5. The display apparatus according to claim 1, wherein said driving signal fixing circuit implements a threshold value correction function of storing a voltage corresponding to a threshold voltage of said driving transistor into said storage capacitor and a mobility correction function of adding, when said sampling transistor is rendered conducting to write information in accordance with the signal amplified into said storage capacitor, a correction amount for a mobility of said driving transistor to the signal written in said storage capacitor.

6. The display apparatus according to claim 1, wherein said driving signal fixing circuit implements a bootstrap function with said storage capacitor connected between a control input terminal and an output terminal of said driving capacitor.

* * * * *